United States Patent [19]

Emerson et al.

[11] Patent Number: 5,842,119
[45] Date of Patent: Nov. 24, 1998

[54] RADIO SCANNER AND DISPLAY SYSTEM

[76] Inventors: Harry Edwin Emerson, 41 Karen Pl., Budd Lake, N.J. 07828; Harry Richard Freedman, 6461 Mandalay Dr., Parma Heights, Ohio 44130

[21] Appl. No.: 14,471

[22] Filed: Feb. 5, 1993

[51] Int. Cl.$^6$ ........................................................ H04B 1/16
[52] U.S. Cl. ...................................... 455/161.3; 455/154.2; 455/158.4; 455/158.5; 455/192.2; 455/226.4
[58] Field of Search .............................. 455/154.2, 155.1, 455/158.4, 158.5, 161.3, 161.1, 164.1, 164.2, 169.1, 169.2, 184.1, 186.1, 186.2, 182.3, 192.3, 192.2, 195.1, 198.1, 266.1, 226.4, 160.1, 167.1, 132

[56] References Cited

U.S. PATENT DOCUMENTS

| | | | |
|---|---|---|---|
| 3,575,662 | 4/1971 | Davisson | 325/470 |
| 3,890,574 | 6/1975 | Nakano et al. | 325/470 |
| 3,974,452 | 8/1976 | Cunningham | 325/470 |
| 4,040,719 | 8/1977 | Schiebelhuth | 350/160 |
| 4,079,320 | 3/1978 | Mogi | 325/420 |
| 4,114,104 | 9/1978 | Denzene | 325/470 |
| 4,123,716 | 10/1978 | Borg | 325/464 |
| 4,263,675 | 4/1981 | Hongu et al. | 455/192.3 |
| 4,264,976 | 4/1981 | Yamashita | 455/161 |
| 4,282,602 | 8/1981 | Schroeder | 455/169 |
| 4,317,225 | 2/1982 | Henderson et al. | 455/158 |
| 4,336,534 | 6/1982 | Kumagai | 340/753 |
| 4,348,666 | 9/1982 | Ogita | 340/753 |
| 4,365,347 | 12/1982 | Otsuka et al. | 455/179 |
| 4,405,947 | 9/1983 | Tults et al. | 358/193.1 |
| 4,426,733 | 1/1984 | Brenig | 455/151.1 X |
| 4,476,579 | 10/1984 | Ito et al. | 455/147 |
| 4,509,203 | 4/1985 | Yamada | 455/184.1 X |
| 4,538,300 | 8/1985 | Richards, Jr. | 455/161 |
| 4,580,285 | 4/1986 | Richards, Jr. | 455/161 |
| 4,598,422 | 7/1986 | Fellman | 455/180.1 |
| 4,679,042 | 7/1987 | Trethewey | 340/754 |
| 4,763,195 | 8/1988 | Tults | 358/193 |

(List continued on next page.)

FOREIGN PATENT DOCUMENTS

| | | | |
|---|---|---|---|
| 1-202003(A) | of 0000 | Japan | H04B 1/16 |
| A 52-30302 | 4/1975 | Japan . | |
| 2089607 | 6/1982 | United Kingdom | H03J 7/18 |

OTHER PUBLICATIONS

Dexter; 'A New Age for Radio' Popular Electronics Oct. 1989, pp. 40, 41, 102.

Maloney, Computer CB Scanner, Computer Digest; Sep. 1986 pp. 7–9.

Maloney, Frank P., "Computer CB Scanner", *Computer Digest*, Sep. 1986, pp. 7–9.

*Primary Examiner*—Reinhard J. Eisenzopf
*Assistant Examiner*—Philip J. Sobutka
*Attorney, Agent, or Firm*—Watov & Kipnes, P.C.

[57] ABSTRACT

A method is described for operating a radio receiver in such manner as to accurately and rapidly identify unlistenable, very listenable and marginally listenable channels, and display the listenable and very listenable channels along with an indication of their signal strength, noise and quality on a screen. A reference value of automatic fine tuning voltage is found for the particular receiver. Capacitors that are charged in accordance with the levels of signal strength, noise and automatic fine tuning voltages are sampled before being fully charged at each channel change, and averages of the respective samples are computed as well as the offset between the average of the automatic fine tuning samples and the reference value of automatic fine tuning voltage. A channel having sample averages not meeting certain criteria is rejected as unlistenable, and, of the others, a channel having a very low average on its noise capacitor is identified as very listenable. Those of the remaining channels that are at least marginally listenable are identified by similar analysis of a second group of samples. The criteria for signal strengths and noise may be varied with ambient temperature, and the criteria for noise can be adjusted on the basis of the noisiest channel or the noise produced when the antenna is grounded. Those channels having the greatest signal strength are associated with tuning buttons, and indications of these associations are made on the screen.

43 Claims, 52 Drawing Sheets

U.S. PATENT DOCUMENTS

U.S. PATENT DOCUMENTS

| | | | |
|---|---|---|---|
| 4,763,356 | 8/1988 | Day, Jr. et al. | 379/368 |
| 4,780,909 | 10/1988 | Sakashita et al. | 455/161 |
| 4,817,192 | 3/1989 | Phillips et al. | 455/75 |
| 4,833,728 | 5/1989 | Kimura | 455/166 |
| 4,881,273 | 11/1989 | Koyama et al. | 455/161 |
| 4,888,815 | 12/1989 | Ahlemeyer et al. | 455/168 |
| 4,969,209 | 11/1990 | Schwob | 455/158.4 |
| 5,063,610 | 11/1991 | Alwadish | 455/158.1 X |
| 5,073,975 | 12/1991 | Zarabadi et al. | 455/177.1 X |
| 5,073,976 | 12/1991 | Kennedy | 455/161.3 |
| 5,081,707 | 1/1992 | Schorman et al. | 455/186.1 |
| 5,101,508 | 3/1992 | Owaki | 455/181.1 X |
| 5,152,011 | 9/1992 | Schwob | 455/158.5 |
| 5,268,712 | 12/1993 | Hilpert et al. | 455/154.2 X |
| 5,280,642 | 1/1994 | Hirata et al. | 455/186.1 |
| 5,303,409 | 4/1994 | Reulke et al. | 455/220 X |
| 5,313,651 | 5/1994 | Kurita | 455/154.2 X |
| 5,390,365 | 2/1995 | Enoki et al. | 455/226.2 X |

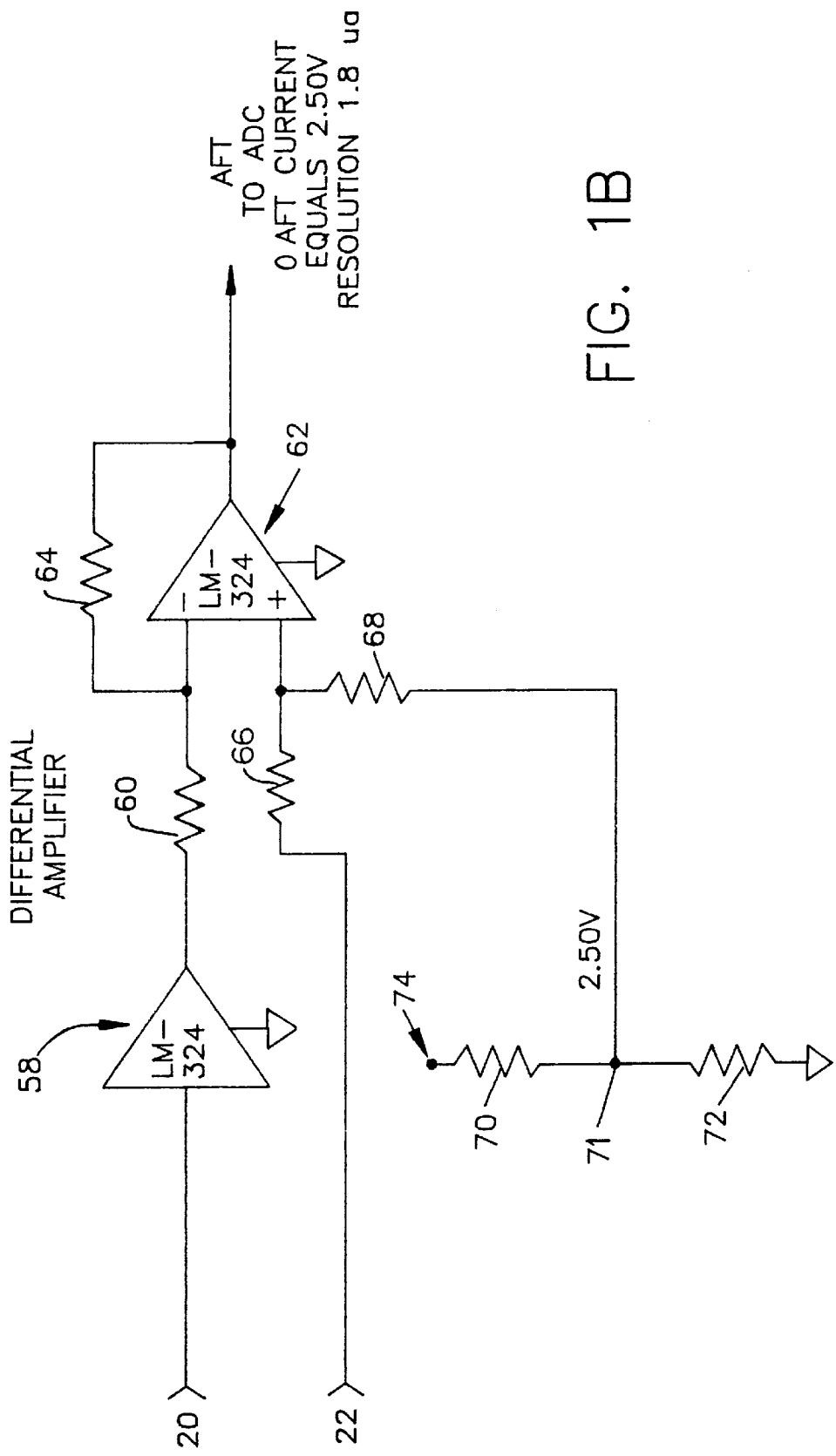

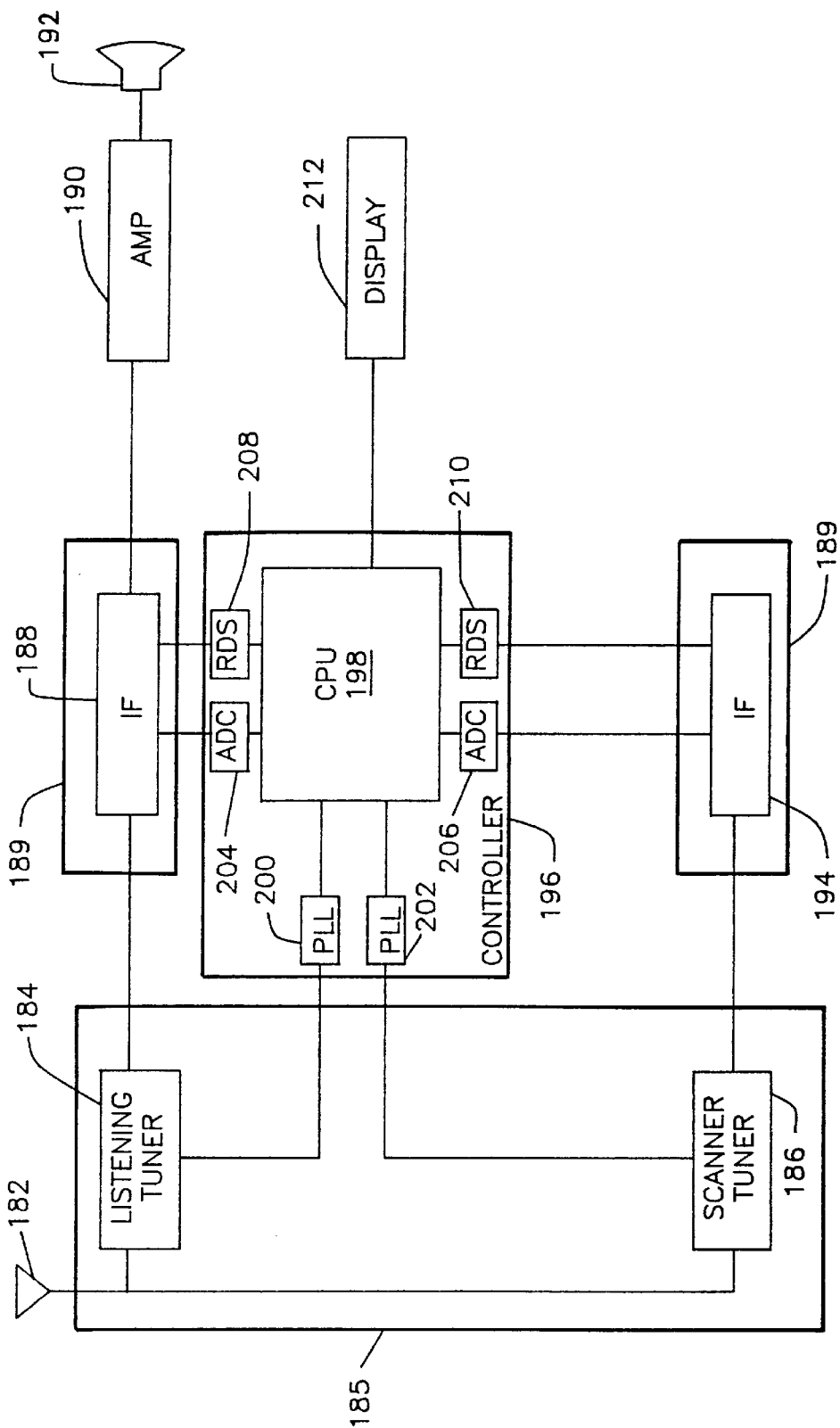

| ILLUSTRATIVE TABLE OF TEMP SENSOR VOLTAGE TO AFT DEVIATION VOLTAGE, SIGNAL STRENGTH THRESHOLD AND NOISE REJECTION LIMIT | | | | |
|---|---|---|---|---|
| T.SENSOR(V) | TEMP | AFT | SS | NOISE |
| 2.80V | 5C | −.216V | −12% | −12% |
| 2.85V | 10C | −.162V | −9% | −9% |
| 2.9V | 15C | −.108V | −6% | −6% |
| 2.95V | 20C | −.054V | −3% | −3% |
| 3.0V | 25C | 0V | 0% | 0% |
| 3.05V | 30C | +.054V | +3% | +3% |
| 3.10V | 35C | +.108V | +6% | +6% |
| 3.15V | 40C | +.162V | +9% | +9% |
| 3.2V | 45C | +.216V | +12% | +12% |

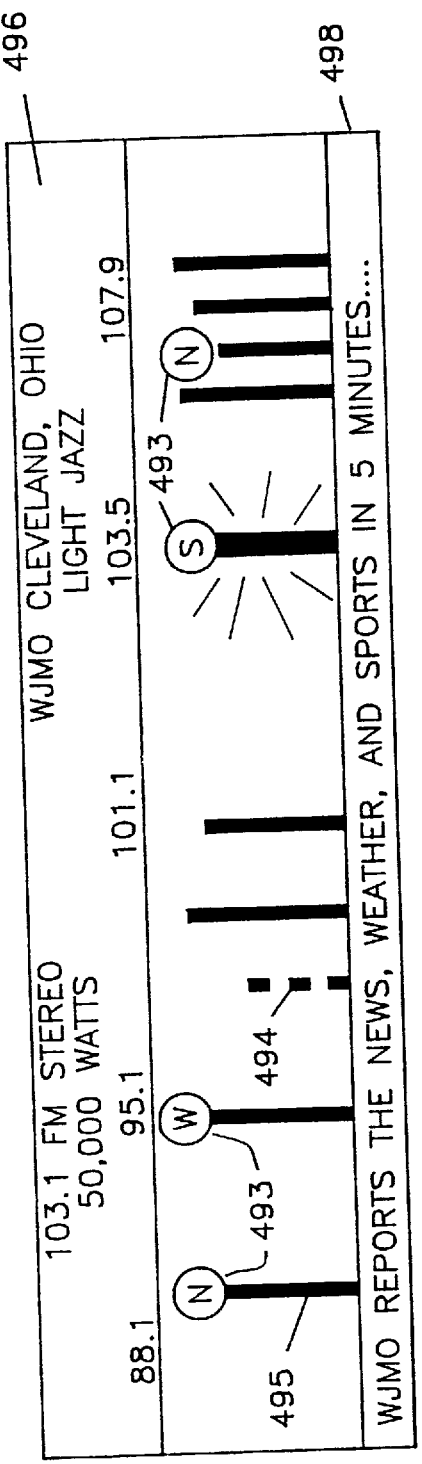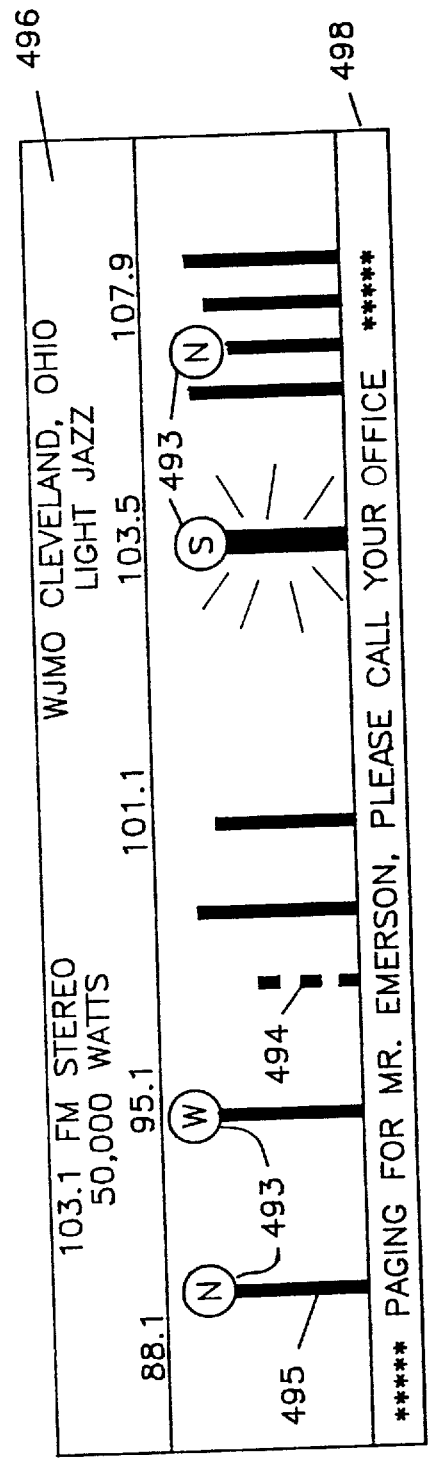
FIG. 30A
FIG. 30B

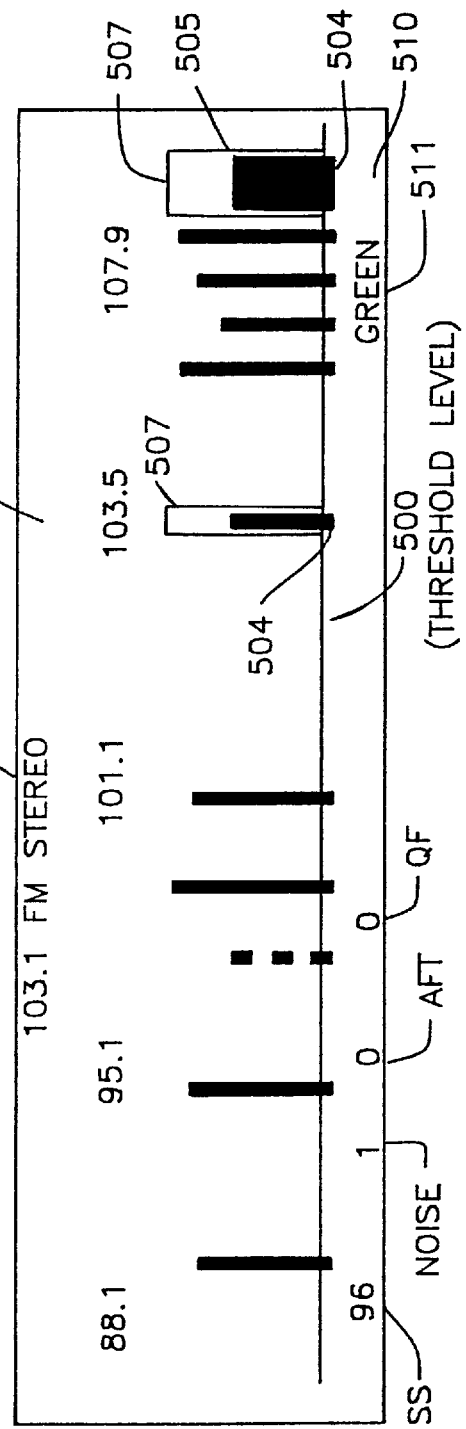

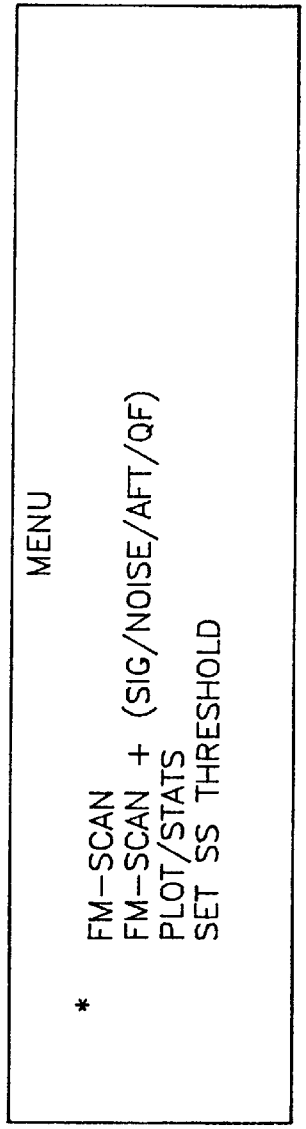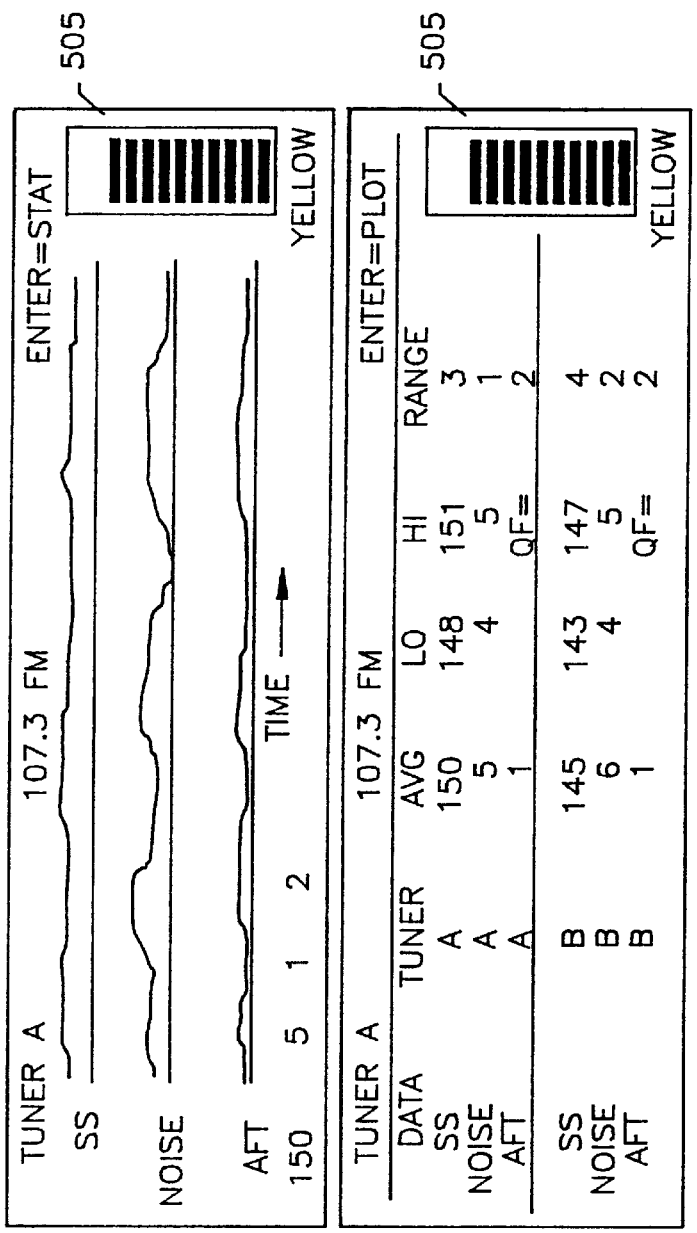
FIG. 36
FIG. 37
FIG. 38

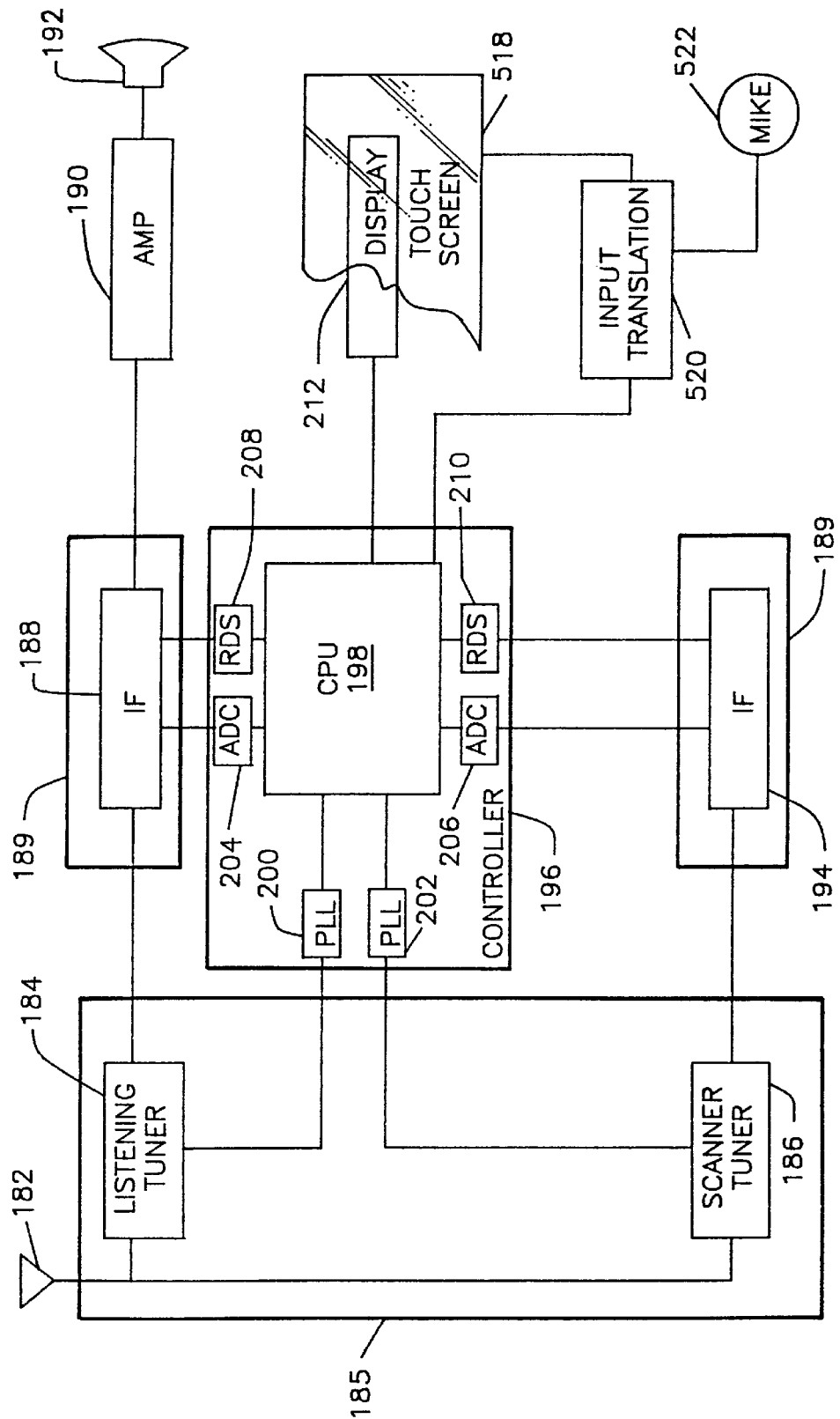

RADIO SCANNER AND DISPLAY SYSTEM

FIELD OF THE INVENTION

This invention is in the field of radio reception and in particular to a system for identifying listenable stations in a band.

BACKGROUND OF THE INVENTION

Automated tuning systems for radio receivers usually include a button for initiating operation in a seek mode in which the tuning advances to the next listenable station and stops, and a button for initiating operation in a scan mode in which the tuning pauses at successive listenable stations unless the button is activated during a pause so as to lock onto the station being received.

In FM receivers, listenable stations are determined by their signal strength, SS, the amount of super audible noise, N, and the automatic fine tuning voltage, AFT. If the SS is too weak, the station is obviously not listenable, but even if the SS is large enough, the presence of too much noise, such as may occur because of co-channel interference, causes the station to be unlistenable. The AFT voltage indicates that an erroneous or unbalanced intermediate frequency is being produced as, for example, may occur when side currents of a station in another channel are present in the channel to which the receiver is tuned.

Voltages corresponding to SS, N and AFT charge associated filtering capacitors. The AFT capacitor is connected so as to filter the voltage appearing across the parallel circuit of the audio discriminator that is nominally resonant at the intermediate frequency. When tuned to a listenable station, the current charging the AFT capacitor will be minimal (zero in the ideal case), and when tuned to a side current of another station, the current will be large. The manufacturer's circuit recommendation for the LM1865 amplifier FM-IF chip, which is used in illustrative circuits in this document, uses the voltage produced on a capacitor of 4.7 $\mu$F in response to the charging current of ±130 microamps, representing a frequency deviation of approximately ±40,000 Hz on a 10.7 mHz IF signal, as the acceptable range of listenable stations. Current magnitudes greater than ±130 microamps indicate unlistenable stations and cause the LM1865 chip to produce a voltage on a Mute/Stop output pin to indicate that a station is invalid. It is the function of the CPU for the associated receiver to interpret the voltage on the output pin and initiate whatever action is necessary.

Generally, very unlistenable signals in a channel like the side currents of a station on an adjacent channel will cause the AFT current, and hence the voltage on the AFT capacitor to swing toward their maximum values. The voltage on the AFT capacitor is fairly reliable at detecting an unlistenable channel where no station is actually transmitting directly on the channel to which the receiver is tuned.

The problem with the prior art version of AFT Mute just described is that it unreliably differentiates listenable and marginally listenable stations from unlistenable stations that are actually transmitting on the selected channel, as occurs with distant co-channel stations and in other situations wherein a station's signal is degraded by interference. Unlistenable stations of this nature may generate a much more modest AFT current. However, the AFT circuit also carries recovered audio and noise which is superimposed on the AFT current. The AFT MUTE/STOP detection circuit must be set broadly enough so it is not triggered by these unwanted signals. Therefore, if the modest AFT current just described is smaller than the broadly set MUTE/STOP detection level, the unlistenable station will be accepted as listenable.

Furthermore, the AFT current level is affected by several factors which have nothing to do with the received station's signal. They are temperature drift, factory misalignment, poor component value selection, and component aging. Because these factors can cause the AFT current to vary widely, independently of the quality of the received signal, its use to evaluate the listenability of a signal received on a channel requires that the range of AFT voltage for an acceptable signal be very large. The so-called AFT Deviation Mute Window, meaning the range of current levels, and hence voltages, for which a station will be considered very listenable or marginally listenable is, as previously noted, typically set at ±130 microamps (i.e. frequency deviation of ±40,000 Hz) for the LM1865. The acceptance range of ±130 microamps is much larger than the modest AFT current generated by distant unlistenable stations. Furthermore, if the AFT circuit is precisely tuned to the I.F. frequency, any station producing an AFT current more than ±15 microamps (i.e. frequency deviation of ±4,500 Hz) is generally unlistenable, although prior art FM radio designs generally are unable to illustrate this fact. Thus, an unlistenable station producing 50 microamps of AFT current is well within the acceptance range of ±130 microamps and therefore would be accepted as listenable, causing this method of using the AFT current for the identification of listenable and marginally listenable stations to be inaccurate.

In addition, the AFT current level has no intrinsic self-zeroing characteristic and thus it can vary widely from one radio to the next, and from one time to another because it is highly dependent upon several factors including the adjustment of the quad-coil, the component values in the quad-coil and AFT circuits, and the temperature of the radio. The quad-coil and AFT circuits are so temperature dependent that the AFT current level can typically fluctuate by as much as ±80 microamps just because of temperature change of the radio. A station that would be accepted as listenable when the radio is at one temperature may be rejected at another temperature and vice-versa. Because it is usually too expensive to substantially eliminate the effects of these variables, identical radios sitting side-by-side perform differently. In practice, one finds radios that will reject listenable stations and other radios of the same model that will stop on unlistenable stations.

In conclusion, it can be said that the AFT muting system of the prior art is better than nothing, but barely adequate at best.

In an FM receiver, the intermediate frequency varies with the amplitude of the audio signal being transmitted. In order to limit the effect of these audio variations on the voltage produced on the AFT capacitor, it has been customary to make the charging RC time constant of the AFT capacitor large enough to prevent the lowest audio noise frequency from producing significant voltage fluctuations on the AFT capacitor. Thus, it takes a long time to derive the AFT voltage for each channel and an inconveniently long time to check the AFT voltage of all the one hundred channels in the FM band. If the effect of the audio signal on the AFT voltage is to be substantially eliminated, it would take 16.5 seconds to find all of the listenable channels in a scan mode of operation. Most receivers are designed to actually take only about 9 seconds, but there is some error because a compromise is made between the accuracy of the AFT signal for each channel, by not filtering the super-imposed audio, and the time required to obtain it.

Furthermore, the SS, N and AFT capacitors must be allowed to charge or discharge at each channel change from their present value to a new value and this may require considerable additional time.

Present tuning systems indicate the station that is tuned in and provide several buttons that can be programmed to respectively tune the receiver to selected stations. In some cases automatic programming is provided while scanning a band so that the buttons select stations in accordance with their signal strength. Whereas preprogrammed buttons are useful while the radio is being operated within a given listening area, they are of little advantage when the radio is moved to a different area as in the case of a car radio during a long drive. During such a drive, stations may fade in and out so that the preprogrammed buttons are of no use. The operator must then use the seek or scan modes to obtain a listenable station or use the automatic programming feature, if provided, to reprogram the buttons. For reasons previously set forth, neither seek mode nor scan mode nor the auto programming scan mode, as carried out by the prior art, will accurately distinguish between very listenable and marginally listenable stations on the one hand, and unlistenable stations on the other. And, as also pointed out, different stations may be rejected by different radios of the same model because the components of the AFT circuits have different values within the manufacturing tolerance limits. Narrowing the tolerance limits would significantly increase the cost of the radio.

Even when a given radio is operating in an area within which the respective radio signals received are essentially the same, variations in temperature often change the stations that are rejected. Changes in temperature also affect the stations that are rejected as the radio is moved from place to place.

In AM radios, a channel is considered to be listenable if the signal strength, SS, and the amount of IF energy passing through a narrow bandpass filter of an IF threshold circuit causes a stop circuit voltage to exceed a predetermined threshold. If the voltage is exceeded, the stop circuit stops the tuning. Both the automatic gain control (AGC) circuit, from which SS is usually derived, and the IF threshold circuit have capacitors that require considerable time to charge so that scanning the AM band to identify listenable and marginally listenable stations takes an inconveniently long time.

A number of prior references teach circuits and systems for tuning in radio signals in an automated manner. Certain of these references show various displays for presenting information associated with a particular station or channel, such as signal strength, for example. Teachings of these references are briefly described below.

U.S. Pat. No. 3,575,662 to Davisson teaches sweep tuning with range applied to a voltage controlled capacitance that stops when an IF signal is strong enough.

U.S. Pat. No. 3,890,574 to Nakano relates to a scanning radio receiver. The receiver scans a number of channels of respective predetermined frequencies in a time sharing basis. A priority channel selector which overrides the channel selector when a selected priority channel is received is also included.

U.S. Pat. No. 3,974,452 to Cunningham teaches indicator lights corresponding to channels, noise mutes, and stop of scan if noise is below a threshold and RF is present.

U.S. Pat. No. 4,040,719 to Schiebelhuth shows a liquid crystal display that indicates a tuned frequency.

U.S. Pat. No. 4,079,320 to Mogi teaches AFT control at a slow scan rate as a station frequency is approached so it will not lock in a false frequency, and at a fast scan rate when the station is close to being tuned in.

U.S. Pat. No. 4,114,104 to Denzene relates to a typical receiver device which permits channels to be omitted or skipped. The device includes a switch which skips, inhibits, or bypasses a given channel of a plurality of channels which the system may wish to eliminate. This switch is not functional during the scanning mode, and is only available during a subsequent scanning cycle.

U.S. Pat. No. 4,123,716 to Borg relates to frequency drift for a digitally tuned varactor tuner. The device provides an automatic frequency signal, which tunes a varactor tuner in response to the direction of a tuning error. The detector inhibits the AFT signal when weak signals are being tuned by the varactor, to prevent continuous searching by the tuning system.

U.S. Pat. No. 4,264,976 to Yamashita shows a logic controlled tuner using signals above and below a desired channel.

U.S. Pat. No. 4,282,602 to Schroeder teaches a tuner that stops scanning when sufficient IF passes through a narrow filter.

U.S. Pat. No. 4,317,225 to Henderson et al. relates to a channel identification apparatus.

U.S. Pat. No. 4,336,534 to Kumagai teaches use of indicator lights for displaying signal strength.

U.S. Pat. No. 4,348,666 to Ogita displays input signal strength with respect to a reference by a bar chart comprising a number of dots.

U.S. Pat. No. 4,365,347 to Otsuka et al. teaches a circuit for detecting when the total of time segments representing field strength is lower than a predetermined level, for switching to a next channel.

U.S. Pat. No. 4,405,947 to Tults et al. teaches a control system which seeks the device with dual search mode tuning in response to an automatic fine tuning signal.

U.S. Pat. No. 4,538,300 to Richards, Jr. teaches in an AM radio, the use of a scan tuner stopped by AGC that is made linear with signal strength, and which has less delay so as to permit faster scanning.

U.S. Pat. No. 4,580,285 to Richards, Jr. teaches an AM radio that stops scan tuning when an AGC signal is large, indicating a strong station, and when another signal provided by a special FM discriminator falls below a given level.

U.S. Pat. No. 4,679,042 to Trethewey teaches a device for indicating the value of a signal.

U.S. Pat. No. 4,763,195 to Tults provides for a television tuning system locating active cable channels. Scanning is accomplished by first searching for frequencies corresponding to predictable non-standard frequencies associated with cable distribution networks. A second search extends over a wider frequency range. An autoprogramming mode for locating active channels is also provided.

U.S. Pat. No. 4,780,909 to Sakashita et al. deals with a signal receiver device sweeping the frequencies of desired channel bands, and feeding information to memory of the signal strength in plural frequencies of intermediate frequencies.

U.S. Pat. No. 4,817,192 to Phillips et al. teaches the use of data signals for improving acquisition of an FM data carrier by varying the AFT sweep rate on a signaling channel.

U.S. Pat. No. 4,833,728, to Kimura et al. provides a swept tuner for recording signal strengths, for selecting a station in order of signal strength or frequency.

U.S. Pat. No. 4,881,273 to Koyama et al. provides an RDS receiver configured to compare program information codes, to prevent needless station changing, to receive a desired type of program.

U.S. Pat. No. 5,063,610 to Alwadish shows the use of encoded data related to program material that is received and put into memory, from which it can be recovered so as to give names of songs, artists, etc.

U.S. Pat. No. 5,073,975 to Zarabadi et al. provides sampling of an IF frequency during a 40 ms period, and if enough samples show a correct frequency, an AGC stop circuit is enabled.

U.K. patent GB 2,089,607 is a device capable of automatically selecting broadcast stations by means of a voltage synthesizer receiver.

Japan patent 1-202030(A) teaches a device for improving receipt of broadcasting programs in the same network by updating the local frequency of the same network to a new receiving frequency band.

SUMMARY OF THE INVENTION

This invention applies to both AM and FM radios. An AM or FM radio of otherwise standard construction that is equipped with a tuning system of this invention can discriminate between channels having listenable stations and channels having unlistenable signals more accurately and more quickly than radios of prior art, and can do so at widely different temperatures with the same speed and accuracy. Furthermore, the channels that are accepted or rejected will be essentially the same for all radios of the same design, thereby solving significant radio design and manufacturing problems. A basic radio system incorporating the features as described in this invention would cost no more to design or manufacture than currently available Electronically Tuned Radios, and would have minimal requirements for critical-tolerance components compared to conventional designs. Instead, the tuner design compensates for component variances between radios, for factory misalignments, as well as for component aging and temperature drift. Consequently, in addition to the improved performance that this invention offers, it may also result in radios that are less expensive to manufacture.

The fast tuning features would enable a radio built according to this design, and also incorporating a prior art "best station memory" feature, to scan the entire AM or FM broadcast band as quickly as in one second with a very high degree of accuracy in the acceptance of listenable stations and the rejection of unlistenable channels. Currently available scanning radios that incorporate a "best station memory" feature take from several seconds to as long as thirty or more seconds to scan the AM and FM broadcast bands, and offer the same unpredictable and inaccurate assessment of listenable versus unlistenable stations as other current state of the art radios.

In addition to the tuning enhancements, this invention provides for a display system which can indicate all the listenable stations that are broadcasting, along with indications of their signal strength, noise, and other factors. The display screen can be designed to be representative of the AM or FM broadcast band so that the indicator for each station will be displayed at the location where it would appear on a manually tuned radio dial in order to provide a familiar format and to aid the user in visually identifying specific stations. The accuracy feature of this invention is valuable because if a user manually tunes channel by channel, what they hear in terms of listenability will be accurately reflected on the display. Another feature is that the listenable stations presented on the display constitute a "tuning list", such that operation of the seek or scan tuning buttons will only select stations which are indicated on the display.

An obvious advantage of the display system occurs with auto radios when the vehicle is driven from one broadcast area to another, and for portable radios which are taken from place to place. The display can portray the listening options available in each area in a way that is far more meaningful than can be achieved by manually tuning the radio, by using seek or scan buttons, or by using a best station memory feature. It offers complete information of the broadcast band at a glance.

A greater advantage occurs with automobile radios when the vehicle is used for country driving because in the absence of knowledge about the broadcast area, one tunes in a station not knowing if it broadcasts a desired type of program material, not knowing how strong or weak the station might be, and not knowing if there were any better options available. As a result, listeners might spend the entire trip fiddling with the tuning buttons—as soon as they get a station they like, it fades out and they must change stations again. Having a display of the broadcast area provides an instant representation of the listening options and allows the listener to make intelligent choices. Because the display can communicate the situation at a glance, driver safety is improved compared with the alternative of fiddling with the radio which continually draws the driver's eyes off the road. If there are no desirable stations, a mute button could cause the display to continuously scan without any audio until the vehicle arrived at another broadcast area.

An advantage of a display system for a console radio is that it would give discriminating listeners the opportunity to evaluate their listening options and choose a strong, clear station that is broadcasting the desired type of material.

The fast scanning speed makes it possible to build an economical display system radio which has a single tuner for each band, as in conventional radios. The scanning speed is fast enough so that a scan to update the entire display can take place automatically and unobtrusively during user-initiated tuning operations, or a scan can be initiated by activation of a "display refresh" button and the scan will almost be completed before the user's finger leaves the button.

The invention also defines a dual tuner system which incorporates a second tuner (for each band) to continuously scan the frequency band. In a dual tuner system the display can be continuously updated to reflect changes in the displayed channels, as well as their signal strength and other parameters. The tuners can also monitor the broadcast stations for digital SCA or RDS data such as SCA radio paging data, or RDS information such as the type of program material the station is broadcasting, and present that data on the display. While listening to an audio program a single tuner system can monitor only the tuned-in station for this type of data; a dual tuner system, however, can monitor and present this type of data for both the tuned-in and the non-tuned-in stations, without interrupting the audio program, and therefore can present broadcast information for all stations on the display simultaneously. Therefore, a dual tuner scanning display radio system can denote items of special interest on the display for all stations in the broadcast area, for example, all stations broadcasting the news. A single tuner could also collect and present this data, but the data monitoring time is relatively long (about $\frac{1}{10}$ second per station to collect the station's "static" RDS data—call letters, city, and type of program material, etc.) and of course cannot be performed while listening to an audio program.

This ability to display data for all stations in the band would be of value to broadcasters as well as listeners because it gives lesser known stations the opportunity to inform listeners of the kind of program material they offer.

The tuning enhancement aspects of this invention referenced previously incorporate the following major features. Tuning speed is accelerated by discharging or precharging certain signal parameter capacitors to a desired state on channel changes. Signal parameters of signal strength, noise, and AFT deviation, related to the listenability of a station, are evaluated as soon as 4 ms after channel changes to accept very good stations as very listenable and reject very bad channels as unlistenable. In comparison, prior art designs typically allocate about 70 ms to evaluate each channel regardless of how good or bad it might be. In most listening areas those channels which are either very good or very bad represent more than half of all available channels. The fast acceptance and fast rejection of these channels speeds the tuning process because only stations that do not meet either of these criteria need to be subjected to longer measurements. Extrapolation techniques are used to estimate the signal level driving the associated circuits, since the capacitors haven't fully charged by this early stage.

A "dual pass" aspect of this invention offers a side channel elimination feature which also accelerates the tuning process by eliminating stations from further review which can be determined to be side channels of a main station.

Sampling and averaging techniques are used to minimize the influence of signal artifacts and determine precise levels of the underlying signal, especially for AFT which is dominated by recovered audio that is super-imposed on the AFT signal. The precise data arrived at by the sampling and averaging techniques enhances the extrapolation techniques to correctly estimate the signal parameters of the channel being measured. The typical AFT deviation mute circuit in currently manufactured radios has an acceptance window of approximately ±130 µA, representing a frequency deviation of approximately 40,000 Hz. The ability to determine a precise level of AFT has allowed the observation that all "good" stations will exhibit almost exactly the same AFT level for a given receiver, plus or minus about one or two microamps. This is because all good stations whose signals are not being interferred with or distorted by the atmosphere will be broadcast and received exactly on their designated frequency. And when that designated frequency is exactly the frequency to which the radio is tuned, zero AFT current will be generated given proper alignment of the radio receiver's circuitry. This observation, in turn, has resulted in the feature of this invention whereby the AFT signal of each channel as it is tuned in is evaluated in relation to the AFT signal (the "nominal AFT") of a station which has been determined to be "very listenable" via an extended measurement with tight acceptance parameters. A reasonable acceptance window based on this invention is approximately ±30 µA, or approximately ±4800 Hz, for the receiver design set forth in this document. That design produces approximately twice the AFT current as the comparative manufacturer's recommended circuit, which would be approximately ±15 µA for the same frequency deviation. Thus, the design specified by this invention is about ten times as sensitive as the current state of the art. The nominal AFT feature results in all receivers performing the same in the acceptance and rejection of channels since the decision criteria is based on a parameter external to the receiver and which is therefore independent of the receiver's components or temperature, etc.

This invention also offers other features which are described in appropriated locations in this application.

All embodiments of the invention as applied to FM receivers have an initialization procedure that provides a reference value of AFT voltage. This can be done by selecting an empirically determined voltage value in accordance with the ambient temperature, or by searching to find a very listenable station and using its AFT voltage as a reference value, as mentioned previously, or by using both methods together. In evaluating channels as to their listenability, the difference between their AFT voltage and the reference AFT voltage is used rather than the AFT voltage itself as this eliminates the effects of factors previously noted that relate to the radio rather than the received signal. The difference between an AFT voltage and the reference value is hereinafter referred to as the AFT offset. Prior art designs are incapable of precisely determining AFT values because of the dynamic fluctuations of the superimposed recovered audio, and therefore would not be able to derive a meaningful AFT offset. This invention arrives at precise AFT values by taking multiple samples and then computing the average of those samples. Taking the average tends to cancel out the super-imposed audio fluctuations and reveal the true underlying AFT current.

In the simplest embodiment of the invention as applied to FM receivers, there is no display and memory buttons are not provided. After finding a reference value of AFT, one or more samples of the voltages on the SS, N and AFT capacitors are taken prior to the time of full charge. If these samples are outside of wide limits, the channel is rejected. All other channels are considered to be listenable.

The channels not rejected may include unlistenable stations because the limits are so wide. Thus, in other embodiments of the invention, the channels not rejected are subjected to further analysis. The first step of this analysis is to identify on the basis of the samples referred to, those stations that are very listenable on the basis of their having virtually no noise. The listenability of the remaining stations cannot be accurately determined at this point, and therefore are further examined by obtaining additional samples and using tighter limits of SS, N and AFT offset so as to eliminate only the worst stations. The latter limits may be varied.

The process just described is designed to permit tuning to stations that are of very poor selected quality because there are times when a person will listen to them, e.g. if it is a broadcast of the "big game" of one's alma mater. At the same time it is desirable to eliminate really worthless stations. Thus, in accordance with another aspect of this invention, a further analysis may be made of the additional samples of SS, N and AFT offset to determine a quality factor QF. The precise AFT values derived by this invention enable the computation of a QF, which would otherwise not be possible. The radio might offer a user adjustable QF, and stations not meeting the QF setting are omitted from the display and from the tuning list. Although other formulas may be used, the following expression for QF has been found on the basis of much listening to yield results indicated in table 1 below. The average N, N range, and AFT offset are obtained from successive groups of samples taken after each channel change is initiated.

$$QF = \sqrt{AVG\ N \cdot AFT\ \text{offset}} + \frac{N\ \text{range}}{2}$$

TABLE 1

| QUALITY FACTOR (QF) | RECEPTION |
| --- | --- |
| 0–1 | Best Possible |
| 2–5 | Good but Some Static |
| 6–9 | Noisy but Listenable |
| 10–19 | Very Noisy |
| 20+ | Very Poor |

The parameters of noise, AFT deviation, and QF are each valuable in discriminating listenable from unlistenable stations. Many invalid channels will exhibit sufficiently high ultrasonic noise levels to reject the channel based on noise. Occasionally, however, a side-channel, image frequency, crosstalk channel, or other invalid signal will not have a sufficient ultrasonic noise level to be rejected, but will exhibit a high AFT which will reject the channel. The combination of both noise and AFT deviation into the QF allows the rejection of stations with intermediate noise and AFT levels which would exhibit audible impairment but could not be rejected based on either parameter independently. Additionally, certain interference conditions will cause a valid station to exhibit intermediate to high ultrasonic levee along with low AFT levels, and the QF can be arranged to allow the selection of these stations. A radio designed in accordance with this invention might implement a user-setable QF so that the radio's tuning criteria can be controlled by the listener.

An example of a user-setable QF might be a console radio with a City/Country switch that would have tighter acceptance parameters in the City mode so as to restrict channel acceptance to those with the best listenability.

Another example might be a console radio with a menu operated QF setting mechanism, as suggested by the menu system illustrated in FIG. 36.

A third example might be an auto radio with a City/Highway switch that would have tighter acceptance parameters in the Highway mode, perhaps including a higher SS threshold. This method of operation would be intended to solve the problem of country driving where stations fade in and out at an annoying rate, causing the listener to constantly fiddle with the tuning buttons to find a listenable station. In this highway mode, only stations good enough to be listenable for at least a few minutes will meet the acceptance criteria.

In any of these embodiments of the invention, any of the stations not rejected can be respectively stored in memory locations associated with programmable memory buttons, respectively, and/or presented on a display. In the latter case, information as to their SS, N, AFT and QF as well as RDS information as to program material etc. can be shown.

In the tuning systems having single tuners, the determination of a reference value for AFT, whether it be done on the basis of ambient temperature or on the AFT of a valid station, or on both, may be made periodically based on duration of time or change in temperature, or may be made at each channel change initiated in the seek or scan modes. In the latter case, the operation is hardly noticeable because it is performed so rapidly.

In what is called a dual pass system, the channels that are not rejected and are not found to be virtually noise-free on the basis of a first group of samples are more thoroughly analyzed for listenability on the basis of a second group of samples of SS, N and AFT.

When there is only one tuner, the SS and QF values displayed for the tuned-in channel can be updated dynamically but those for the other channels were obtained during the initialization procedure or the last time a scan was performed, so that they may not always be valid. Thus, one may tune to another channel that appears to be very listenable only to find that it has poor quality or in fact is totally rejected by the analysis that is done at each channel change. The display will be updated on this channel change. This situation can be avoided by embodiments of the invention using two tuners, one for listening and the other a scan tuner for analyzing the listenability of all stations in the band in a continuous repeated sequence. This means that the display of such factors as SS and QF values for channels other than the one to which the listening tuner is tuned are also always up-to-date.

A greater advantage of a second tuner is that, for all stations being received rather than just for the tuned in channel, it can be used to bring up on the display coded information that is often broadcast along with the main program. This is referred to as RDS information and may include signals indicating the type of program being broadcast, e.g. whether it is news, classical music, contemporary music or a sportscast.

A number of aspects of the invention contribute to the speed with which very listenable and listenable stations can be identified by the methods just described.

In the first place, time is saved by the rejection of unlistenable channels and the identification of very listenable channels on the basis of a first group of samples obtained after a change in channel is initiated, because these channels are not subjected to further analysis of a second group of samples. If, for example, sixteen milliseconds are required for further analysis of each channel, and there are seventy-five channels having either no station or a very good station, twelve hundred milliseconds are saved.

The speed with which a channel can be identified as being listenable or not is greatly increased by this invention. In the prior art, voltages as to the signal strength, SS, the noise, N, and the automatic fine tuning, (AFT), are developed on respective capacitors. For each radio design the manufacturer specifies the minimum or threshold voltage required across the SS capacitor, the maximum or limit voltage for the N capacitor, and the maximum value of current, and therefore, voltages for the AFT capacitor. If any of these criteria are not met, the channel is considered to be unlistenable. Previous designs use large value filter capacitors to average out and integrate the SS, N, and AFT signals in order to properly assess them. The bigger the capacitor the more accurate the averaging/integration will be, but the longer it will take to charge or discharge the capacitors to the new level on each channel change.

This invention provides for clamping each of these capacitors to a respective neutral value on channel changes to minimize the amount of time required to charge or discharge from the previous state to the new state, and to provide for a known charge condition at the beginning of each channel measurement period. Starting with a known charge condition allows for the use of rapid samples and the use of extrapolation techniques as described in this application.

In the prior art, the determination of the listenability of a channel is made by examining at least one of the voltages on the SS, N and AFT capacitors after they are almost fully charged. As noted above, this is necessary to minimize fluctuations and to reduce the effects of noise and the effect of the audio signal on the voltage on the AFT capacitor.

In accordance with this invention, however, the voltages on these capacitors are measured very soon after a channel change is initiated and extrapolated to see what they would be when fully charged. These measurements are made by taking a single sample, or by taking an average of multiple samples, of each voltage. The extrapolation can be conservatively modified to minimize the risk of rejecting a listenable channel that might have experienced a momentary signal fluctuation at the time the samples were taken. The extrapolated values may be used for the final tuning decision in one aspect of this invention. In another aspect, the extrapolated values may provide an initial acceptance of very good stations and rejection of very bad channels, with a subsequent review of the remaining channels based on additional data samples.

Additionally, this invention provides for faster tuning by permitting the use of smaller (and hence, faster) capacitors, or smaller associated resistors resulting in a faster R-C time constant for the charging or discharging of the capacitors. The ability to use faster charge/discharge circuits is attributable to two factors, the first being the extrapolation procedures in conjunction with the initial and subsequent review procedure, as just discussed. In this context, smaller capacitors and the associated greater signal fluctuation rate can be tolerated for the initial review because it is non-critical in the sense that only the obviously good stations will be accepted, i.e., only those having acceptable SS and AFT and having virtually no noise, and only the obviously bad stations will be rejected, i.e., channels that don't meet the minimum SS threshold, or have noise or AFT levels that "peg the meter".

The second factor permitting the use of smaller capacitors or associated resistors is the scheme of taking the average of multiple data samples, either in the initial or the subsequent review, or in both. The averaging technique statistically adjusts for momentary signal fluctuations and thus accomplishes mathematically what otherwise must be accomplished electrically with larger capacitors.

Greater accuracy in the identification of the listenability of a channel is achieved in accordance with other aspects of the invention, wherein the SS threshold, the limit of N and the maximum values of AFT toward which the capacitors are considered to be respectively charging are adjusted in accordance with the ambient temperature within the radio.

The assumed limit value for noise can also be set at the voltage produced across the N capacitor when the noisiest channel is tuned in.

Another way to set the assumed limit value for noise is to measure the voltage across the N capacitor when the antenna of the radio is connected to ground.

In AM receivers, tuning stops on a channel when the voltage across a threshold capacitor exceeds a given value. The voltage on this capacitor is derived from a circuit measuring the IF amplitude and the signal strength indicated by an AGC circuit having filter capacitors. Faster operation is attained by charging the threshold capacitor and capacitors that are used in the AGC circuit to neutral values at each channel change.

BRIEF DESCRIPTION OF THE DRAWINGS

Various embodiments of the invention are shown and described herein with reference to the drawings, in which like items are identified by the same reference designation, wherein:

FIG. 1B is a schematic diagram of a circuit for converting the differential voltage on the AFT capacitor to a unipolar voltage for application to the digital logic circuits;

FIG. 11 is a block diagram of an FM receiver incorporating a listening tuner and a scanning tuner in accordance with this invention;

FIG. 30A illustrates a display of listenable stations including RDS data;

FIG. 30B illustrates an alternative display of listenable stations broadcasting a specific type of RDS-coded program material.

FIG. 30C illustrates an alternative style of presenting stations broadcasting specific types of RDS-coded program material.

FIG. 31 illustrates a display of listenable stations with statistics for S, N, AFT and QF of tuned in stations;

FIG. 36 illustrates a menu that may be displayed;

FIG. 37 illustrates a display of graphical information relating to a tuned in station;

FIG. 38 illustrates a display of stain station; a tuned in station; and

FIG. 39 illustrates a display with touch entry and voice input for changing stations.

DETAILED DESCRIPTION OF THE INVENTION

Figure 1A:
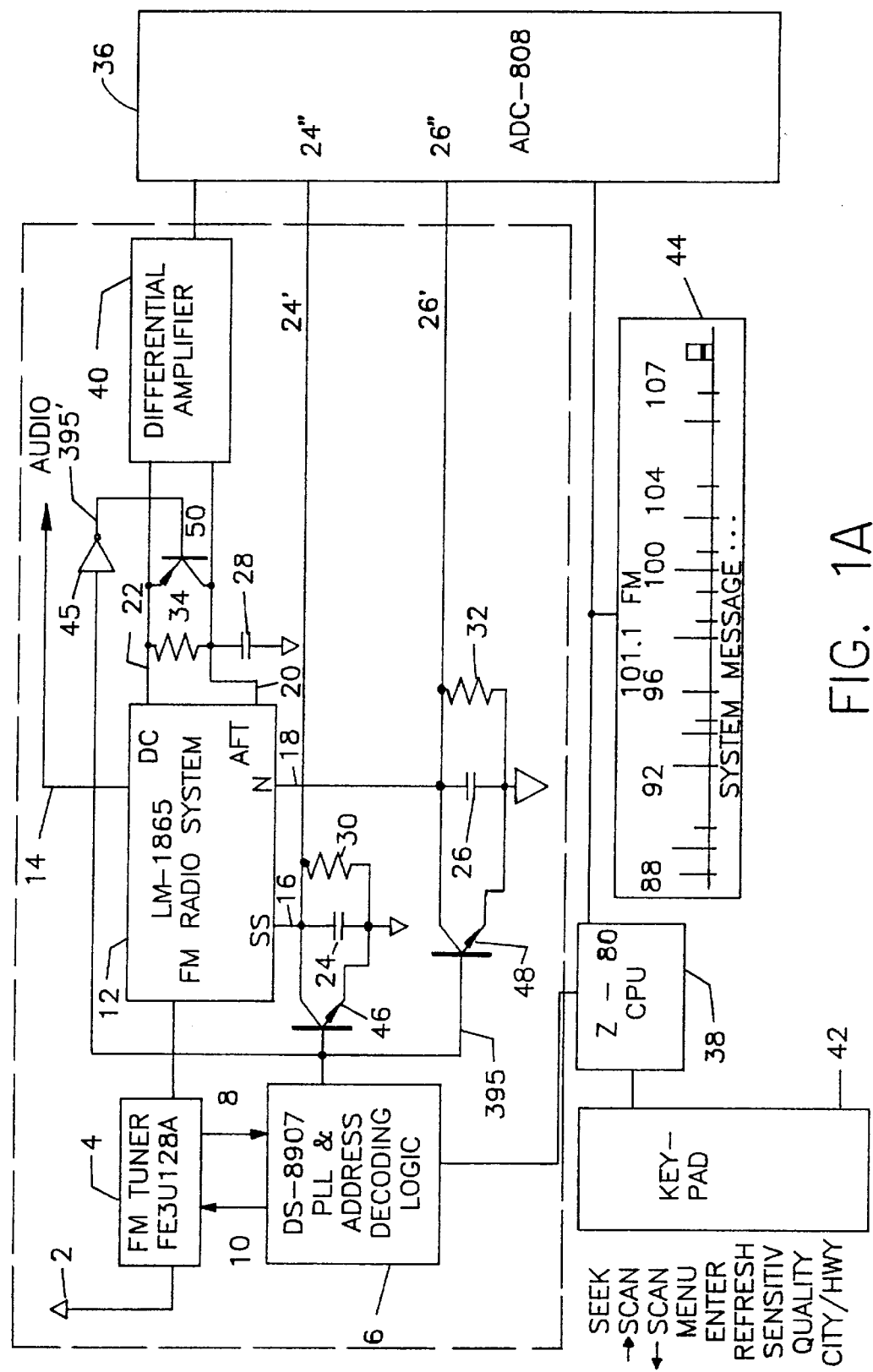
FIG. 1A shows the basic components of a single tuner FM receiver incorporating this invention including the circuits for clamping the SS, N and AFT capacitors.

FIG. 1A shows the basic elements of an FM radio having a tuning system of this invention. An antenna 2 supplies RF signals to a tuner 4, which by way of example may be an FE3U128A tuner module. A local oscillator and mixer, not shown, within the tuner 4 produce an IF signal that is applied to a phase locked loop (PLL) 6 via a lead 8, and the loop provides a correction voltage via a lead 10 to the tuner 4 so as to control the frequency of the local oscillator. The phase locked loop may by way of example be a DS-8907.

The IF signal produced by the tuner 4 is also supplied to a means 12 for providing amplification as well as the limiting and discriminating functions necessary to produce an audio signal on an output lead 14. In addition to an audio signal, the means 12 provides at an output 16 a DC voltage SS corresponding to the average amplitude of the RF signal, and at an output 18 a DC voltage N corresponding to the average amplitude of the noise. An AFT DC voltage is produced at an output 20, and a regulated DC voltage is produced at an output 22.

As in the prior art, the SS, N and AFT voltages at the outputs 16, 18 and 20 are respectively applied to one side of capacitors 24, 26 and 28, the other sides of which are connected to ground. Discharge resistors 30 and 32 are connected in shunt with the SS and N capacitors 24 and 26, respectively, so that the voltages across them follow the variations in SS and N, respectively.

And as in the prior art, a resistor 34 is provided for the AFT capacitor 28 which converts the AFT deviation current 20 into a measurable voltage measured in respect to the DC reference voltage 22. The sampling technique described in this application allows the use of smaller values for resistor 34 and capacitor 28 than in prior art designs which results in faster channel changes.

The SS, N and AFT voltages are connected in the prior art to hard wired trip-level circuits which will cause the system to mute or bypass a channel during the tuning process whenever one or more of them is outside its predetermined respective limit. In this invention, however, they are connected to an Analog-To-Digital-Converter chip 36, such as an ADC 808, that derives digital samples of the voltages under the control of a CPU 38 such as a Z80. The CPU 38 uses these samples to identify the very listenable and listenable channels. Since the AFT voltage on the capacitor 28 can be higher or lower than the DC reference voltage 22, it is coupled to the ADC chip 36 via a differential amplifier circuit 40 which also incorporates a level shifting feature.

The CPU 38 is controlled by a keyboard 42 so as to carry out seek and scan functions by operation on the phase locked loop 6. When these functions are carried out, it may be controlled by the CPU 38 so as to provide vertical bars or other indicia on a display device 44, at the frequencies of listenable and very listenable stations, representing their values of SS. Other keys on the keyboard provide for selection of a menu on the display 44, rescanning to identify very listenable and unlistenable channels and update the display, and for changing the values of signal strength and quality factor to be used in the identification process. In addition, a key may be provided for changing the minimum quality level and signal strength in the identification process depending on whether the radio is being operated in the country or in a city.

In accordance with one aspect of this invention, the speed with which any signals in a channel can be analyzed for listenability is increased by charging or discharging the SS, Noise, and AFT capacitors 24, 26, and 28, respectively, to a neutral value using transistors 46, 48, and 50, respectively, at the initiation of each channel change by the CPU 38. Toward this end, transistors 46 and 48 are respectively connected in shunt with the capacitors 24 and 26, and transistor 50 is connected in shunt with resistor 34. Upon initiation of a seek or scan function at the keyboard 42, the CPU 38 applies an enabling voltage to the PLL 6 to cause it to simulate a local oscillator frequency for the next channel, and an enabling voltage on lead 395 is applied to respective base electrodes of transistors 46 and 48, and an enabling voltage on lead 395' which is inverted and level shifted by inverter 45 is applied to the base of transistor 50, so as to cause momentary conduction of each. The SS and N capacitors 24 and 26 are completely discharged through the main current paths of transistors 46 and 48 to a source of reference potential, ground in this example, and the AFT capacitor 28 is charged to a predetermined voltage, equivalent to zero AFT current, through transistor 50. In this manner, capacitors 24 and 26 can be quickly charged to the values of the SS and N voltages at terminals 16 and 18, respectively, without waiting for them to discharge via their respective discharge resistors 30 and 32. The AFT capacitor 28 is charged to the voltage at the terminal 22 so that less charging or discharging is required on a statistical basis.

Next is a comparison of the capacitor charge and discharge times in the radio system described in FIG. 1A using the features of this invention versus the same radio system using the manufacturer's standard circuitry. The standard circuitry for SS charges through an internal LM1865 resistor of 760Ω into a capacitor (24) of 10 $\mu$F, for a charge time constant of 7.6 ms; the equivalent circuit based on this invention charges a 2.2 $\mu$F capacitor (24) through the same internal 760Ω resistor, and has a charge time constant of 1.67 ms, which is a five-fold improvement. The discharge path for SS in the standard design is from capacitor (24) through resistor (30), which is set at 10 kΩ. and results in a discharge time constant of 100 ms. In the circuit based on this invention the capacitor (24) is shorted directly to ground on channel changes, resulting in a negligible discharge time (<1 ms ). The N circuit is similarly arranged. In the standard circuit, N charges through an internal 9 kΩ resistor into 2.2 $\mu$F capacitor (26) resulting in a charge time constant of 19.8 ms. In the equivalent circuit based on this invention the charge path is via the same internal 9 kΩ resistor into 1 $\mu$F capacitor (26), resulting in a 9 ms charge time constant and a two-fold improvement. The discharge path in the standard circuit is from capacitor (26) through resistor (32), which is set at 25 kΩ, which would yield a discharge time constant of 55 ms except that the discharge time constant is dominated by the fall from the maximum voltage of 0.8 v to below the hard-wired trip level of 0.6 v, and this results in a discharge time constant of 15 ms. As with the SS circuit, in the N circuit based on this invention the capacitor (26) is shorted directly to ground on channel changes, resulting in a negligible discharge time (<1 ms). The standard design AFT circuit charges and discharges capacitor (28) through resistor (34). In the standard design resistor (34) is 5 kΩ and capacitor (28) is 5 $\mu$F, resulting in a time constant of 25 ms for both charging and discharging. In the equivalent circuit based on this invention the AFT charge path is through resistor (34) set 2.7 kΩ to capacitor (28) set 4.7 $\mu$F, resulting in a charge time constant of 12.7 ms for a two-fold improvement; the discharge path for capacitor (28), meaning the path by which the capacitor is set to a neutral level on channel changes, shunts across resistor (34) and results in a negligible discharge time (<1 ms). As is obvious from the above, the procedures of this invention of clamping the capacitors to a neutral level on channel changes result in radically faster circuit discharge times. Also, however, the fact that smaller resistor and capacitor components are required because of the sampling and averaging procedures of this invention results in faster charge times as well, which is another factor contributing to the fast tuning speed of this invention.

Reference is made to FIG. 1B for a description of a circuit that can be used for the differential AFT amplifier circuit 40. AFT voltage from the output 20 fluctuates above and below the approximate center point value of the regulated voltage at the output 22. The resistor 34 converts the AFT current to a measurable voltage, and together with capacitor 28, determines the R-C time constant of the AFT circuit. The AFT voltage is measured between circuit leads 20 and 22 via their connections to an operational amplifier 62, which is arranged to measure the difference between the two voltages. The terminal 20 is coupled via a buffer amplifier 58 and a resistor 60 to the inverting input of an operational amplifier 62, and a resistor 64 is connected between the amplifier's output and inverting inputs. The terminal 22 is connected via a resistor 66 to the non-inverting input of the amplifier 62. A resistor 68 is also connected from the non-inverting input of the amplifier 62 to the junction of resistors 70 and 72, that are connected in series between a point 74 of voltage $V_1$ and ground. The values of the resistors 70 and 72 are such as to apply a predetermined positive bias voltage, 2.5 volts in this case, to the non-inverting input of the amplifier 62. The voltage of circuit lead 20 can be either positive or negative with respect to the DC reference voltage 22, but for reasons of compatibility with the ADC-808 36 which expects positive voltages, the output of the operational amplifier 62 is level shifted upward by 2.5 volts via the input coming through resistor 68 so that zero AFT current is represented by the center of the ADC's dynamic range and so that positive and negative voltages in respect to the DC reference voltage 22 can be properly measured by the ADC. Thus, as long as the sum of the AFT voltage at the terminal 20 plus the predetermined positive bias voltage is greater than the regulated voltage at the output 22, the output of the amplifier 62 will always be positive, and the neutral level will be at 2.5 volts.

In the flowcharts to be explained, certain voltage limits and ranges are indicated. It is to be understood that they are just examples and refer to preferred values for the particular receiver components of FIGS. 23 and 24. Other values may be used.

Figure 2A:
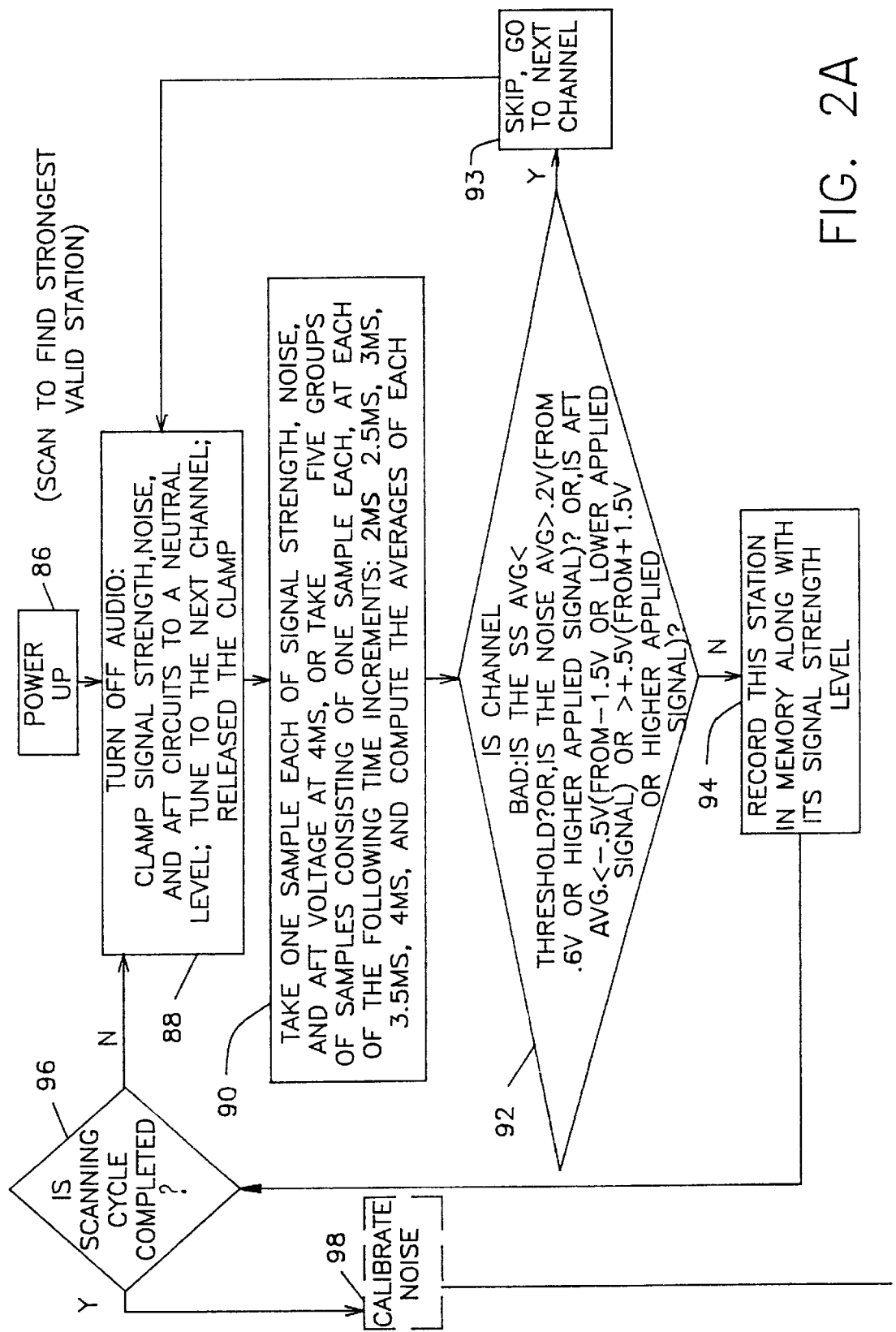
FIGS. 2A and 2B illustrate the basic steps of an initialization procedure for selecting a station that provides a reference or nominal value of AFT.
Figure 2B:
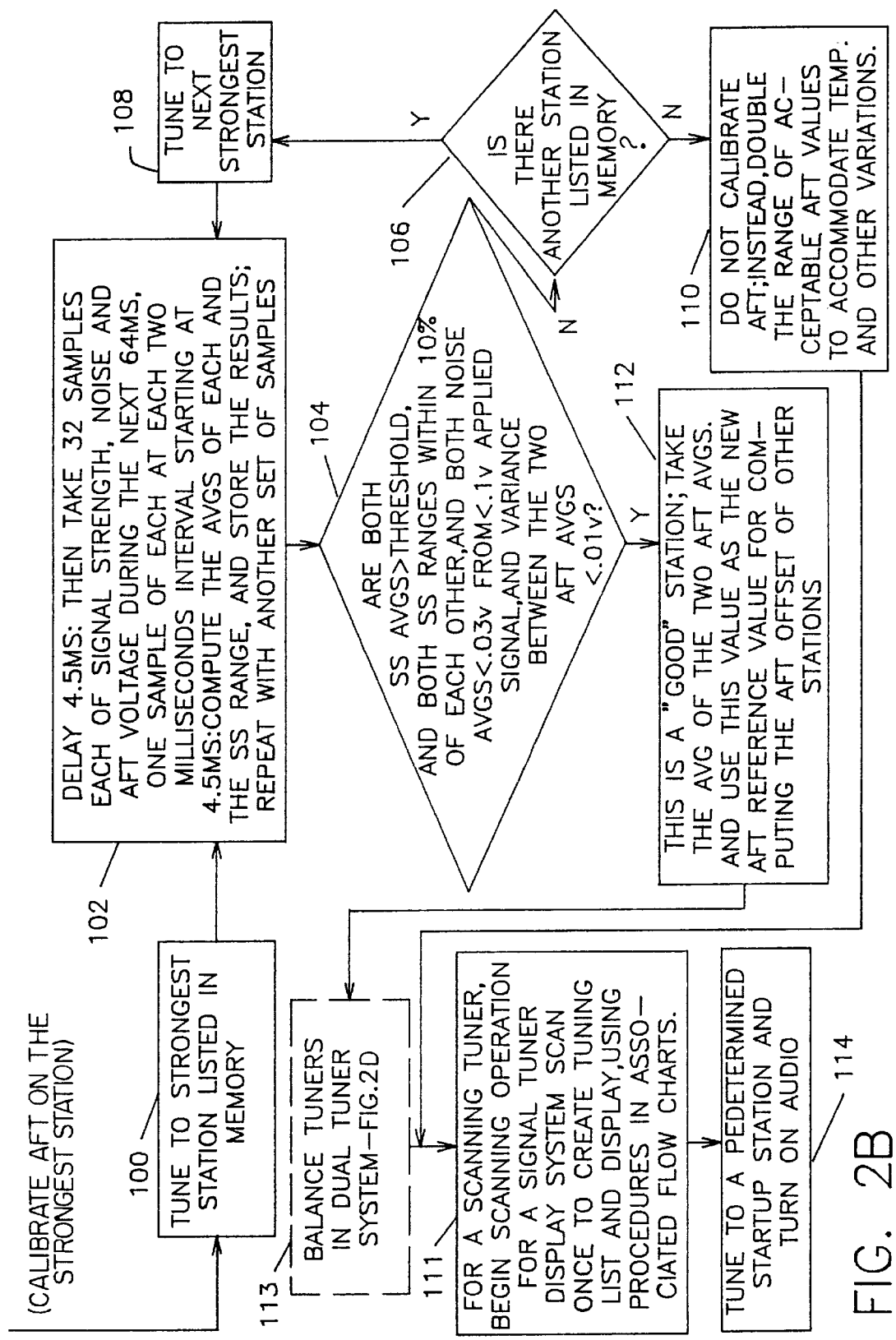

In operating a tuning system of this invention, it is necessary to find a nominal or reference value of AFT. One way to do this is to find a very listenable station and use its AFT voltage as the AFT nominal or reference voltage. Such a station may be found as shown in the flowchart of FIGS. 2A and 2B. Power is turned on, step 86, and at a step 88 the next station is tuned in. The SS, N and AFT capacitors 24, 26 and 28 of FIG. 1A are then momentarily clamped so that they are charged to the neutral voltages previously described.

The next portion of the procedure involves unlistenable station identification. As indicated at step 90, the first step is to obtain the values of a first group of individual samples or the averages of a first group of multiple samples of each of the SS, N and AFT voltages that are developed on the capacitors 24, 26 and 28 within a few milliseconds (ms) after the clamping is released. By way of example, the first group has five samples occurring within 4 ms.

Figure 2C:
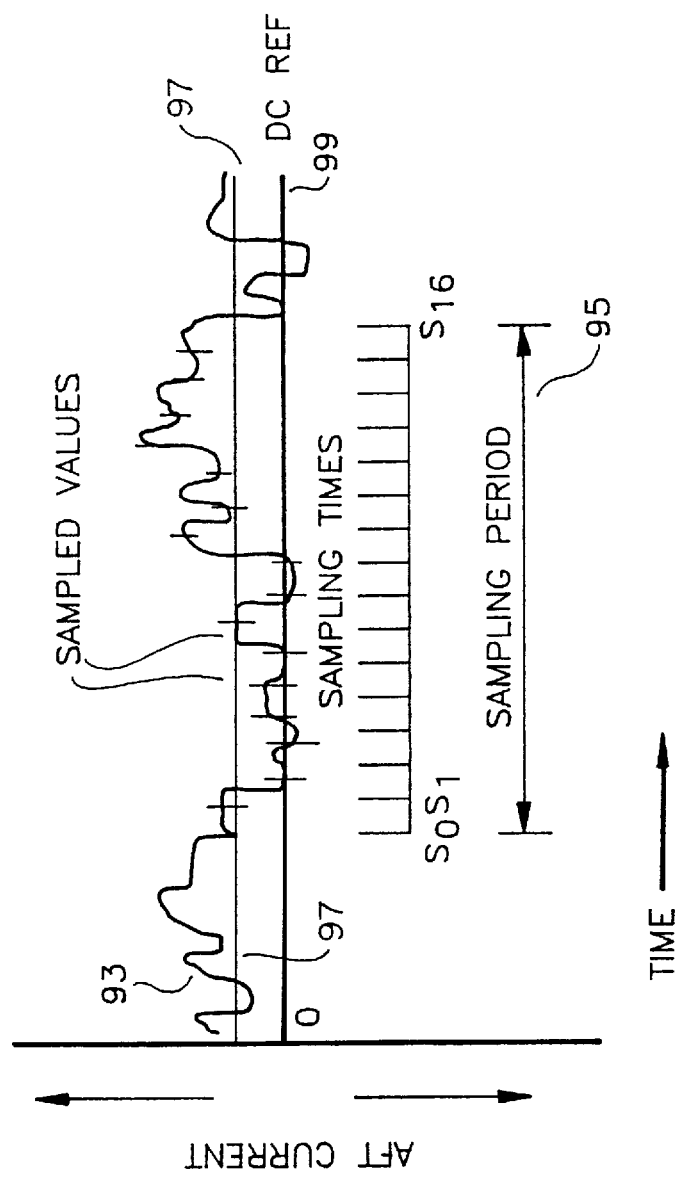
FIG. 2C illustrates the sampling procedure of this invention.

An important aspect of the invention is the averaging of multiple samples to obtain values of SS, N and AFT that are used in the tests of a step 92 that identifies unlistenable channels. FIG. 2C illustrates the sampling and averaging process as applied to the AFT voltage on the capacitor 28. The voltage 91 on the AFT capacitor 28 varies in amplitude, but the average of samples taken during a time period 95 is not affected by the variations as shown by the line 97. This procedure can resolve the AFT current level to 2 $\mu$Amps±a 2 μAmp ADC rounding error, depending upon the number of samples taken and the duration of the time period during which they are taken. 2 μAmps in this design represents approximately 320 Hz frequency deviation of the 10.7 Mhz IF frequency. The average value 97 is compared to the DC reference voltage 99 to arrive at the AFT offset voltage as used in steps 92' and 134 of FIG. 7A, 7B, and 7C and elsewhere. Although not illustrated, the averages of the samples of the voltages across the SS and N capacitors 24 and 26 respectively are less affected by noise and artifacts.

Figure 3:
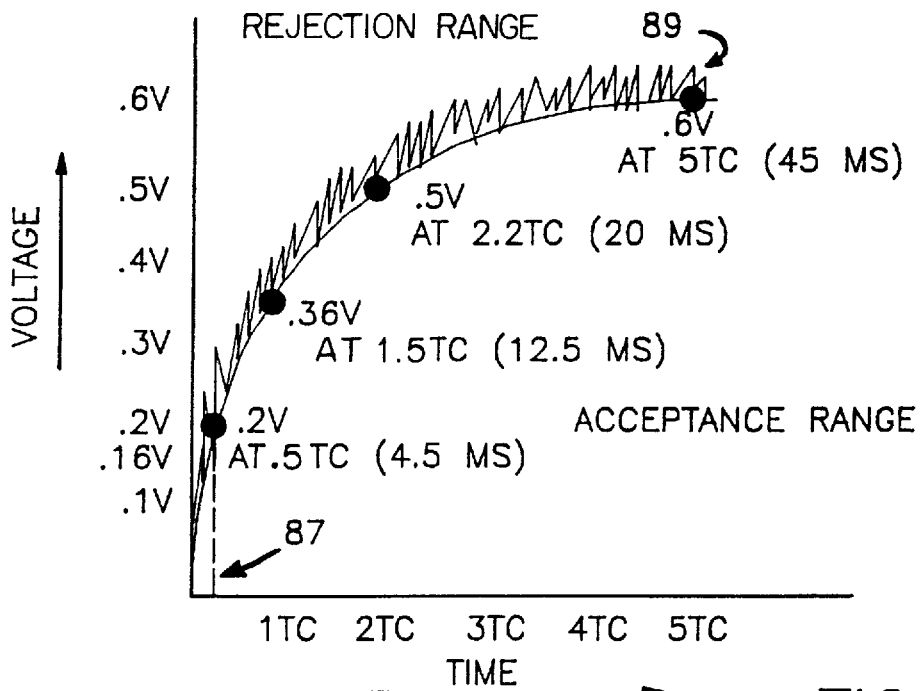
FIG. 3 is a graph illustrating the application of the extrapolation techniques of this invention to the noise limit used in the portion of the flowchart of FIG. 2 that is designed to select the strongest station.

The diamond decision step 92 compares the averages of the SS, N and AFT samples as compared with respective limits. The average for the SS capacitor 24 can be compared with the minimum or threshold value of SS specified by the manufacturer, i.e. approximately 0.6 v in the design of FIGS. 23 and 24, even though the capacitor 24 is not fully charged because it is about 90% charged. The situation is different in the case of the N samples because of the long charging time constant of the capacitor 26. If, as in the receiver components used as an example, the maximum permissible noise is specified to be such that the N capacitor 26 will be charged to 0.6 v in five time constants, a time constant being the product of the capacitance of the capacitor 26 and resistance in series with it, the noise limit charge curve in the presence of this maximum noise is as shown in FIG. 3. Thus, if the average of the samples of N is above the curve, the station is considered to be too noisy to be listenable. Since the first group of samples are indicated in the flowchart to occur within 4 ms, which is slightly less than one-half a charging time constant of 9 ms of the components used in the example, i.e. at point 87 in FIG. 3, a station will be too noisy if the average voltage of the first group of samples exceeds 0.16 v. This is the extrapolation technique previously referred to that permits faster tuning. Additionally however, the noise capacitor is integrating the noise pulses, as indicated by the spikes 89 riding on top of the charge curve. These noise pulses will introduce errors if not accounted for. Taking the average of multiple samples will tend to average out the noise pulses, but since only five samples are taken in this example there could still be an error factor. Since the noise pulses are of approximately constant amplitude regardless of where they occur on the charge curve, the errors will be greatest lower on the curve where the noise pulses represent a greater percentage of the value of the curve. Therefore, samples taken earlier will require a greater allowance for errors than samples taken later. The average value of the first five samples will be about 6% less than the individual sample taken at 4 ms and so will tend to be somewhat conservative in rejecting stations and could represent the error adjustment factor. An additional error adjustment factor could be inserted if desired to more fully compensate for this error condition.

Lastly, the diamond decision step 92 tests to see if the average of the first group of samples of the AFT voltage on the capacitor 28 exceeds a limit. In the circuit described herein the capacitor 28 will not be fully charged when the last of the first group of samples is taken so that an extrapolation technique such as that used with noise must be used. In this case, however, two noise limit charge curves would be required because the maximum AFT voltage for marginally listenable channels can range up to approximately +3 v or −3 v in relation to the DC reference voltage 22. A 5 TC value of ±0.8 v, equivalent to ±300 μAmps, or to a frequency deviation of 48,000 Hz, is indicative of a very bad channel. (The manufacturer's recommended hard-wired trip circuit is set at ±130 μAmps in a circuit with a 5 kΩ resistor 34; the equivalent circuit described in this application has a 2.7 kΩ resistor 34 which will cause a channel to generate approximately twice the AFT current in the equivalent circuit. Therefore, ±300 μAmps (48,000 Hz frequency deviation) in the equivalent circuit is approximately equal to ±130 μAmps (40,000 Hz frequency deviation) in the manufacturer's recommended circuit.) In the circuit used as an example herein the approximate charging time constant of the capacitor 28 is 12.7 ms so that the first group of samples occur during a time of approximately 0.4 of a time constant at which the absolute value of the charging curves is about 0.27 v. However, since the AFT signal is dominated by the super-imposed audio the extrapolation process must be adjusted to allow for that audio so that stations are not rejected in error. Once the capacitor is at full charge, the audio fluctuates above and below the center point of the AFT level by about 0.5 v. By also extrapolating the charge curve for the super-imposed audio in the same way as just described, an allowance of 0.17 v must be added to the 0.27 v previously calculated, and thus the actual rejection level will be set at ±0.5 v (0.27+0.17, rounded up) and is equivalent to ±185 μAmps. Therefore, if the average of the first group of samples is greater than +0.5 v or less than −0.5 v, the AFT is too large and the channel is identified as being unlistenable.

As indicated in a step 94, any channel having a station that is not rejected in the diamond decision step 92 is recorded along with its value of SS. A determination is made in a diamond decision step 96 as to whether all of the channels in the FM band have been analyzed, and the procedure just described is repeated until they are.

When all stations in the FM band have been analyzed, limits for N can be calibrated, if desired, as indicated at a step 98 by following the procedures of FIGS. 17 through 22 to be described, and the calibrated value used in place of the 0.1 v applied signal in a step 104 to be described.

Whether or not the noise calibration is made, the station having the largest SS is tuned in, step 100, and checked to see if it is consistently listenable by following a more restrictive procedure starting with a step 102. This involves taking second and third groups of equally spaced samples of the SS, N and AFT voltages during successive intervals of 64 ms, computing the respective averages for each group and the SS range for each group. The sampling period of 64 ms is used in this circumstance of attempting to find a very listenable station to use as an AFT reference because precision is important at this step—if the reference level of AFT is inaccurate, the evaluation of every station in comparison to it will be inaccurate. A sampling period of 64 ms is long enough to remove audio down to 15 Hz in order to arrive at a pure AFT deviation signal. At other steps, shorter sampling periods might be used for the sake of a faster scanning speed, but at the risk that some AFT measurements might include an error due to the existence of super-imposed audio. The probability of an error is based on the probability of the presence of the very low frequency audio that was not averaged out, along with the relative strength of this very low frequency audio. If there is no very low frequency audio present on the AFT signal at the time the samples are taken, there will be no error. The errors could be reflected in a station being incorrectly accepted or rejected, or in an incorrect QF. The following Table 2 illustrates the design trade-offs between sampling period and scanning speed. The worst case scenario for a scanning radio is a broadcast area with very many stations, as illustrated in the table. The table assumes a listening area with 25 very good stations, 25 very bad channels, and 50 other channels that would require detailed measurements to properly analyze. The aspect of this invention that allows making the acceptance of very good stations and the rejection of very bad channels based on an initial sample or samples minimizes the required scanning time. The portion of the scanning from the following table that is allocated to this initial decision step is just two tenths of a second for the total of 50 channels that would include the 25 very good stations and the 25 very bad channels. The remaining 50 channels which must be evaluated via an additional set of measurements consume the majority of the time, as indicated. System designers will need to evaluate these parameters to determine the performance parameters of their target system.

TABLE 2

|  |  | 64 ms | 32 ms | 16 ms |
|---|---|---|---|---|
| Number of Channels |  |  |  |  |
| Very Good | 25 | .1 sec. | .1 sec. | .1 sec. |
| Very Bad | 25 | .1 sec. | .1 sec. | .1 sec. |
| Remainder | 50 | 3.2 sec. | 1.6 sec. | .8 sec. |
| Total Scan Time |  | 3.4 sec. | 1.8 sec. | 1.0 sec. |
| Audio Removed Down to: |  | 15 Hz | 31 Hz | 62 Hz |

Every time a channel change is made the SS, N, and AFT capacitors are clamped and released as described earlier, but reference to this procedure is omitted from intermediate steps in the flowcharts, such as step 100, for the sake of brevity. Flowchart steps that implicitly incorporate the clamping and releasing procedure include: steps 100 and 108 of FIGS. 2B and 5B; step 175 of FIG. 10B; step 224 of FIGS. 13A and 16A; step 216 of FIG. 12; steps 470 and 476 of FIG. 27A; step 482 of FIG. 28, and any other steps that specify a channel change.

Figure 4:
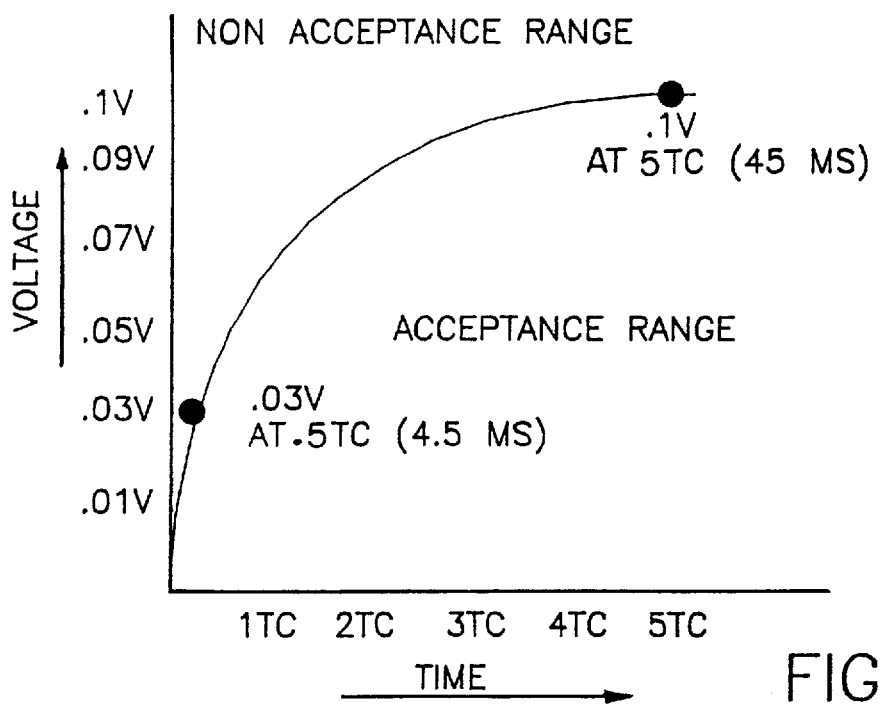
FIG. 4 is a graph illustrating the application of the extrapolation techniques of this invention to the noise limit used in the portion of the flowchart of FIG. 2 that makes a final check on the suitability of the strongest station selected in the first part of the flowchart of FIG. 2.

Then, in a diamond decision step 104, the strongest channel is rejected if the SS averages for both groups of samples are not greater than the threshold value used in step 92, the SS ranges for the groups are not within 10% of each other, the averages of N for both groups is above the curve of FIG. 4, or the variance between the AFT averages for the groups is greater than 0.02 v, which is equivalent to approximately ±2 μA or 320 Hz frequency deviation. Since the search is for a stable, listenable, noise-free station, the noise limit at 5 TC (time constants) is reduced to 0.1 v as indicated in FIG. 4 so that the noise limit is much lower than in the step 92.

If the channel having the largest SS is rejected on any of the criteria in the diamond decision step 104, a check is made in diamond decision step 106 to see if another channel has been recorded in memory at step 94. If so, the next strongest station is tuned in (step 108) and examined as in the step 102 and the diamond decision step 104. If no satisfactory station is found, the AFT is not calibrated, step 110, and the range of AFT values used in diamond decision step 92' is increased, e.g. to ±3 v, in determining the listenability of channels as described in connection with subsequent flow charts.

Figure 2D:
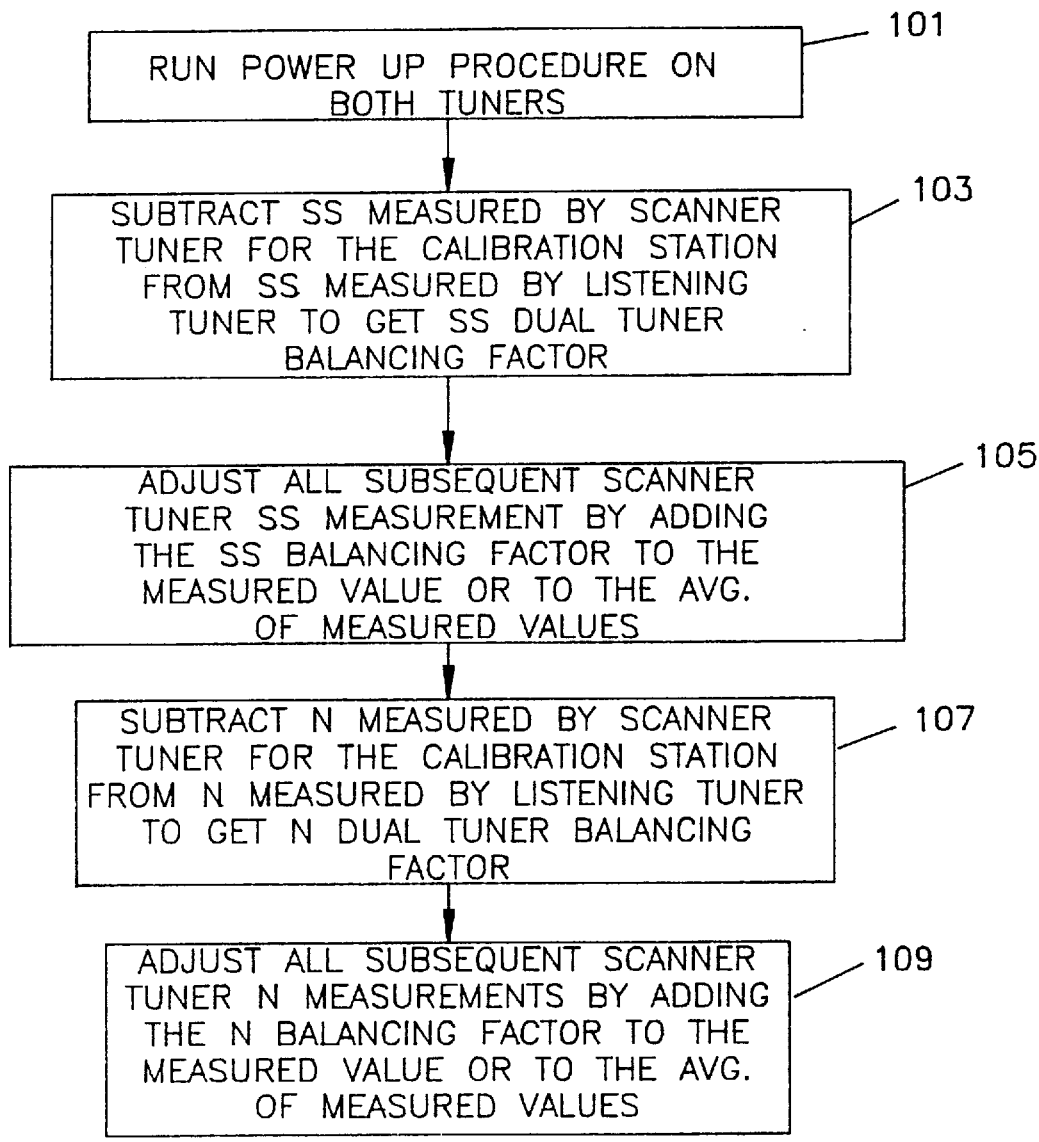
FIG. 2D describes a procedure for balancing the SS and N measurements between tuners in a dual tuner system.

If a station passes the criteria of the diamond decision step 104, the average of the AFT averages for the two groups of samples is used, step 112, as the reference value of AFT for the computation of the AFT offset as required in other procedures to be described herein. In a dual tuner system, an optional step 113 can be undertaken at this time to balance the measurements of the two tuners so that both will respond identically to broadcast signal parameters. Step 113 refers to FIG. 2D, which is described next. After both tuners have executed the power up routine of FIGS. 2A and 2B, step 101, the SS average for the calibration station measured by the scanner tuner is subtracted from the same measurement made by the listening tuner in step 103 to arrive at the SS dual tuner balancing factor. In step 105 this SS balancing factor will be added to all subsequent measurements of SS by the scanner tuner that are described in the flow charts in this document. An N dual tuner balancing factor is similarly arrived at in step 107, and is used to adjust all subsequent scanner tuner N measurements in step 109.

Now returning to FIGS. 2A and 2B, when this startup calibration procedure has been completed, the radio can shift into its normal operation modes, as indicated in step 111 and which will be described in other flow charts in detail. In either case, the tuner is tuned to a predetermined startup station, step 114 which may be the station the radio was tuned to when the radio was last powered off.

In view of the fact that there is considerable redundancy in the flowcharts for operating listening and scanning tuners, identical steps and diamond decision steps are designated by the same number and those that differ only slightly are designated by the same number primed.

Figure 5A:
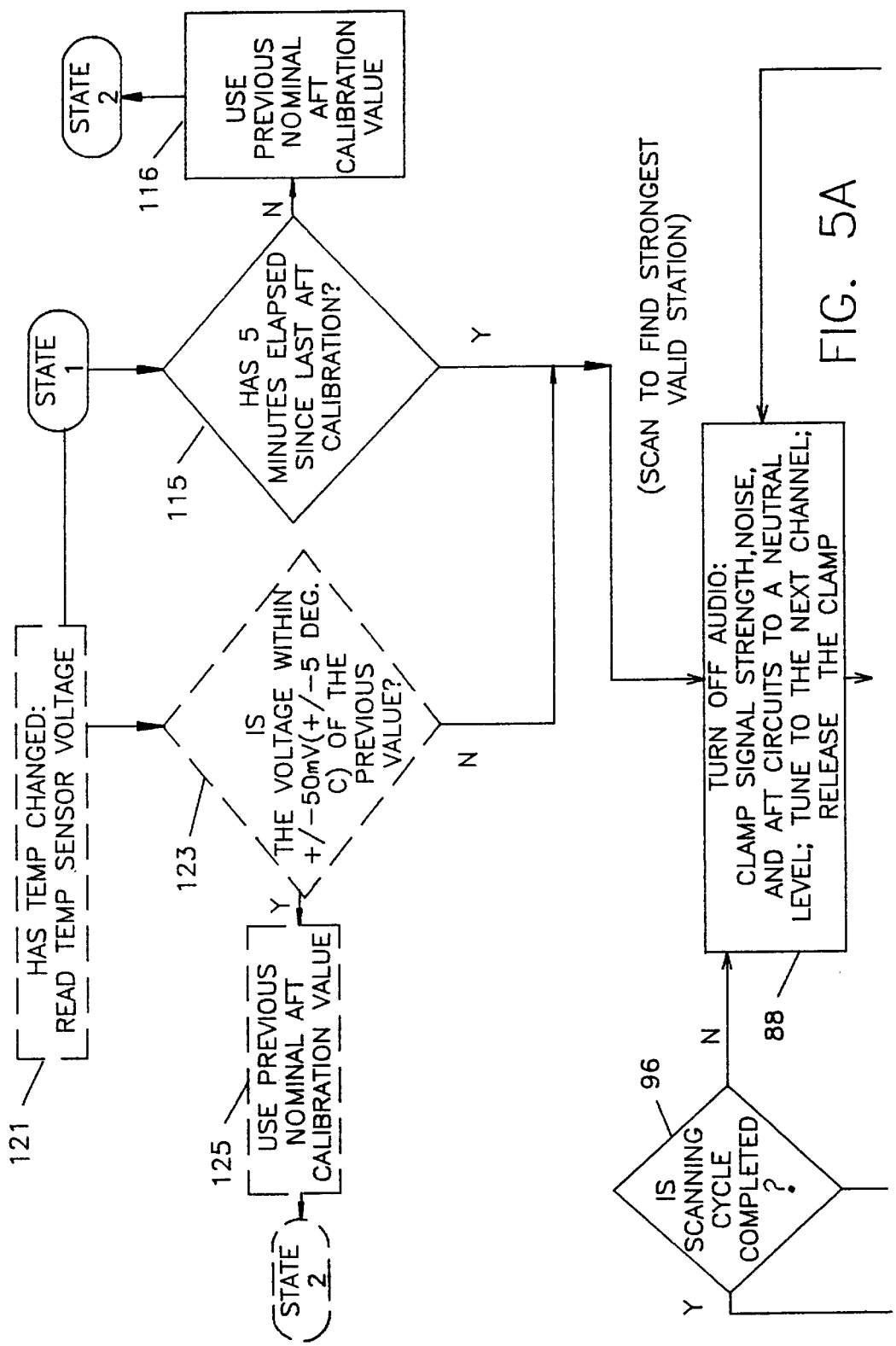
FIGS. 5A, 5B and 5C are a flowchart of the procedure for selecting a station that is to provide the reference value of AFT if a given amount of time has elapsed since the initialization procedure illustrated in FIG. 2.
Figure 5B:
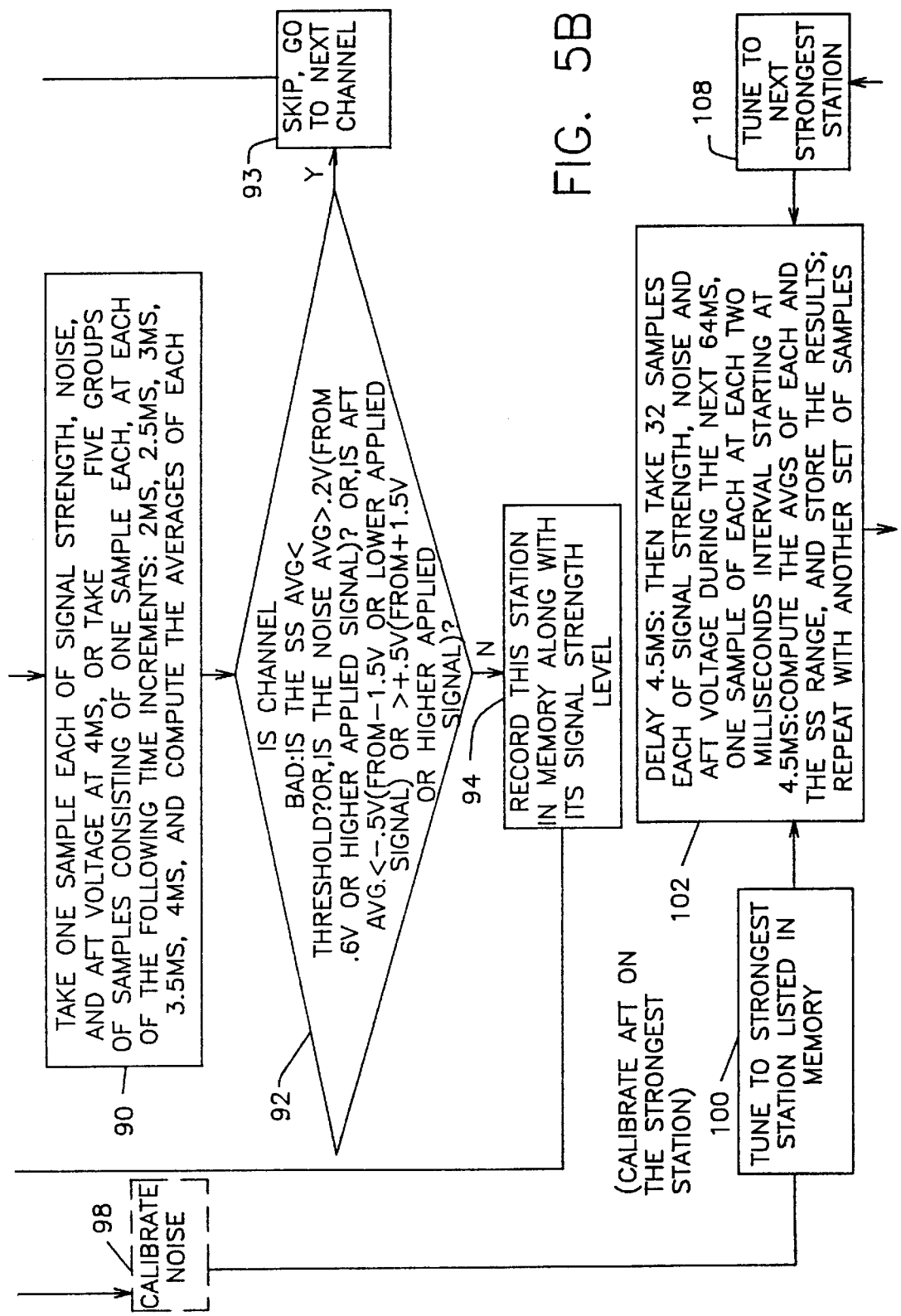
Figure 5C:
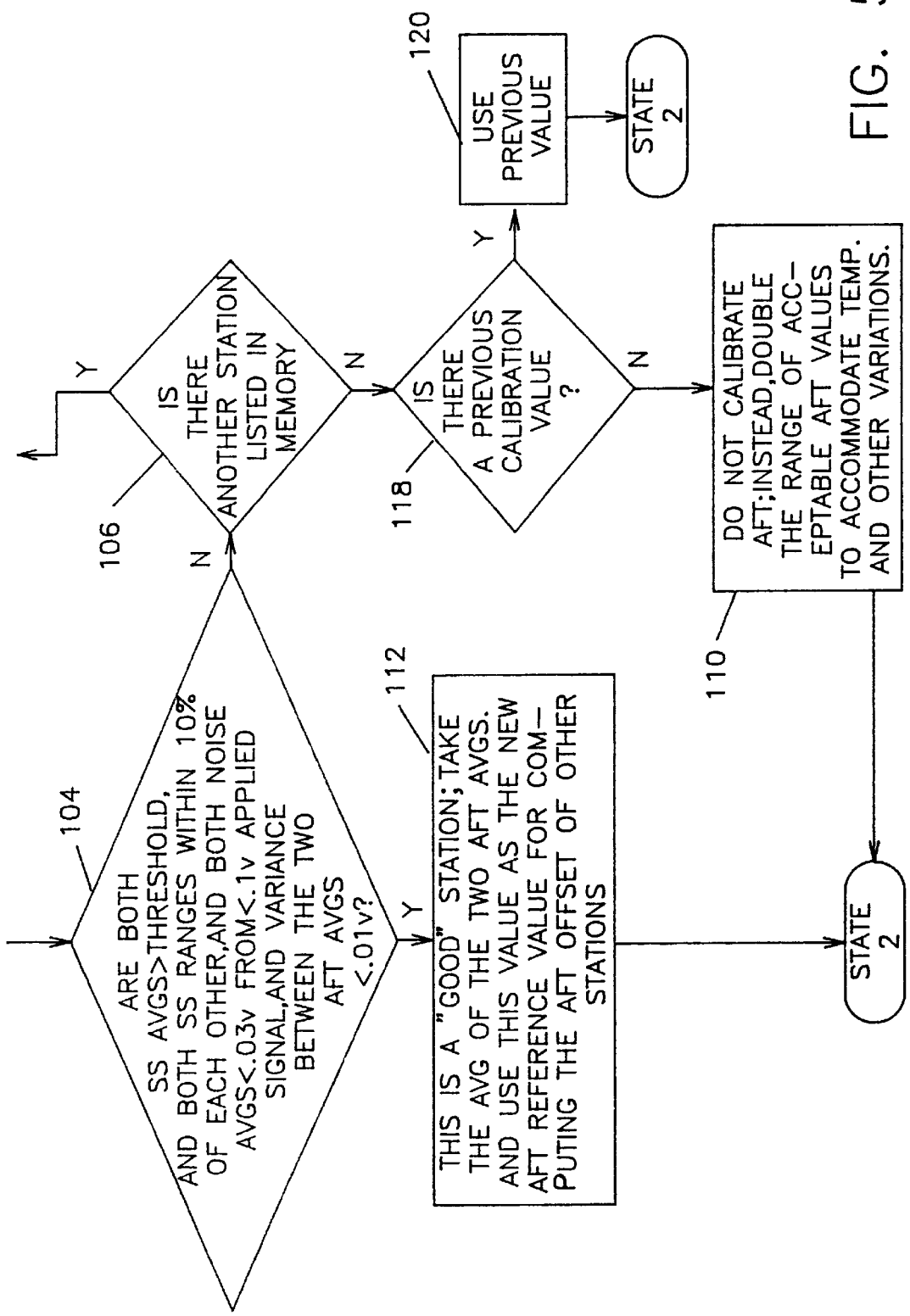

Whether or not the reference value of AFT found by the initialization procedure of FIGS. 2A and 2B just described is still valid, depends on the amount of time that has elapsed from the last determination of a reference value. Therefore, after a seek or scan mode of operation is activated in a single tuner receiver or the listening tuner of a dual tuner receiver, the elapsed time is noted, diamond decision step 115 of FIG. 5A, and the value of AFT found in the initialization procedure is used, step 116, if the elapsed time is less than some arbitrary amount such as the five minutes shown in the diamond decision step 115. If too much time has elapsed, the procedure followed to derive a suitable reference value of AFT is shown in FIGS. 5A, 5B, and 5C. FIG. 5A, 5B, and 5C proceed from a State 1 to a State 2. It is nearly the same as FIGS. 2A and 2B, but differs therefrom in the following respects.

If the weakest station listed in memory at the step 94 of FIG. 2A is not satisfactory, there is no other station that can be used to provide the reference AFT, but in FIGS. 5A, 5B, and 5C there may be another station so that instead of not calibrating AFT as in step 110 of FIG. 2B, a search is made, diamond decision step 118, to see if there is a previous calibrated value of AFT stored in the system's memory, in which event it is used, step 120. Although five minutes may have elapsed since the initialization procedure, the procedure of FIGS. 5A, 5B, and 5C may have been performed in the meantime in the normal course of seek or scan tuning operations.

Whether or not five minutes has elapsed since the reference AFT was determined by the initialization procedure, the procedure of FIGS. 5A, 5B, and 5C may be used if there has been a significant change in temperature. The change in temperature is indicated by a sensor voltage, step 121, and if it does not indicate a given change in temperature since the last reference value of AFT was determined, step 123, whether during initialization or otherwise, the previous reference value for AFT is used, step 125, but if a greater change in temperature has occurred, the procedure of FIGS. 5A, 5B, and 5C beginning with the step 88, is followed.

Figure 6:
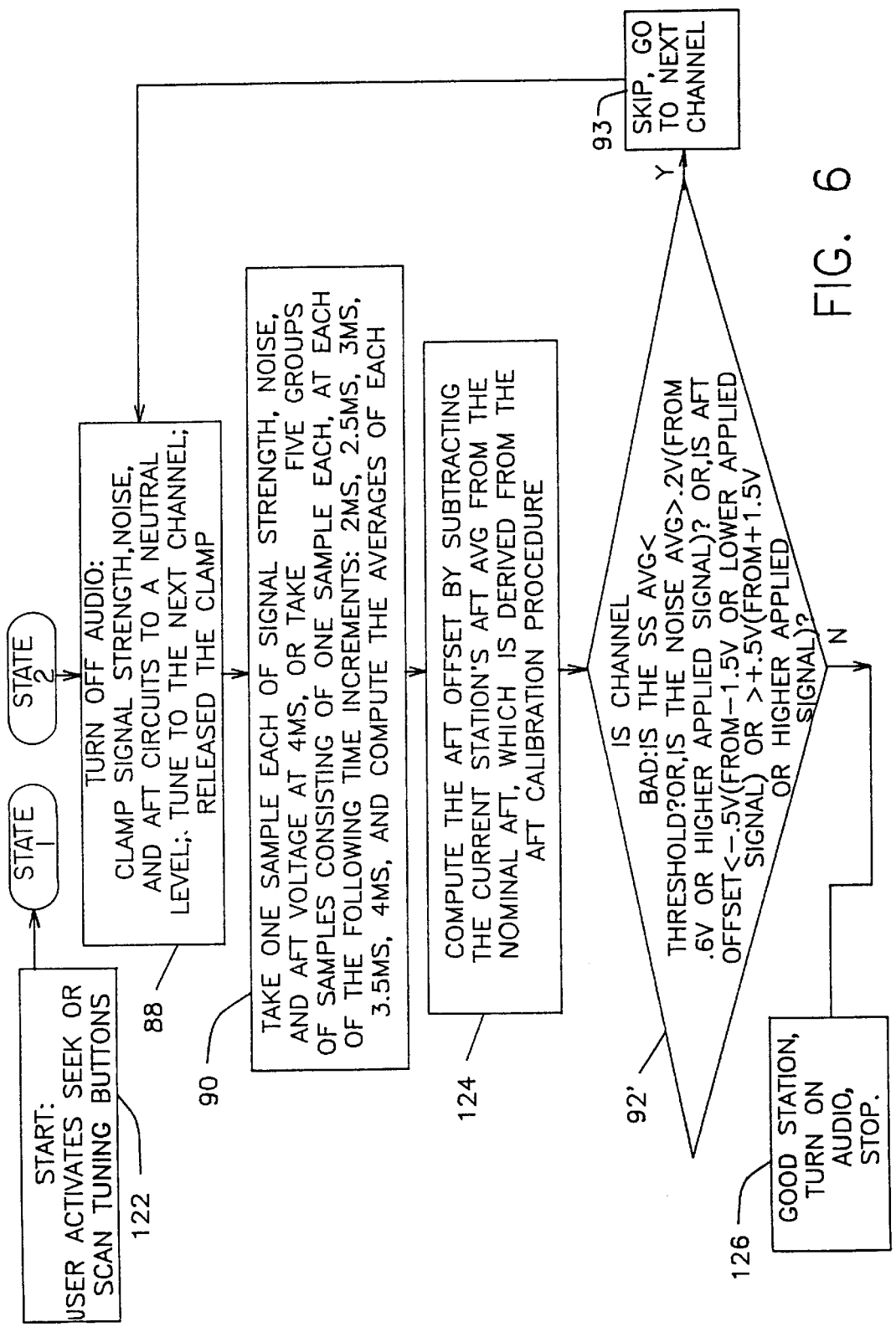
FIG. 6 is a simplified flowchart illustrating the operation in accordance with the invention of a single tuner FM receiver having no display or memory buttons.

FIG. 6 is a flowchart of the tuning operation in accordance with basic aspects of this invention of an FM receiver having only one tuner and no display or "best station memory" feature. Each channel is accepted as a listenable station or rejected as an unlistenable station as it is addressed in the seek or scan mode of operation, but the decisions are made more accurately and quickly than in the prior art.

After the seek or scan mode operation is initiated, as indicated by a step 122, the procedure passes from a state 1 to a state 2 so as to attain a calibration of AFT on a very good station in the same manner as indicated by the flowchart of FIGS. 5A, 5B, and 5C. Unlistenable stations are identified in much the same manner as in FIGS. 5A, 5B, 5C. The step 88 for momentarily clamping the SS, N and AFT capacitors and the step 90 for sampling are the same as in FIGS. 5A, 5B, and 5C but a new step 124 is added that determines the difference, or offset, between the AFT voltage of a current channel and the reference AFT voltage. No offset could be used in FIGS. 2A or 5A, 5B, and 5C because their purpose was to obtain a reference value of AFT for determination of the offset. Therefore only a range of AFT values could be used in FIGS. 5A, 5B, and 5C as in the prior art, but in FIG. 6 a diamond decision step 92' is the same as the diamond decision step 92 of FIG. 5B except for the fact that the AFT offset, rather than the AFT voltage itself, is compared with the voltage limits indicated. If a station passes the criteria of the diamond decision step 92' of FIG. 6, it is accepted and the audio signal is turned on, step 126. Because the selection of acceptable stations is made on the basis of a few samples and rather loose criteria, they may well include stations that are barely listenable or even unlistenable as in the prior art, but unlike the prior art, the same channels are accepted by the same radio at different temperatures and by different radios of the same basic design.

Figure 7A:
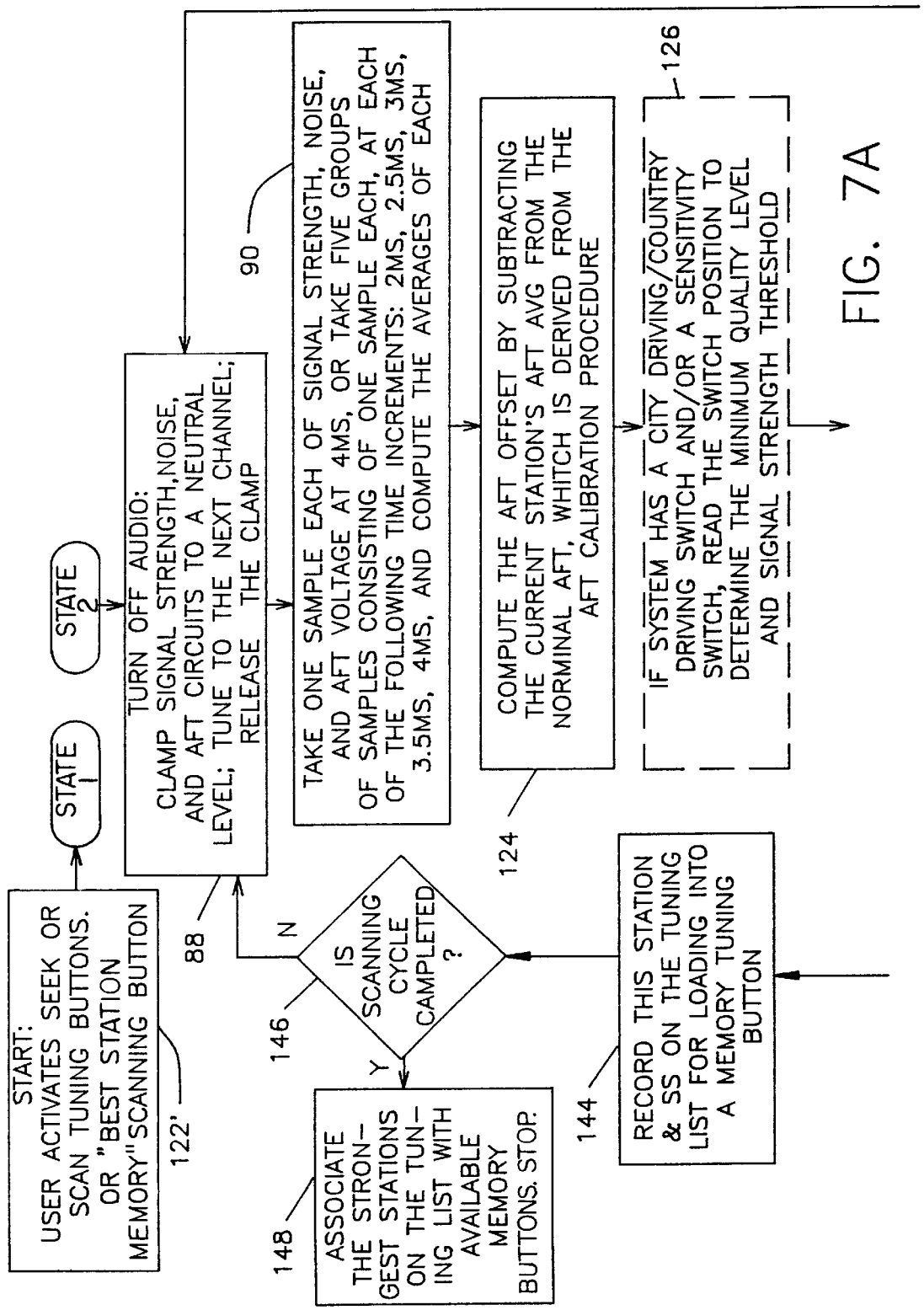
FIGS. 7A, 7B and 7C are a flowchart for the operation of a single tuner FM receiver having memory buttons but no display of listenable channels.
Figure 7B:
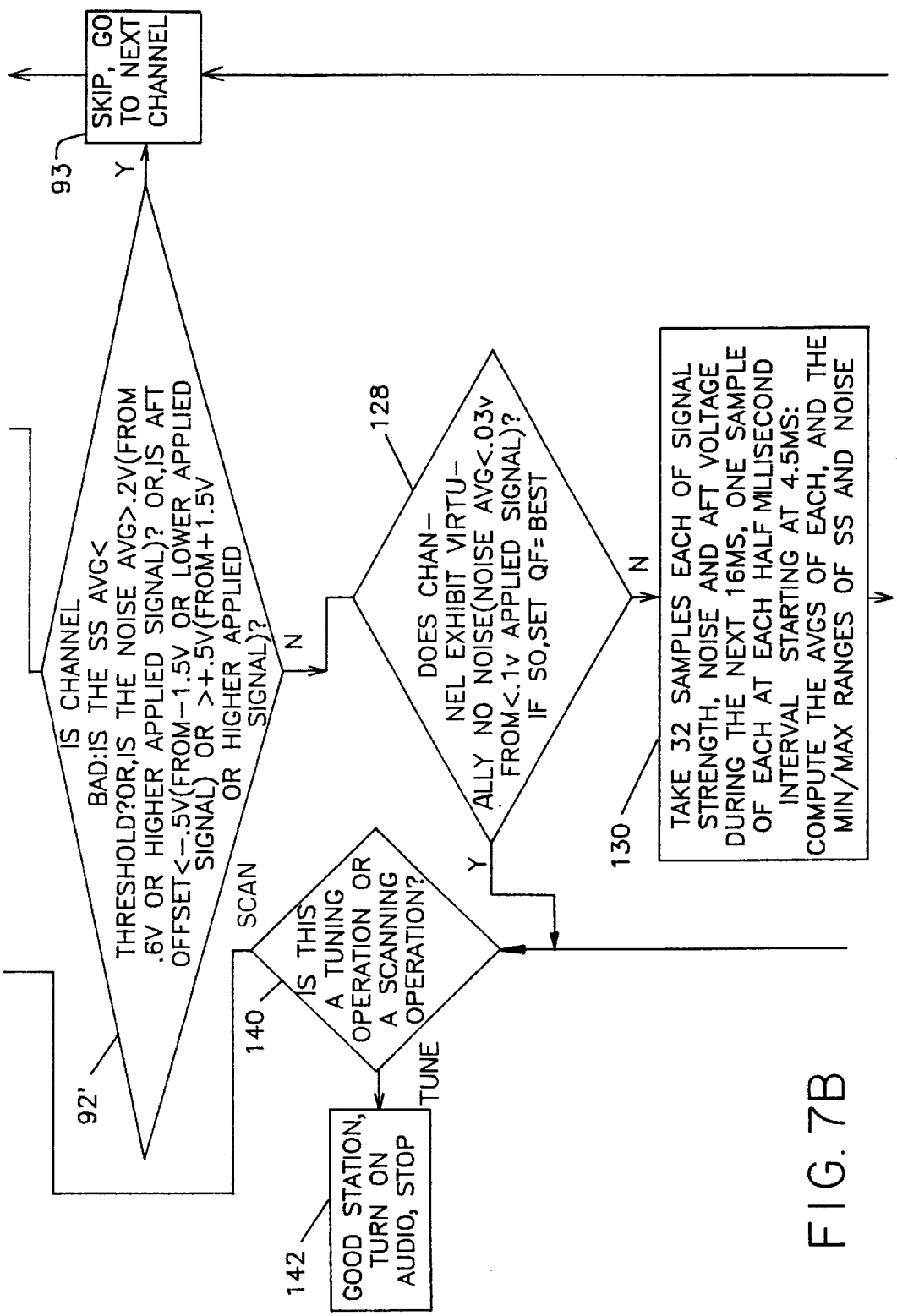
Figure 7C:
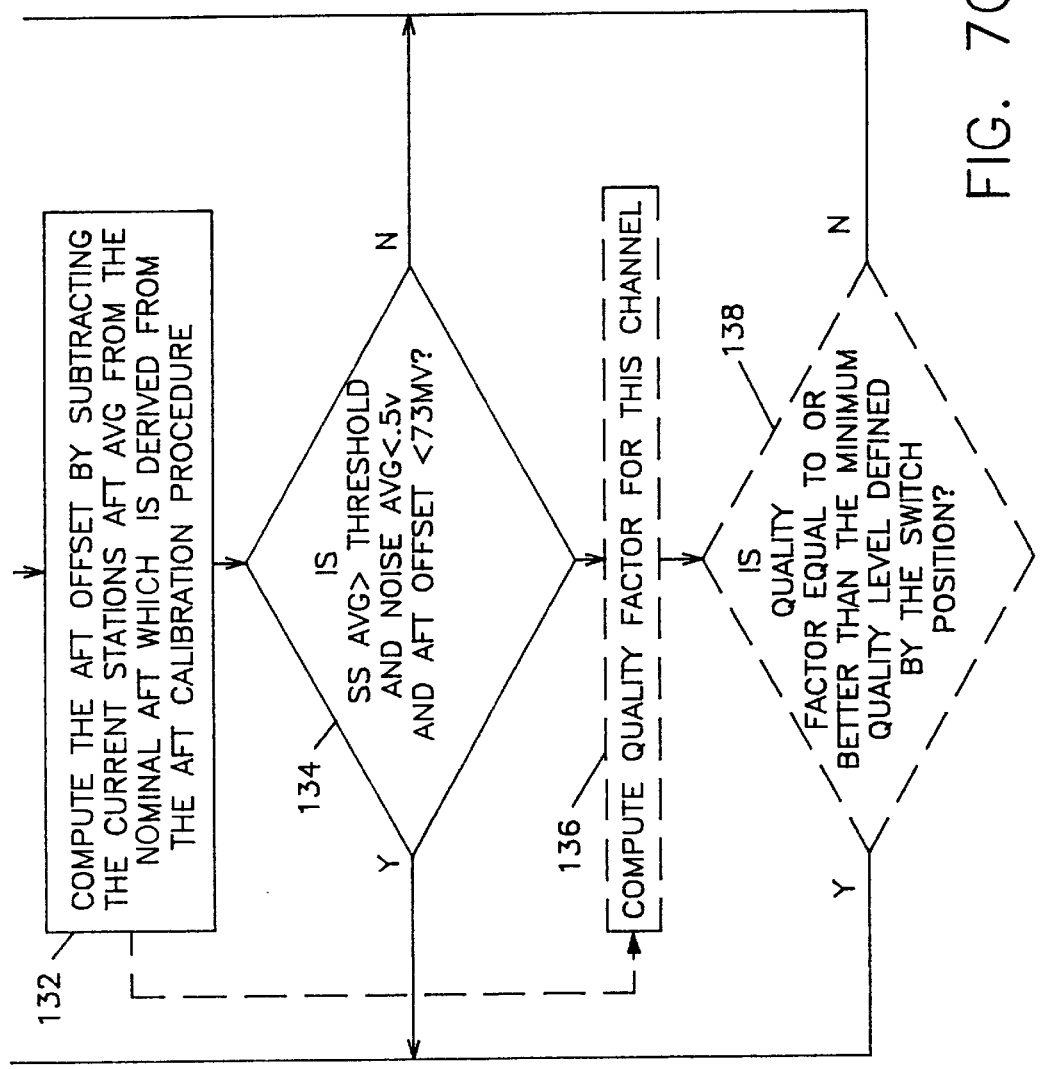
Figure 7D:
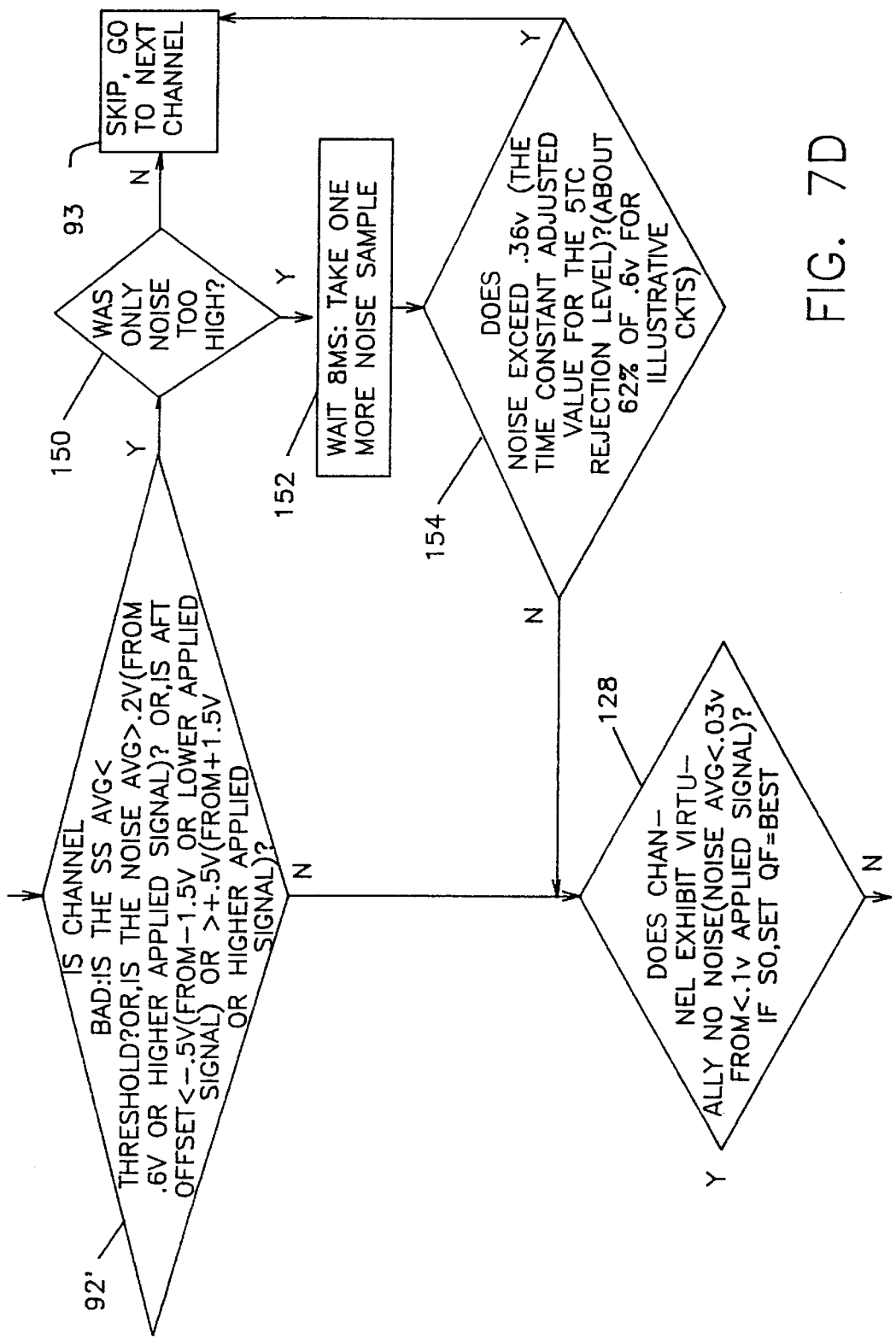
FIG. 7D is an alternative algorithm for use in FIG. 7 in eliminating a station because of noise.

FIGS. 7A, 7B, and 7C are a flowchart that adds further steps to the flowchart of FIG. 6 for distinguishing between listenable and unlistenable stations with greater accuracy. It provides for assigning the strongest channels to memory buttons (push button switches associated with respective memory locations) commonly referred to as "best station memory" buttons, but has no display. Except for adjusting the minimum quality level and SS threshold in accordance with the position of a country driving/city driving switch as optionally indicated at a phantom step 126, the first part of the procedure is the same as in FIG. 6. At a start step 122' seek or scan buttons can be activated as in the step 122 of FIG. 6, but in addition there is a best memory button.

Very listenable stations are now identified. If a channel is not rejected at the diamond decision step 92', a diamond decision step 128 determines whether or not it is very listenable on the basis of its having virtually no noise. Thus, an unlistenable channel is identified in the diamond decision step 92', and a very listenable channel is identified in the diamond decision step 128 on the basis of a very few samples taken in the step 90, therein shown by way of example to occur in 4 ms.

Only a channel that is not rejected in the diamond decision step 92' as being unlistenable or not classified as being very listenable in the diamond decision step 128 is subjected to further sampling and analysis for determining whether it is listenable or not. Much time is saved because the number of channels subjected to further analysis is reduced. Further samples are taken of SS, N and AFT and the averages of each determined as indicated in a step 130. In this example, 32 samples are taken at 0.5 ms intervals during the next 16 ms. If a quality factor, QF, is to be computed, the ranges of SS and N are found. The offset of the average AFT from the nominal value of AFT is determined in a step 132, and a diamond decision step 134 determines whether the SS average is greater than a given threshold, the N average is less than a given limit, and the AFT average is less than a given limit. The acceptance/rejection values reflect the charge curve, as illustrated in FIG. 3, for the time period when the samples were taken. If an affirmative answer is attained for all three, the channel is considered to be listenable, but if a negative answer occurs, the channel is rejected and the procedure loops back to the step 88 as indicated by the step 93.

Note that in order to be accepted as listenable by the step 134, a channel must be more listenable or better than that required for acceptance by the step 92' because there are more samples which refine the measurement. By example, an average of 0.5 v for the samples taken in this step 130 would be a much lower noise limit than in the step 92', and an AFT offset of 73 mv (equivalent to 27 $\mu$Amps) is much less than the offset of 0.5 v (equivalent to 185 $\mu$Amps) used in the step 92'.

As a further refinement of the system, station listenability may be analyzed by use of the quality factor determined by steps 136 and 138 that are shown in dashed lines. This is a mathematical procedure that combines the effects of multiple signal parameters into a single result. This procedure yields better results than would be obtained by depending on any single signal parameter. Stations may be graded into two or more groups based on their respective quality factors, and the gradings may be distinctly indicated by various means on systems with a display unit. A means may be provided for selecting stations of certain gradings, and of rejecting stations of other gradings. The use of QF to accept or reject stations may be done sequentially, following diamond decision step 134, as shown by the solid line in the flow chart, or it may be done in lieu of diamond step 134, as indicated by the dashed line in the flow chart proceeding from step 132 directly to step 136. The quality factor, QF, expression is repeated here for convenience, as follows:

$$QF = \sqrt{AVG\ N \cdot AFT\ \text{offset}} + \frac{N\ \text{range}}{2}$$

Since this is a simple calculation, the associated procedures can be easily provided by one skilled in the art. If, as indicated in a dashed diamond decision step 138, the QF is equal to or greater than a preselected value, the channel is considered to be listenable. Ordinarily, the preselected value would be set at 9, but if noisy channels are not desired, it could be set at 5. A key on the keyboard 42 controls means for varying the value of the QF used as a criteria for selection of a channel as listenable.

If a channel is rejected as unlistenable at any of the diamond decision steps 92', 134 or 138, the next channel is analyzed beginning at the step 88 as indicated by the step 93, but if a channel is determined to be very listenable by the diamond decision step 128 or listenable by the diamond decision steps 134 or 138, the best stations are assigned to channel selection or memory buttons as immediately described. A diamond decision step 140 determines whether one of the seek or scan tuning buttons, or a best station memory scanning button has been activated. If a seek or scan button has been activated, the audio is turned on, step 142, and the procedure stops. If the best memory scanning button has been activated, the channel is recorded on a tuning list for subsequent loading into a memory location associated with a channel selection button via step 144. Next, diamond decision step 146 determines if the entire FM band has been scanned. If not, the procedure loops back to the step 88. If so, the tuning or memory buttons are respectively associated with the stations in accordance with their SS. Alternatively, only the very good stations having no noise, as determined by diamond decision step 128, could be assigned to the memory or channel selection buttons, but if there are less of such stations than there are channel selection buttons, the remaining buttons could be assigned on the basis of their SS.

The procedures for finding listenable stations as illustrated in FIGS. 7A, 7B, and 7C and elsewhere are designed to minimize the time required to scan the frequency band and make this determination. However, if speed were not an issue the AFT calibration procedures of FIG. 1A or FIGS. 5A, 5B, and 5C could be used instead since they essentially are simply more rigorous algorithms for finding a good station.

An important aspect of the invention is the speed with which the channels of a band can be classified as unlistenable, very listenable, or listenable. In addition to the clamping of the SS, N and AFT capacitors 24, 26, and 28, respectively, before they are fully charged, as was explained in connection with FIGS. 1A, 3 and 4, the speed is contributed to by the fact that unlistenable and very listenable channels are quickly identified on the basis of a first group of a very few samples by the diamond decision steps 92' and 128, respectively, so that these channels do not have to be analyzed on the basis of the second group of samples referred to in the step 130 or in the step 138 if used.

Another factor contributing to the speed of scanning a band of frequencies is that satisfactory values of SS, N and AFT can be attained by averaging the samples taken from a circuit with a smaller filter, rather than by using a larger filter in conjunction with a hard-wired trip circuit as in the prior art. This is especially advantageous in deriving the value of AFT, because in the prior art the AFT filter circuit should be designed to filter out the lowest audio frequency which may be present. The sampling period of 16 ms as used in this application is adequate to remove the super-imposed audio down to 62 Hz. Other sampling periods could be selected for either faster or more precise operation as previously described. A large filter capacitor introduces considerable delay. Typical engineering practices in prior art radio design allow 70 ms to evaluate each channel due to this filter. FIG. 2C, previously discussed, shows an AFT signal 91 as it would appear with a reduced low pass filter when the IF signal is modulated with a low audio frequency. This signal is the summation of the audio signal and the more slowly changing AFT signal. The second group of samples are indicated at $s_1$–$s_{16}$, and it can be seen that their average will be substantially unaffected by the audio signal as shown by the dashed line 95.

FIG. 7B illustrates a different procedure that can be used in FIGS. 7A, 7B, and 7C if the diamond decision step 92' rejects a channel. Certain types of radio interference patterns will cause intermittent ultrasonic noise bursts that are barely detectable audibly, but which exceed the noise rejection limit for a few milliseconds during each burst. A diamond decision step 150 determines whether only the noise N exceeded the limit in the diamond decision step 92'. If not, the channel was rejected for other reasons and the procedure loops back to the step 88 via step 93, but if only N exceeded the limit, there is a slight delay before another sample is taken of the noise, step 152. This additional sample must confirm the continued presence of noise in order for the station to be rejected. Then at a diamond decision step 154 it is determined whether the amplitude of the sample exceeds the amplitude of the curve of FIG. 3 at the time the sample occurred. If so, the next channel is tuned in, step 93, and the procedure loops back to the step 88. If not, the channel is not considered to be unlistenable because of N and the procedure goes to the diamond decision step 128.

Figure 8A:
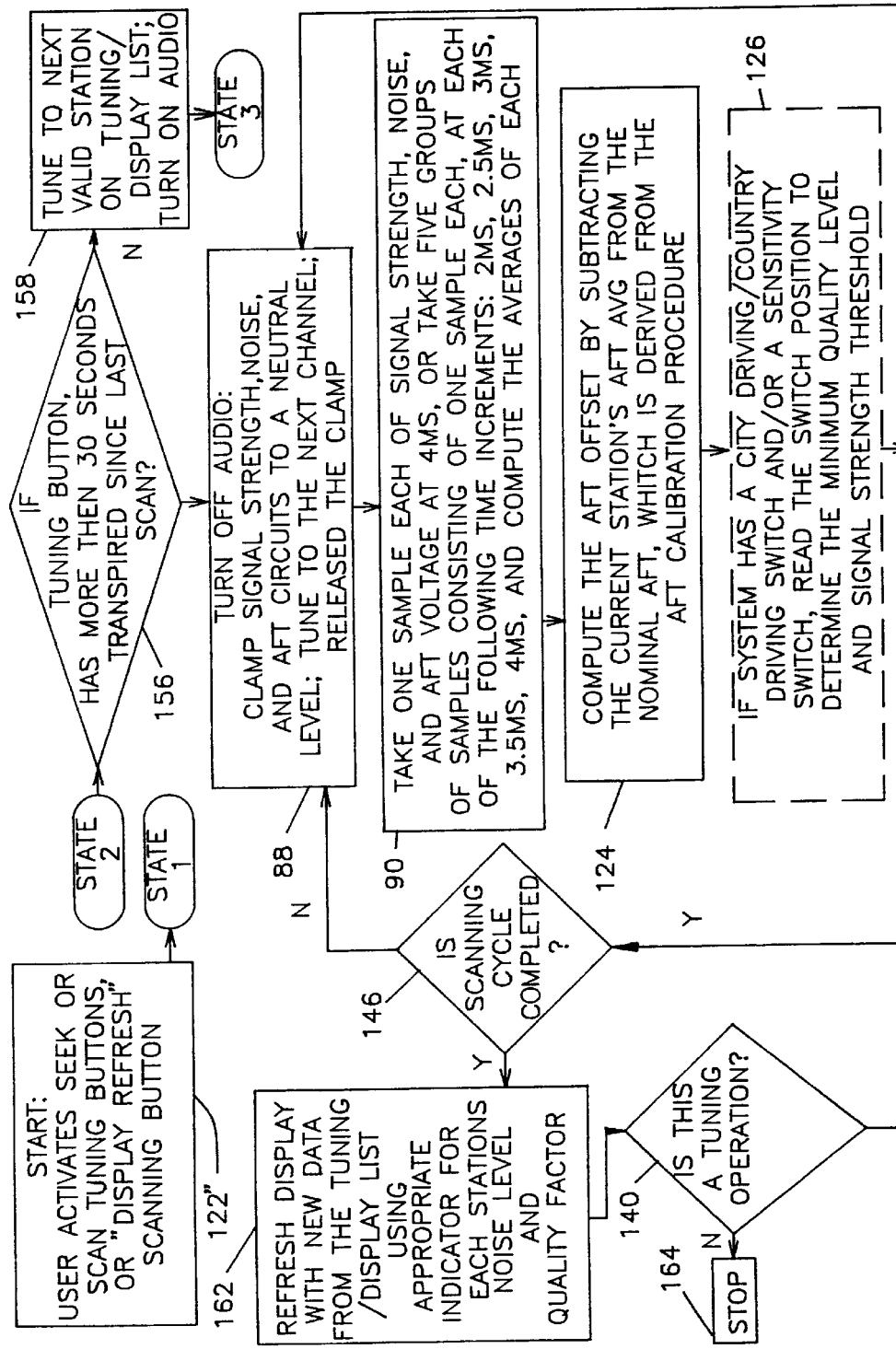
FIGS. 8A, 8B and 8C are a flowchart illustrating operation in accordance with this invention of a single tuner FM receiver in which listenable channels are displayed.
Figure 8B:
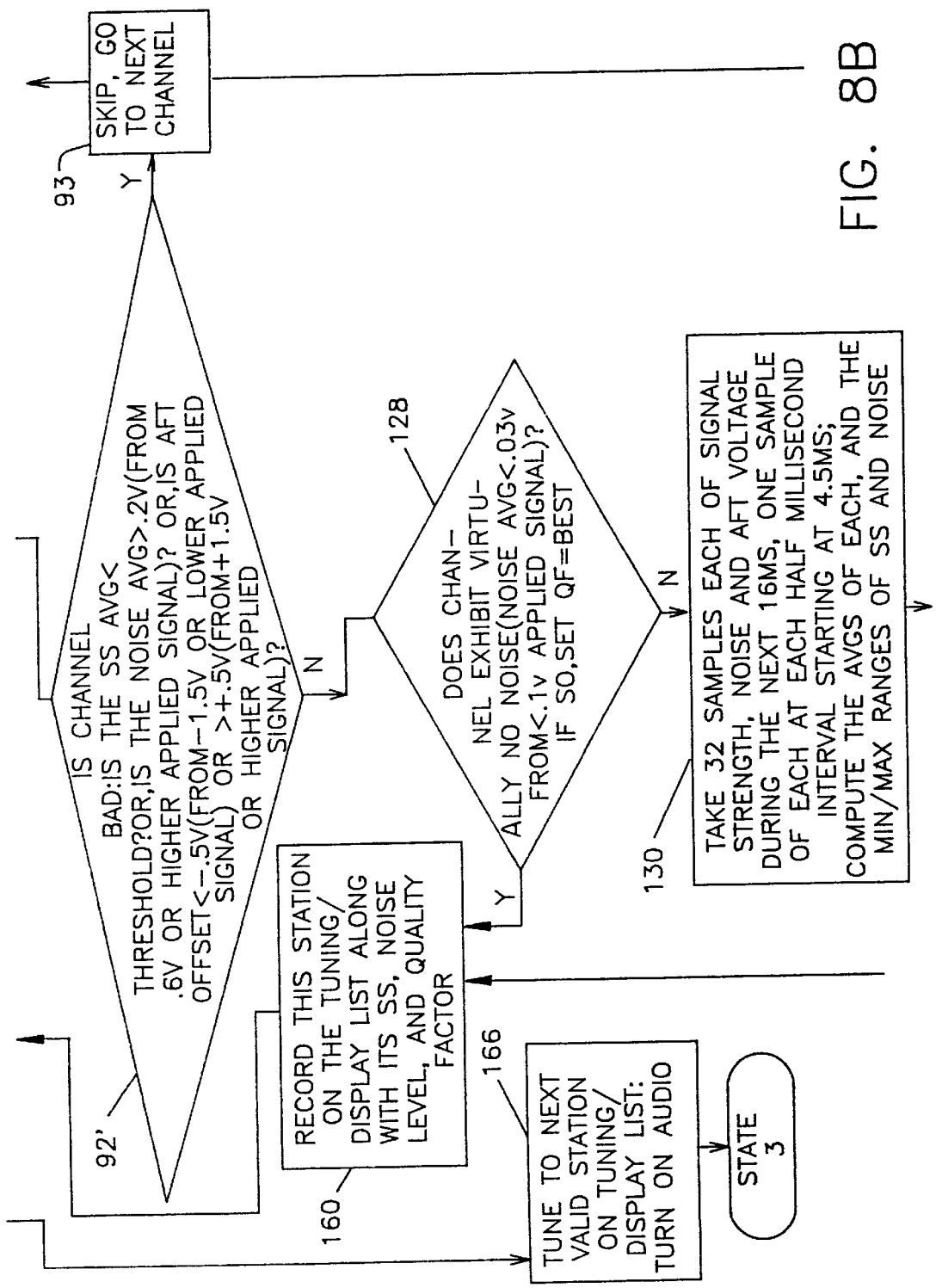
Figure 8C:
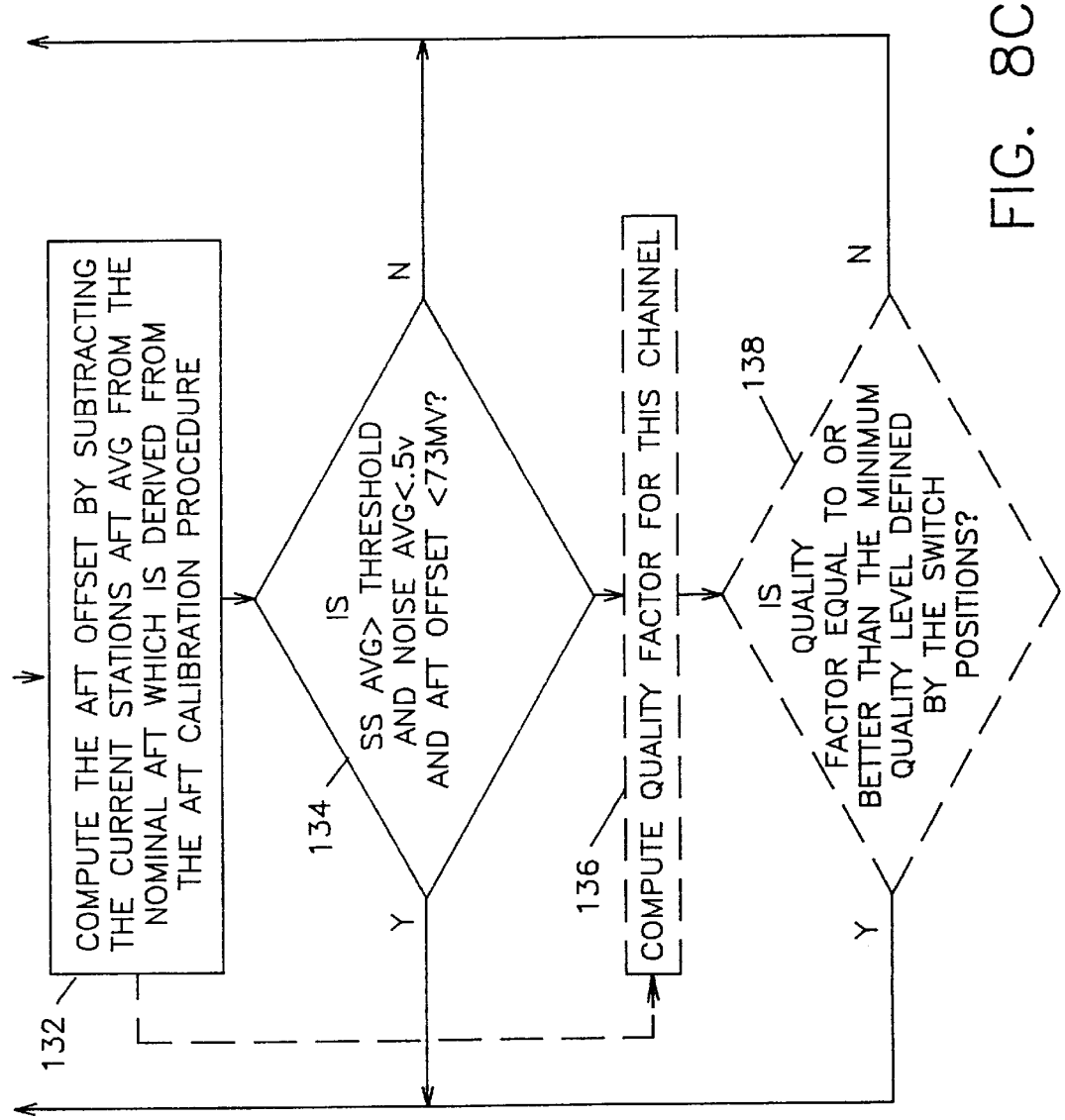

FIGS. 8A, 8B, and 8C illustrates the flowchart for the tuning of an FM receiver in which the very listenable and listenable channels are recorded in memory and displayed as shown at 44 of FIG. 1A. The FM band is scanned so as to update the display 44 upon request of the operator if such an update has not been done within a given time. Thus a step 122" differs from the steps 122 and 122" in FIGS. 6, and 7A, respectively, by indicating that a refresh scan button is included with the seek and scan tuning buttons. After finding a nominal or reference value of AFT in going from state 1 to state 2 in a manner such as illustrated in FIGS. 5A, 5B, and 5C it is determined via diamond decision step 156, whether a scan of the FM band has been made more than a given time previously. Thirty seconds is suggested, but other times could be used. If not, the next station in the existing tuning list is tuned in and its audio turned on (see step 158), so as to enter a state 3 in which the station is monitored as will be explained in connection with FIG. 9. If the allocated time has elapsed since the last scan, the procedure for identifying unlistenable, very listenable and listenable channels described in connection with FIGS. 7A, 7B, and 7C are carried out. Very listenable and listenable channels are recorded on a tuning display list and their SS and N values are recorded via step 160. If the QF is used (see step 136 and decision step 138), it is recorded. As in FIG. 7A, a diamond decision step 146 determines whether or not all the channels in the FM band have been analyzed. If not, the procedure loops back to step 88. If so, the display is updated via step 162, with the very listenable and listenable stations found in the most recent scan along with indications of their respective noise levels N and their quality factors, QF, if the latter are used.

It is then determined at a diamond decision step 140 whether a seek or scan tuning button has been activated. If so, the radio is tuned, step 166, to the next listenable or very listenable channel, in reference to the channel that was tuned in at the time of step 122", as determined in the updating procedure. As indicated by a state 3, this station is then monitored as will be described in connection with FIG. 9. However, if a display refresh button has been activated, the scanning process will have cycled the tuner back to the starting channel. Step 164 indicates that the tuning process stop at this point for continued listening at that channel. Implicit in this step is the unstated requirement to turn the audio back on.

Figure 9:
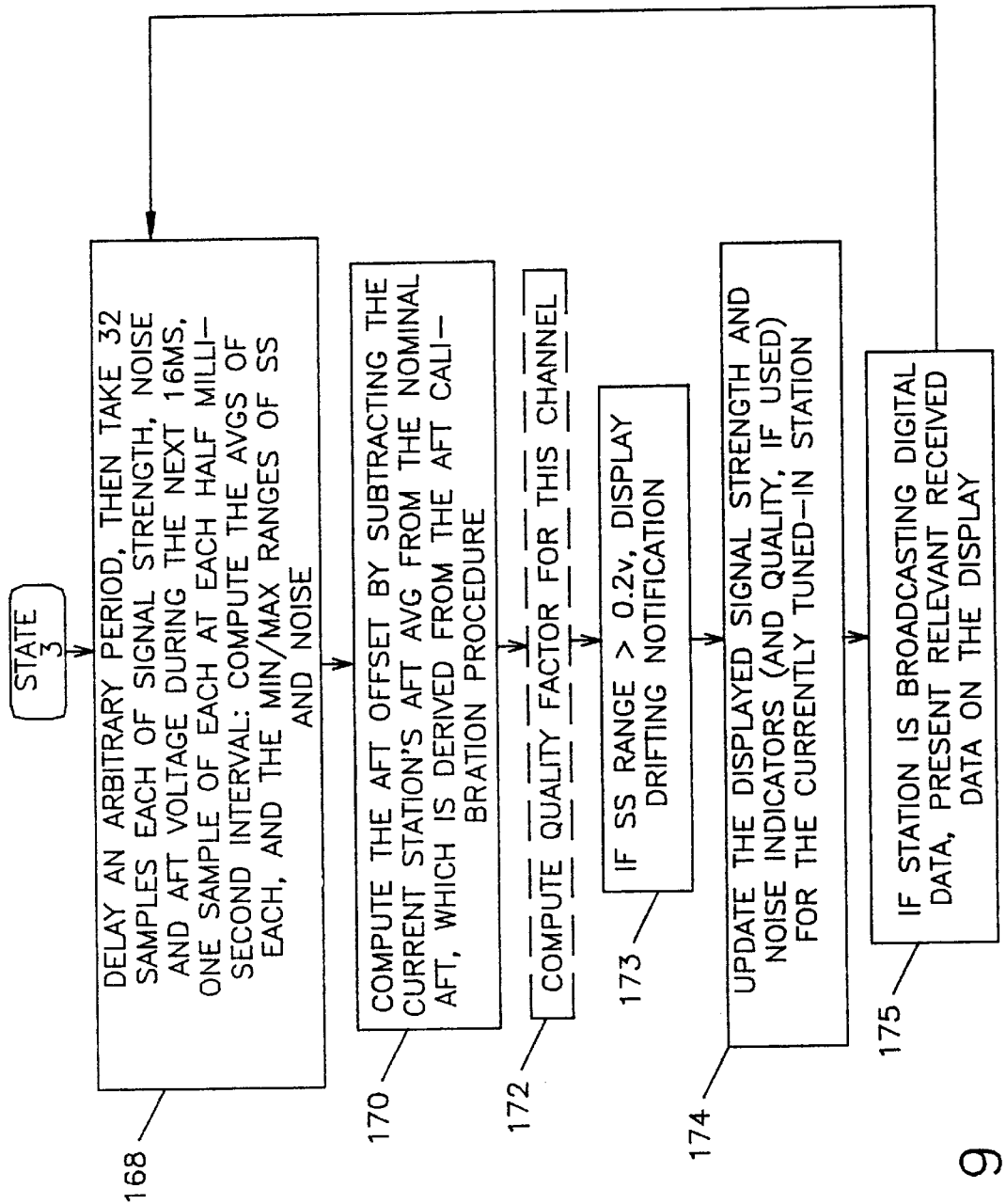
FIG. 9 is a flowchart illustrating the way in which the station tuned in by an FM receiver is monitored.

FIG. 9 is a flowchart for monitoring a tuned in channel in state 3. As noted in step 168, when a station is tuned in, samples are taken of SS, N and AFT and their averages as well as the ranges of SS and N are computed. The offset of the average AFT is also determined, via step 170, and, if desired a QF is computed, step 172. A determination is made if the station is drifting in step 173 by comparing the SS range to some predetermined value such as 0.2 v, and if so the display may be caused to indicate that fact such as by updating location 511 of FIG. 31 to display the word "Drifting". Updating of the display of SS and N and QF, if used, is performed in step 174. If a station is broadcasting digital data, relative data is presented on the display 44 via step 175. Next, the procedure loops back to step 168. Thus, a tuned in channel is repeatedly updated.

Figure 10A:
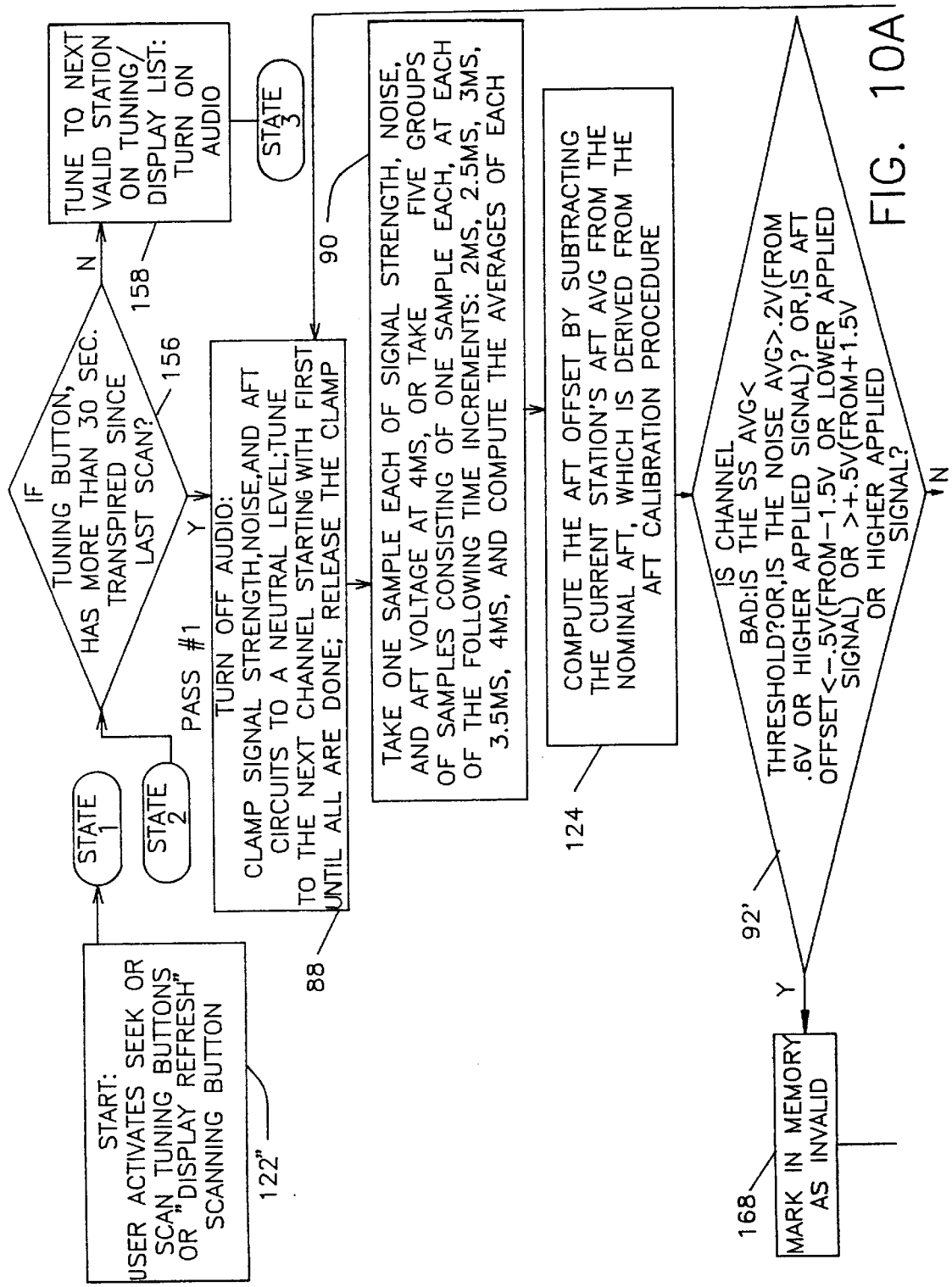
FIGS. 10A, 10B and 10C are a flowchart illustrating the dual pass operation of an FM receiver in accordance with this invention.
Figure 10B:
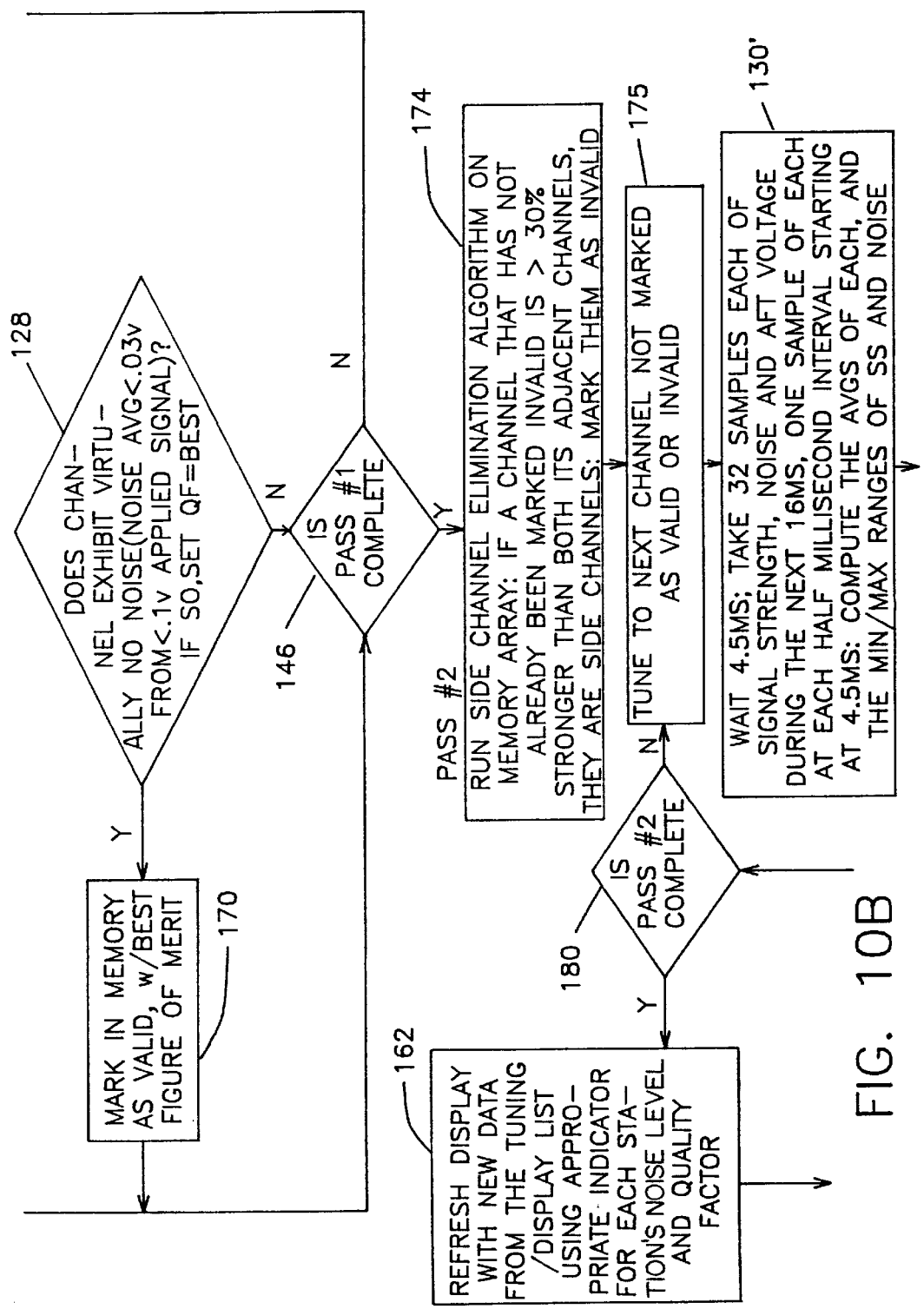
Figure 10C:
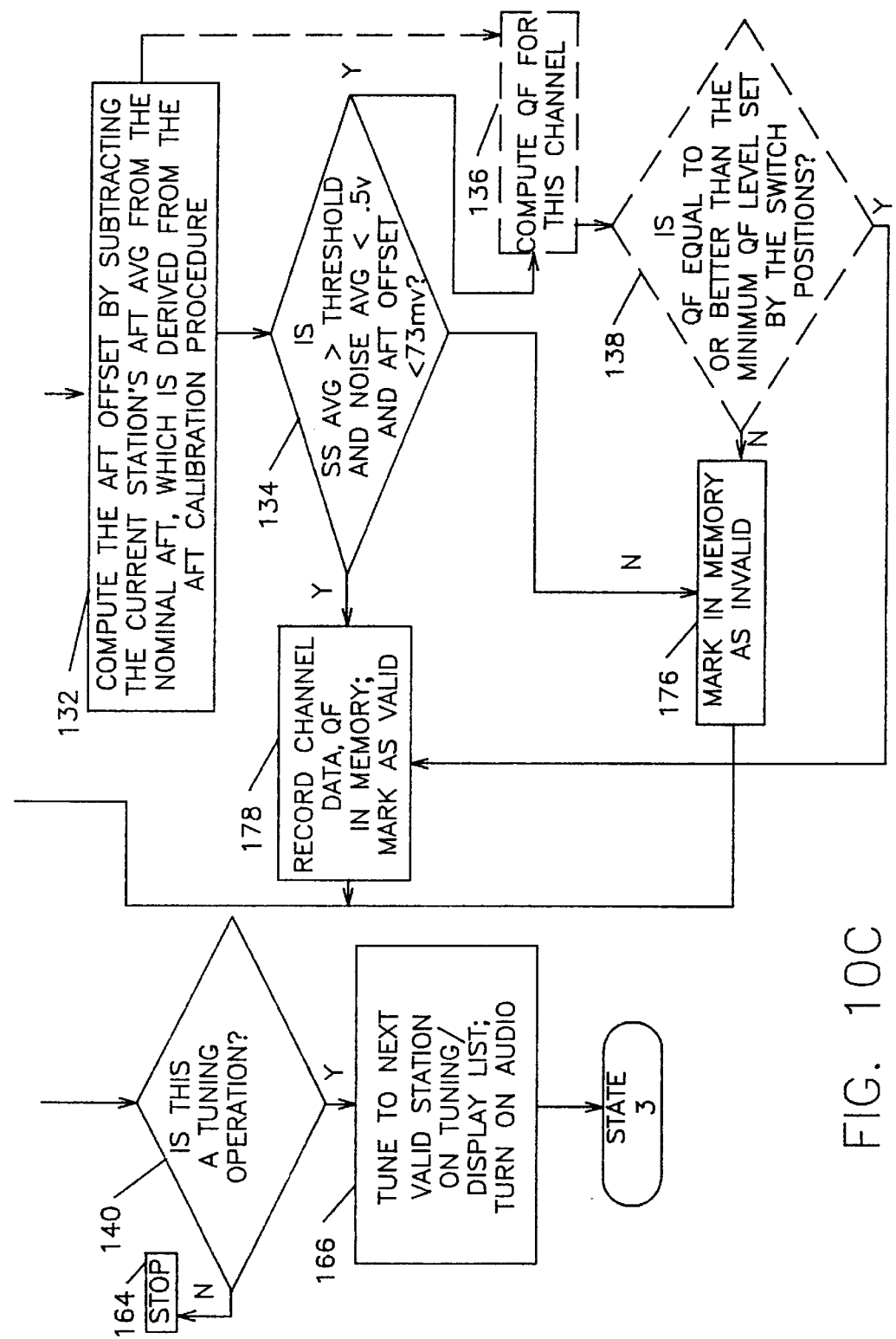

Reference is now made to the flowchart of FIGS. 10A, 10B, and 10C for a description of a dual pass method for tuning a single tuner FM radio having a display. During a first pass, the unlistenable and very listenable channels are identified in the same way as in FIGS. 8A, 8B, and 8C i.e., by the actions in steps 88, 90 and 124 and the decisions in the diamond decision steps 92' and 128. A diamond decision step 146 causes the procedure to loop back to the step 88 until all the channels of the FM band have been analyzed. Any unlistenable channels detected at the diamond decision step 92' are marked in memory via step 168. The very listenable channel detected in step 128 are assigned the best QF and are also marked in memory, in step 170. These stations are assigned the best QF because an insufficient number of samples have been taken, over an insufficiently long period of time, in order to accurately determine the station's AFT. However, since the station has passed the tests in steps 92' and 128, and therefore is known to exhibit virtually no noise, it is presumed to offer the best listenability and therefore is assigned the best QF. When diamond decision step 146 indicates that the first pass is complete, a second pass is entered.

Next, in a step 175 the radio is tuned to the next channel which has not been marked in memory as being listenable or unlistenable, and a second group of samples is taken of SS, N and AFT, their respective averages are computed and the ranges of SS and N are derived in step 130', which differs from step 130 by an initial wait state due to the fact that the channel was just tuned in. The offset of the average AFT with respect to the AFT determined in going from state 1 to state 2 by the procedure of FIGS. 5A, 5B, and 5C are calculated in step 132. The diamond decision step 134 then checks to see if the SS>a given threshold, its noise average is <0.5 v, and its AFT offset is <73 mv. An AFT offset of 73 mv is equivalent to an offset of 30 $\mu$Amps, or a frequency deviation of 4,800 Hz. It is to be understood that the voltages used are only examples. Any channel that fails to pass these tests is noted in memory as being invalid, via step 176, and SS and N levels for channels that pass the test are noted in memory, via step 178. If desired, a further sorting out of listenable channels can be effected by computing the QF in step 136 and checking in the diamond decision step 138 as to whether the QF exceed a selected value. If the last procedure is used, the QF's above the selected level are recorded via step 178. A diamond decision step 180 determines whether all channels not marked as invalid at step 168 or marked as valid at step 170 have been analyzed in the second pass. If not, the procedure loops back to step 130. If so, the display is refreshed with indications of listenable channels and their N and QF factors are indicated, via step 162. If the refresh scanning button has been actuated as determined by the diamond decision step 140, the procedure terminates, but if a seek or scan button has been activated, the next station on the tuning list is tuned in, its audio turned on and the tuning procedure enters the state 3, wherein the channel tuned in is monitored in accordance with FIG. 9.

Dual Tuner System

In a dual tuner system of another embodiment of the invention, a listening tuner provides the IF signals for the audio program of the channel that is tuned in and a scanner tuner periodically updates the tuning list and provides RDS information for display. In the block diagram of a dual tuner system shown in FIG. 11, an antenna 182 provides RF signals to a listening tuner 184 and to a scanner tuner 186. An IF amplifier 188, audio amplifier 190, and a loudspeaker 192 are coupled to the listening tuner 184. An IF amplifier 194 is coupled to the scanner tuner 186. Although not shown, the IF amplifiers 188, 194 include limiters and discriminators for deriving the audio signals. A controller 196 for the tuners 184 and 186 includes a CPU (central processing unit) 198, for controlling both a phase locked loop (PLL) 200 for tuning the listening tuner 184, and another phase locked loop 202 for tuning the scanner tuner 186. An analog-to-digital converter (ADC) 204, connected to the CPU 198, is coupled to receive the S, N and AFT voltages derived from the IF amplifier 188, and an ADC 206 that is connected to the CPU 198 is coupled to receive S, N and AFT voltages derived from the IF amplifier 194. RDS information, that may be transmitted along with the channel to which the listening tuner 184 is tuned, is coupled from the IF amplifier 188 to the CPU 198 via RDS means 208. RDS information, that may be transmitted in the channel to which the scanner tuner 186 is tuned, is coupled from the IF amplifier 194 to the CPU 198 via RDS means 210.

A display 212 is controlled by the CPU 198 for presenting both indications of the listenable and very listenable channels identified by the scanner tuner 186 at respective frequencies along the band, and indications as to certain information such as their SS and QF, and any pertinent RDS information.

The arrangement described in FIG. 11 is that of an FM receiver system, but the illustration is intended to convey the general case, and therefore also apply to an AM receiver system, or to a system incorporating both AM and FM receivers. In the AM case, boxes 184 and 188 together, as well as boxes 186 and 194 together, would generally be incorporated in the same physical device, such as a National Semiconductor LM1863 AM receiver system. RDS features are not generally considered for deployment on AM broadcasting systems, and so the RDS decoders 208 and 210 may be unnecessary. In the case of a combined AM and FM receiver, a single CPU 198 could connect to and control the associated PLL, ADC, and RDS subcomponents for both receiver systems, and all of these devices could be incorporated into a single controller as 196. In addition, both listening and scanner tuners 184 and 186 might be constructed into a single physical unit 185, and both listening and scanner IF stages 188 and 194 might be constructed into a single physical unit 189.

Figure 12:
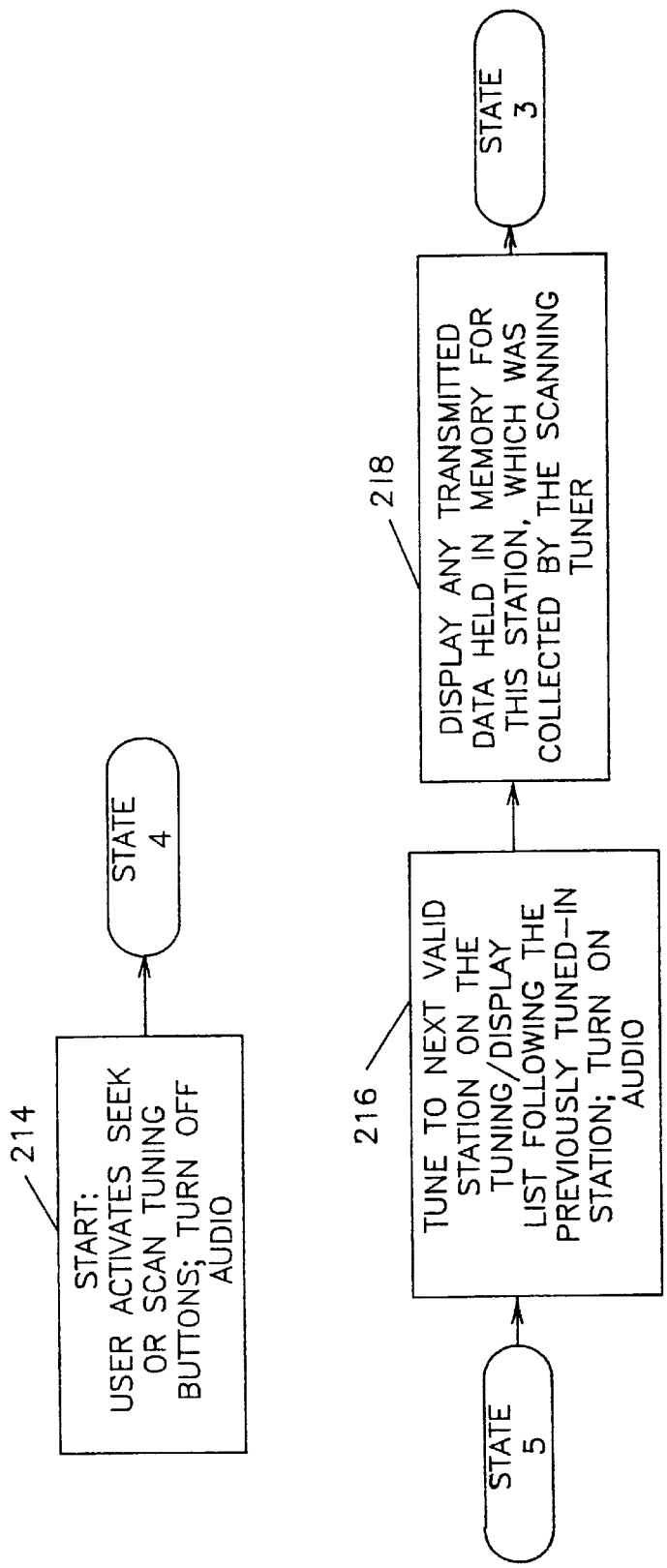
FIG. 12 is a flowchart of the operation of a listening tuner in a two tuner display system of this invention.

FIG. 12 is a flowchart of the operation of the listening tuner 184. Step 214 calls for activation of either a seek or scan tuning button. If either button is activated, the procedure goes from a state 4 to a state 5 so as to find a nominal or reference value for AFT in accordance with the procedure of FIGS. 13A and 13B, described below. In step 216 the listening tuner 184 is then tuned to the next station on the tuning list displayed on display 212, as a result of the last scan of the scanner tuner 186, and the audio is turned on. The operation of the scanner tuner 186 for identifying listenable stations will be explained by reference to FIGS. 15A, 15B, and 15C. Data held in memory for the channel which was provided by the scanner tuner 186 is presented, via step 218, on the display 212. Next, as in the case of FIGS. 8A, 8B, 8C, and 10A, 10B and 10C, a state 3 is entered wherein the channel tuned in on the listening tuner 184 is monitored as previously described in connection with FIG. 9.

Figure 13A:
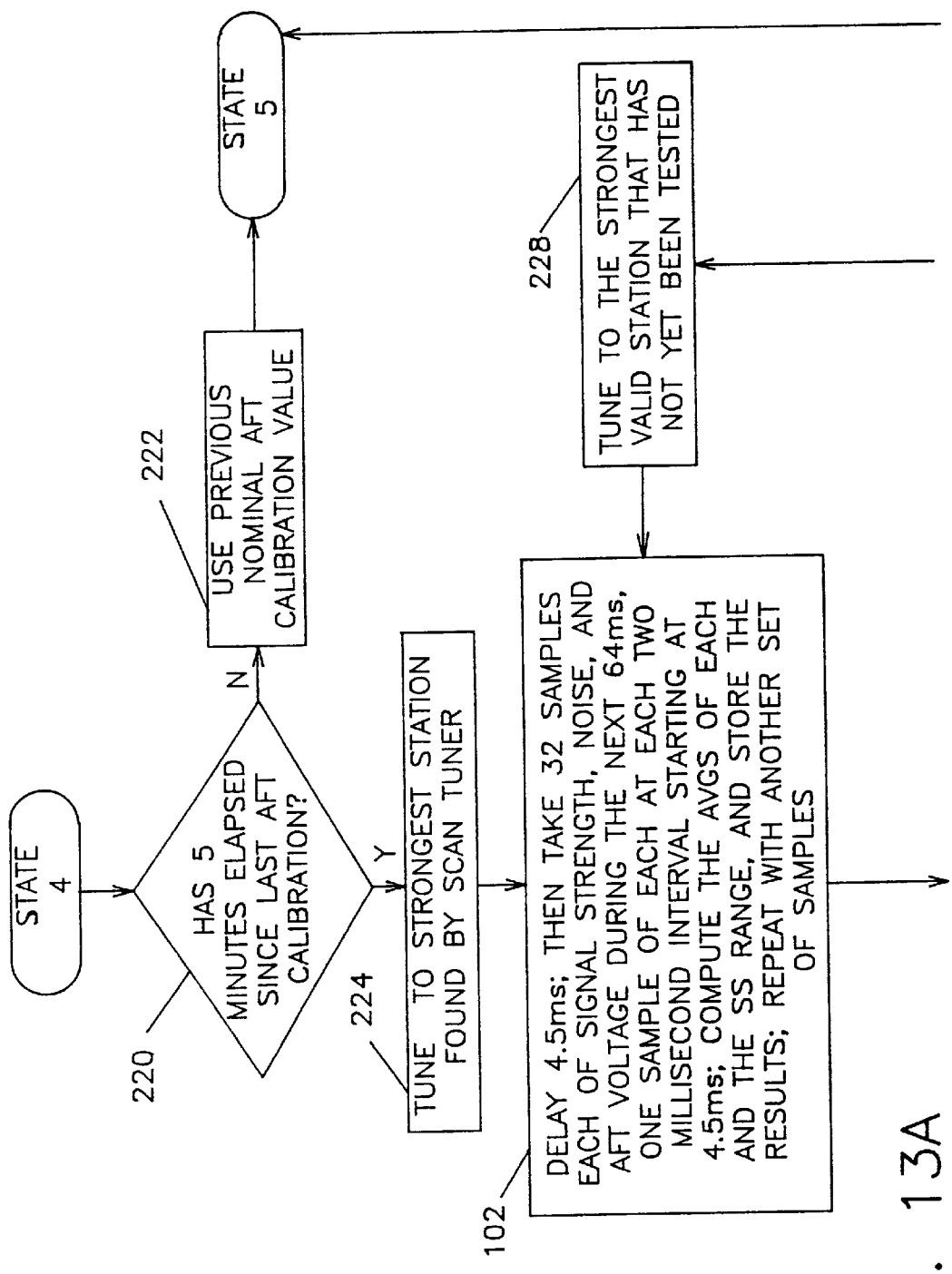
FIG. 13 is a flowchart for the calibration of a reference AFT by a listening tuner of a two tuner display system.
Figure 13B:
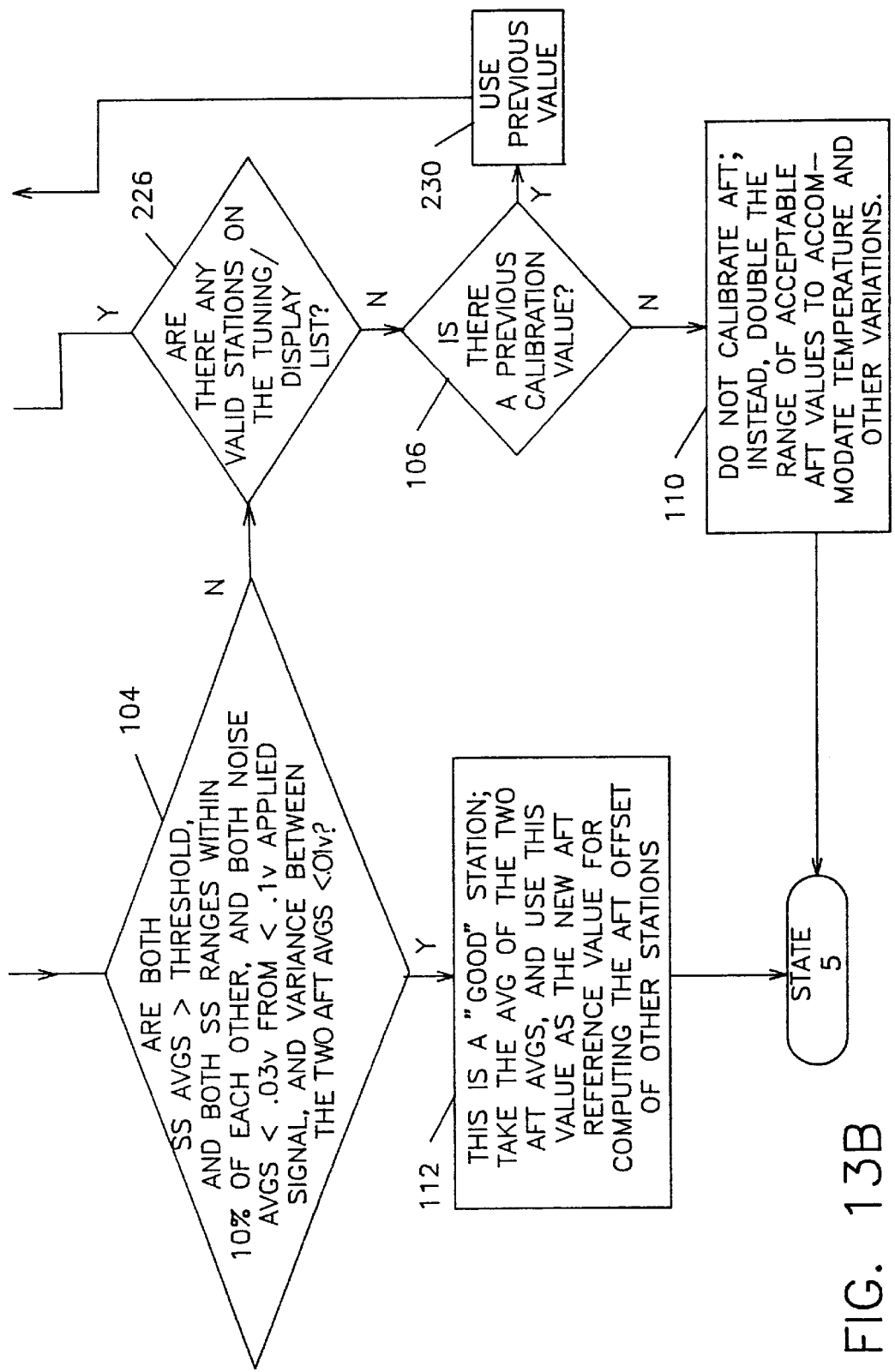

Reference is now made to FIGS. 13A and 13B for a description of the calibration procedure followed by the listening tuner 184 in going from the state 4 to the state 5 of FIG. 12 to find the nominal or reference value of AFT to be used in the monitoring operation in state 3. The purpose for calibrating AFT by the listening tuner 184 is so that the QF displayed for a station by the scanner tuner 186 is the same as that displayed by the listening tuner when the station is tuned in for listening. This is possible because although the tuners may have different absolute values of AFT, their AFT offsets for a given station will be the same, and AFT offset is predominant in the determination of QF that is performed in accordance with FIG. 9. Although, as will be explained in connection with FIG. 14, the scanner tuner 186 has already found a numerical value of AFT, this value may differ from the value found in FIGS. 13A and 13B since the respective components in each tuner section may differ slightly in value. At diamond decision step 220, a determination is made as to whether a predetermined amount of time, such as the suggested 5 minutes, has elapsed since the last AFT calibration of the listening tuner. If not, the previous nominal or reference value of AFT is used, step 222, so as to place the system in the state 5. If, however, more than the given time has elapsed since the last calibration, the listening tuner 184 is tuned, step 224, to the station on the tuning list developed by the scanner tuner 186 in a manner to be explained by FIGS. 15A, 15B, and 15C that has the greatest value of SS.

The following is a description by example of the procedure just described. Assume that the scanner tuner is precisely aligned for AFT such that when AFT is calibrated on a very listenable station it measures zero current and zero volts. Next, assume that the listener tuner is misaligned for AFT such that when AFT is calibrated on the same very listenable station it measures +50 $\mu$Amps and, therefore +135 mV. In each tuner, the measured AFT values become the Nominal AFT for computing the AFT Offset of other stations. Now assume that both tuners will tune to a poor station such that when the scanner tuner tunes it in its AFT measures +10 $\mu$Amps. The AFT Offset for this station for the scanner tuner will be +10 $\mu$Amps–0 $\mu$Amps, and so will be the absolute value of 10 $\mu$Amps. When the listening tuner is tuned to this same station the AFT will measure +60 $\mu$Amps, and +60 $\mu$Amps–+50 $\mu$Amps equals an absolute value Offset of 10 $\mu$Amps. This is because in each case what is really being measured is the difference in transmission quality between two radio signals, and no matter which tuner does the measuring, the difference between the two signals will always be the same.

At this point, the procedure is like that of the last portion of the initialization procedure of FIGS. 2A and 2B in which, after a brief delay, such as 4.5 ms, two successive groups of samples of S, N and AFT are taken and the respective averages for each group computed (see step 102). Also computed is the range of the values of SS for each group. In diamond decision step 104, a determination is made of whether the SS averages of both groups of samples are greater than a given threshold, the ranges of SS for the two groups are within some percentage like the suggested 10% of each other, and both averages of N are within a given limit. The limit suggested is less than 0.03 v when the 5 TC (time constant) limit is 0.1 v as explained in connection with FIG. 4. Diamond decision step 104 also determines whether the variance between the AFT averages for the two groups is less than a given voltage such as the suggested 0.01 v, equivalent to approximately 3 $\mu$Amps or a frequency deviation of 480 Hz.

Figure 15A:
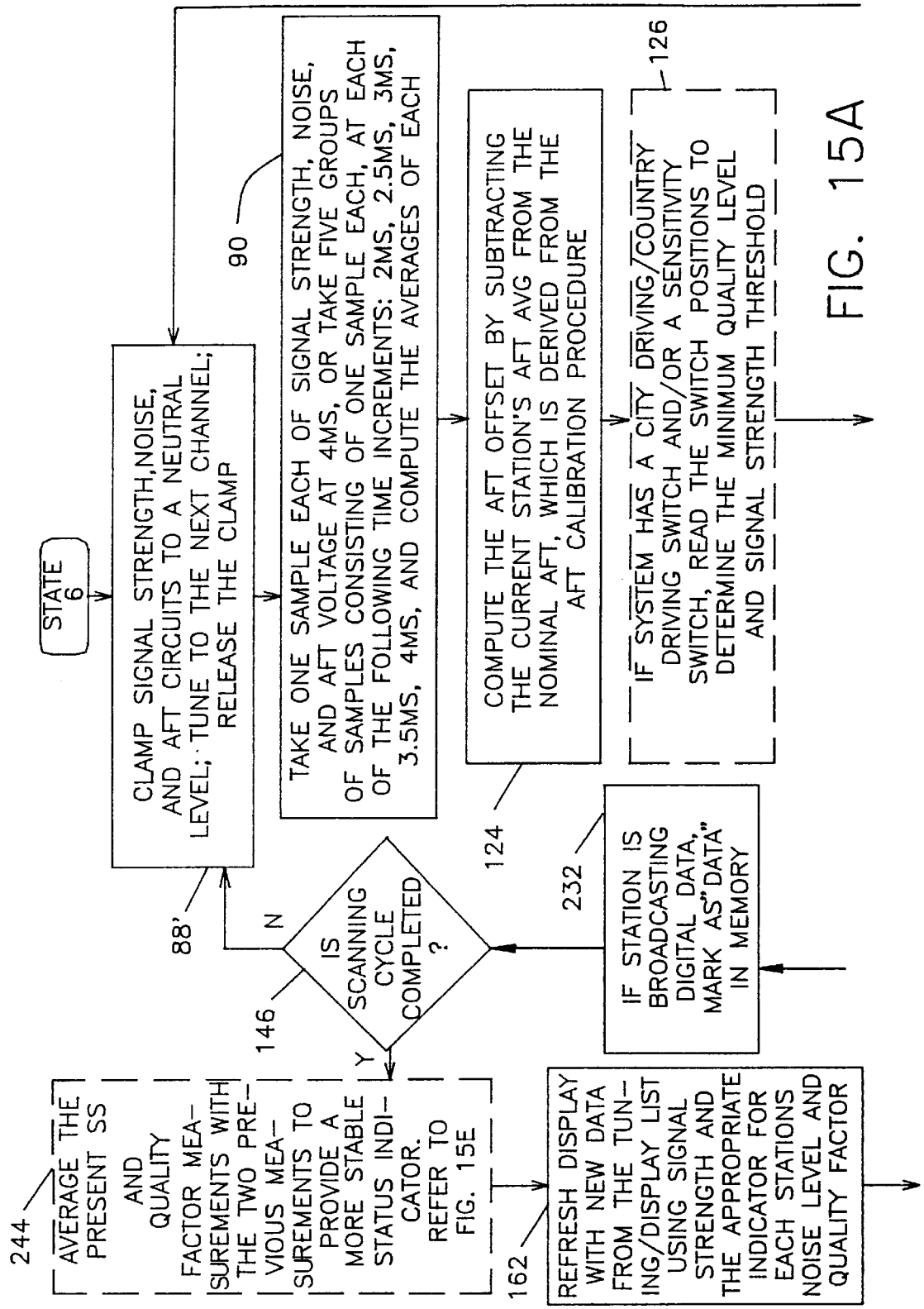
FIGS. 15A, 15B and 15C are a flowchart of the operation of a scanning tuner in a two tuner display system of this invention.
Figure 15B:
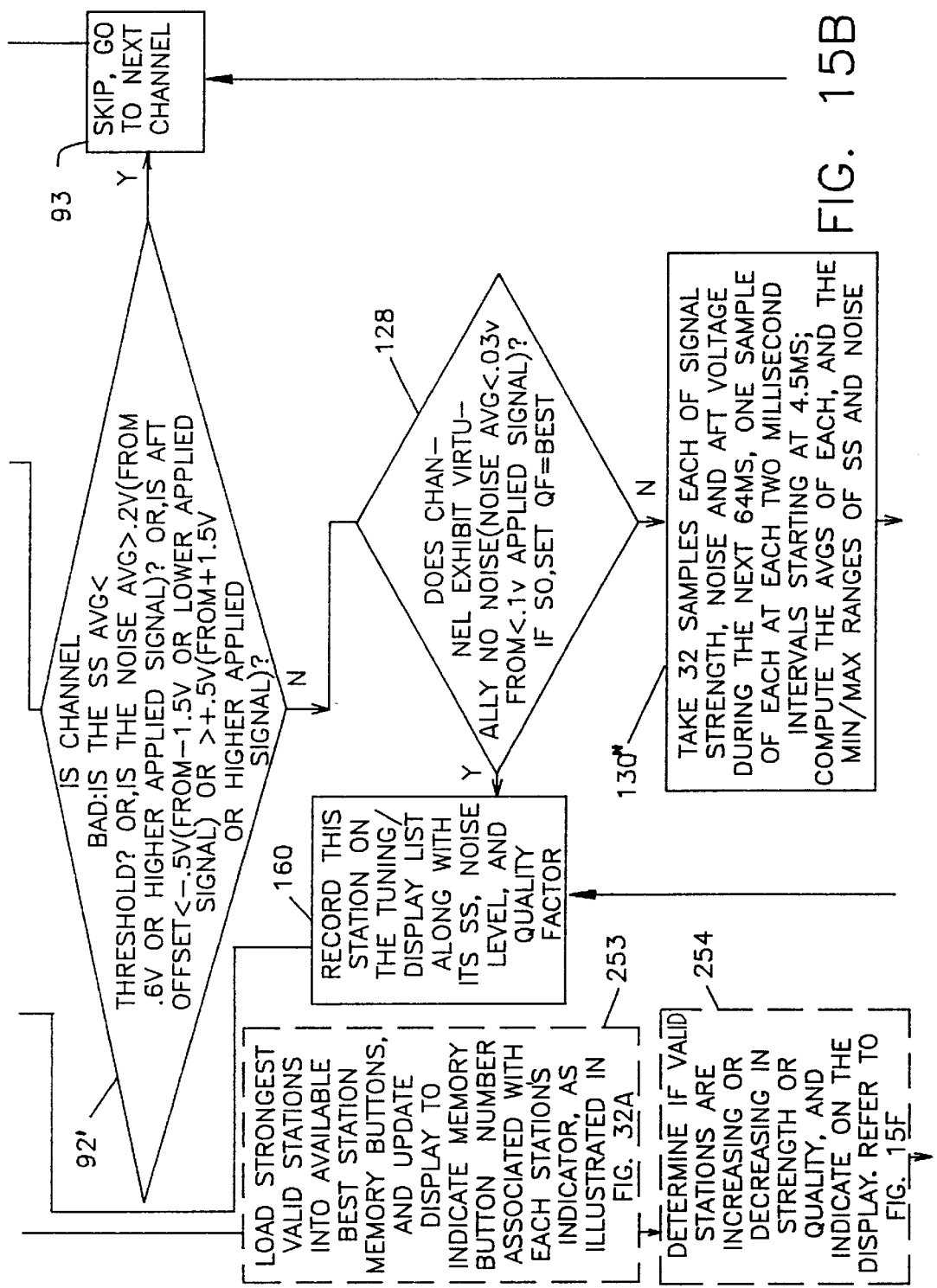
Figure 15C:
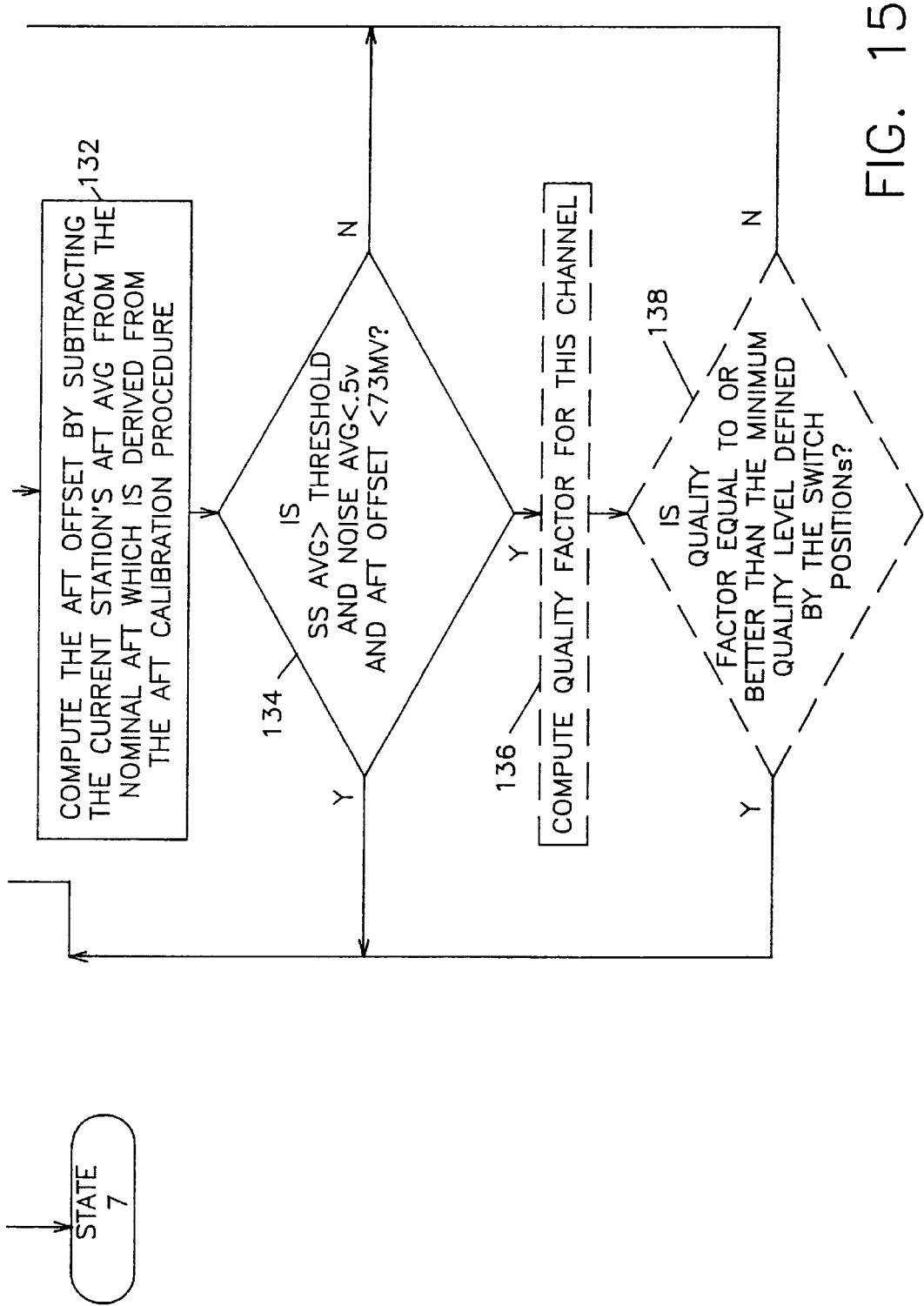

When the step 104 indicates that the strongest station has not met the criteria stated therein, it is determined at a diamond decision step 226 whether there are any listenable stations that have passed the criteria in step 104. If so, the next strongest station is tuned in, via step 228, and it is processed as indicated in step 102 and in decision step 104. If there is no other listenable station on the tuning list, it is determined in step 106 whether there is a previous nominal or reference value of AFT. If so, it is used in step 230. If not, the AFT is not calibrated, and the range of acceptable AFT values to be used in a manner to be explained in the flowchart of FIGS. 15A, 15B, and 15C is increased in step 110; in this example the values are doubled. Thus, at the state 5 there is either a nominal value of AFT to be used or the acceptable ranges of AFT are increased.

Figure 14:
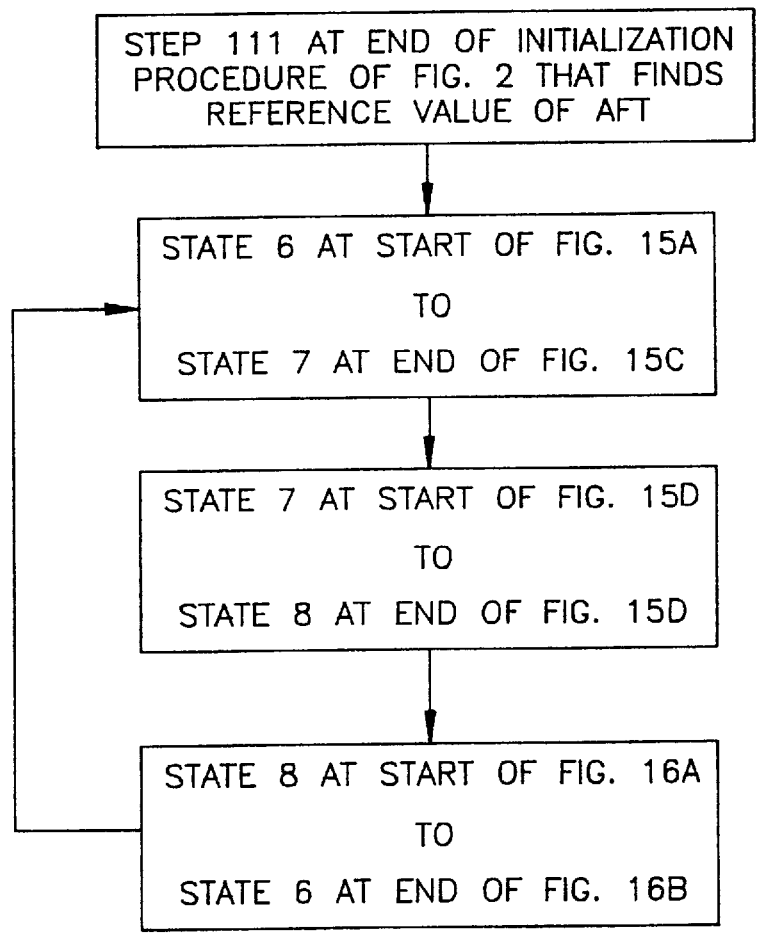
FIG. 14 illustrates the sequence of the various flowcharts used by a scanning tuner.
Figure 15D:
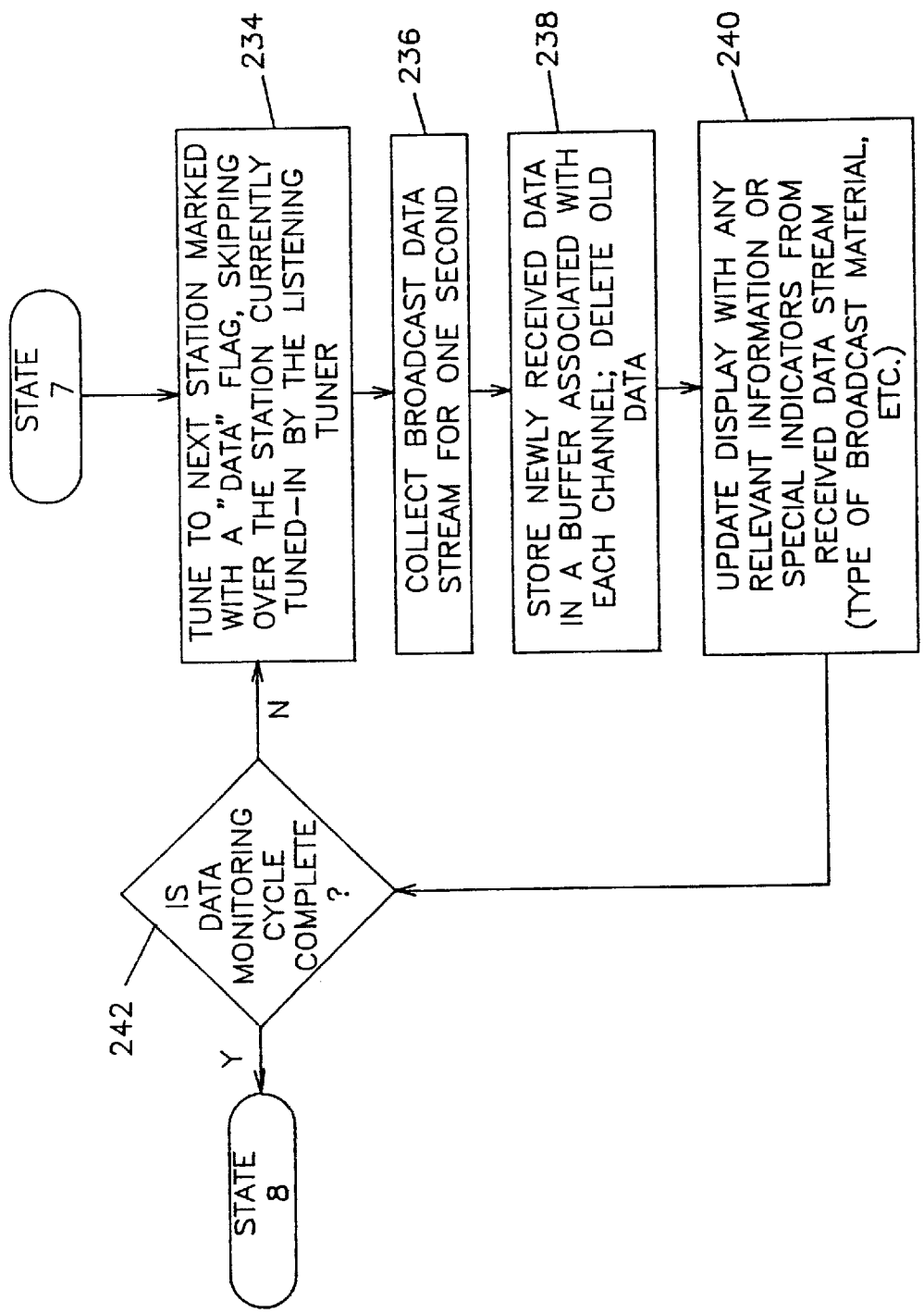
FIG. 15D is a flowchart of the data monitoring cycle of the scanning tuner of a two tuner display system.

Reference is made to FIG. 14 depicting the overall operation of the scanning tuner 186. After a reference value of AFT is determined by the initialization procedure at step 111 of FIGS. 2A and 2B, the process enters state 6 of FIGS. 15A, 15B, and 15C in which the band of channels is scanned in a manner to be described to select and display listenable channels and certain data relating to their quality. At the end of FIGS. 15A, 15B, and 15C, the process goes to a state 7 at the beginning of FIG. 15B that monitors listenable stations in a manner to be described for digital data that might be broadcast if such is desired. From the end of FIG. 15A, the process enters a state 8 of FIGS. 16A and 16B to find in a manner to be described a reference value of AFT. At the end of FIGS. 16A and 16B the process loops back to the state 6 at the beginning of FIGS. 15A, 15B, and 15C. There may be an optional delay of arbitrary duration before the state 6 of FIGS. 15A, 15B, and 15C is re-entered. FIG. 15D is omitted if digital data broadcast by the stations is not desired.

Reference is made to the flowchart of FIGS. 15A, 15B, and 15C showing the scanning cycle of operation of the scanner tuner 186. Optional but desirable features of the invention are shown in phantom diamond step 138, and phantom block steps 126, 136, 244, 253, and 254. The steps of FIGS. 15A, 15B, and 15C are similar to those in the flowchart of FIGS. 8A, 8B, and 8C and are identified by the same numerals. Nevertheless, a brief summary is presented here for convenience. The S, N and AFT capacitors 24, 26, and 28, are respectively clamped to reference voltages as previously described, and clamps are released in step 88', which differs from step 88 in that, since this is a scanner tuner, not a listening tuner, its audio output would normally not be connected, and so 88' omits the action item of "Turn off audio". A first group of samples is taken of S, N and AFT voltages and the respective averages attained in step 90. The AFT offset is computed in step 124. If used, step 126 adjusts the minimum SS and QF in accordance with the position of a city driving/country driving switch if present. The value of SS, N and AFT derived from the first group of samples taken in step 90 are subjected to certain loose criteria in step 92'. If the channel does not pass the criteria, in step 93 the next channel is tuned in, and the procedure loops back to step 88.

If a channel meets the criteria of the decision step 92' and is found at decision step 128 to have virtually no noise, it is accepted as very listenable and stored via step 160 in memory along with its values of SS, N and QF. This leaves channels of questionable listenability. Some may be listenable and some not. Those that are listenable are sorted out in step 130" by taking a second group of samples, determining the averages, and determining the ranges of SS and N samples. Step 130" differs from step 130 in that, since this is a scanner tuner and the duration of a scan is somewhat irrelevant, step 130" collects samples over a 64 ms period rather than a 16 ms period. In step 132 the offset of the average AFT is determined, followed by decision step 134, in which these values of SS, N and AFT offset are compared with criteria indicated. If any criteria are not met, step 93 initiates the next channel being tuned in, via repeating the previously described procedure starting at step 88. If a channel meets all of the criteria of decision step 134, the station is recorded via step 160 in the tuning display list along with the SS and N values. If the QF is calculated via step 136, it is compared with the QF determined by position of the city driving/country driving switch in decision step 138. If the QF is below that selected, step 93 is addressed, but if it is acceptable, step 160 is addressed.

One difference with the flowchart of FIGS. 8A, 8B, and 8C compared to that of FIGS. 15A, 15B, and 15C is that in step 232 of FIG. 15A an indication is made in memory as to whether any station that has been found to be very listenable or listenable is transmitting data in addition to the audio signal. Next, decision step 146 determines whether all channels of the band have been analyzed. If not, a loopback is made to step 88. Ignoring for the moment the phantom steps, in step 162 the display 212 is refreshed with any new listenable channels, and formerly listenable channels that are now unlistenable are deleted. In addition, in step 162 appropriate indicators for SS, N, and QF are produced for each listenable and very listenable channel.

The scanner tuner 186 is now in state 7 and ready for the data monitoring cycle shown in the flowchart of FIG. 15B. The next station marked with a data flag in step 232 is tuned in via step 234. The action is independent of the channel to which the listening tuner is tuned so that any channel could be selected. The broadcast data from this station is collected in step 236, and data for each channel is stored in a display buffer for that channel via step 238. Old data is deleted. In step 240, the display 212 is updated with any relevant information or special indicators from the channel tuned in. This information could indicate the type of material being broadcast. Decision step 242 checks to see if all channels have been examined. If not, step 234 is readdressed, but if so, the system loops to the state 8.

Figure 15E:
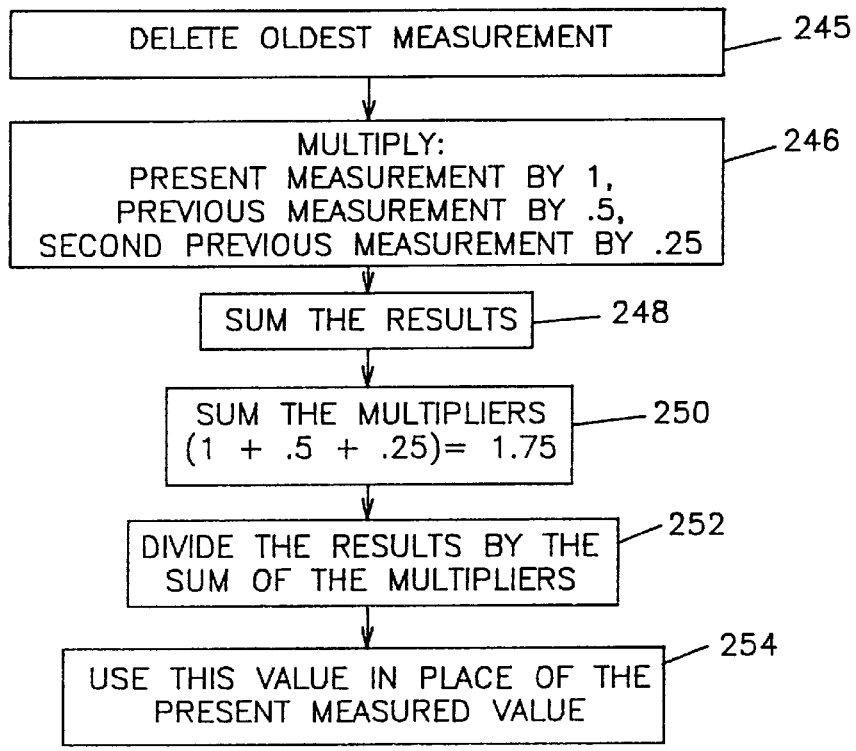
FIG. 15E is a flowchart for the averaging of the SS and QF in FIG. 15 to compensate for momentary signal variations.

Additional embodiments of the invention described in the phantom blocks 126, 136, 244, 253, 254, and diamond decision step 138 of FIGS. 15A, 15B, and 15C will now be discussed in greater detail. The first of these is step 244 in which an average of the current QF and SS with values obtained during previous cycles is attained in order to present more stable values in the display 212. There are, of course, many ways for deriving a weighted average, but the one illustrated in FIG. 15E has been found to be useful. First, all but the current and two previous values of SS and QF are deleted in step 245. Next, in step 246 the current measurement is multiplied by 1.00, the first previous measurement by 0.5, and the second previous measurement by 0.25. The products are summed in step 248, and the multipliers are summed in step 250, to produce 1.75. In step 252, the sum of the products is divided by the sum of the multipliers, and the more stable value is shown in the display 212 via step 254. A similar mathematical process could be applied to obtain a weighted average for any number of measurements instead of just the three measurements indicated in step 244. As noted, this averaging can be used for both SS and QF, as well as N or AFT.

Figure 32A:
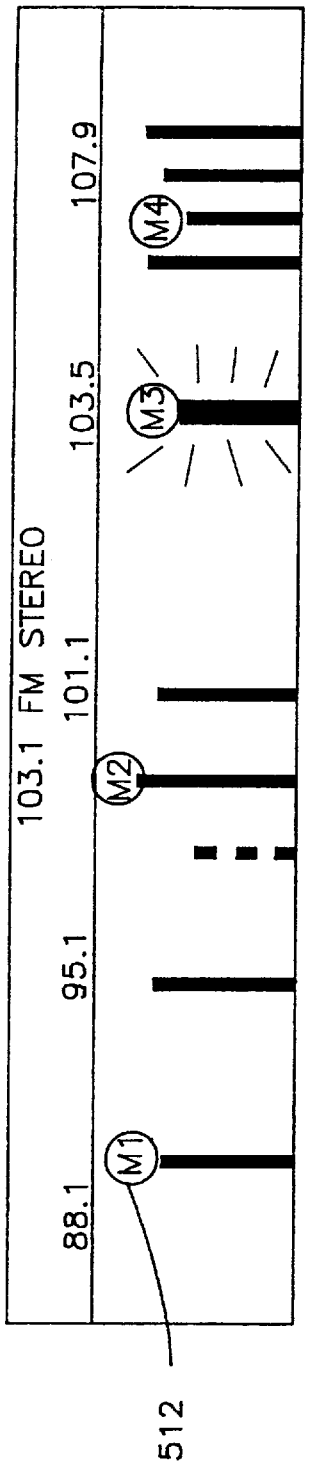
FIG. 32A illustrates a display showing the listenable station with the numbers of the buttons for the four strongest stations shown at the locations for the respective station.

In step 253 of FIG. 15B, the strongest of the stations recorded at the step 160 are loaded into memory locations associated with best station memory buttons if provided, and the display 212 is updated so as to indicate the memory button number associated with each station's indicator in the display illustrated in FIG. 32A.

Figure 15F:
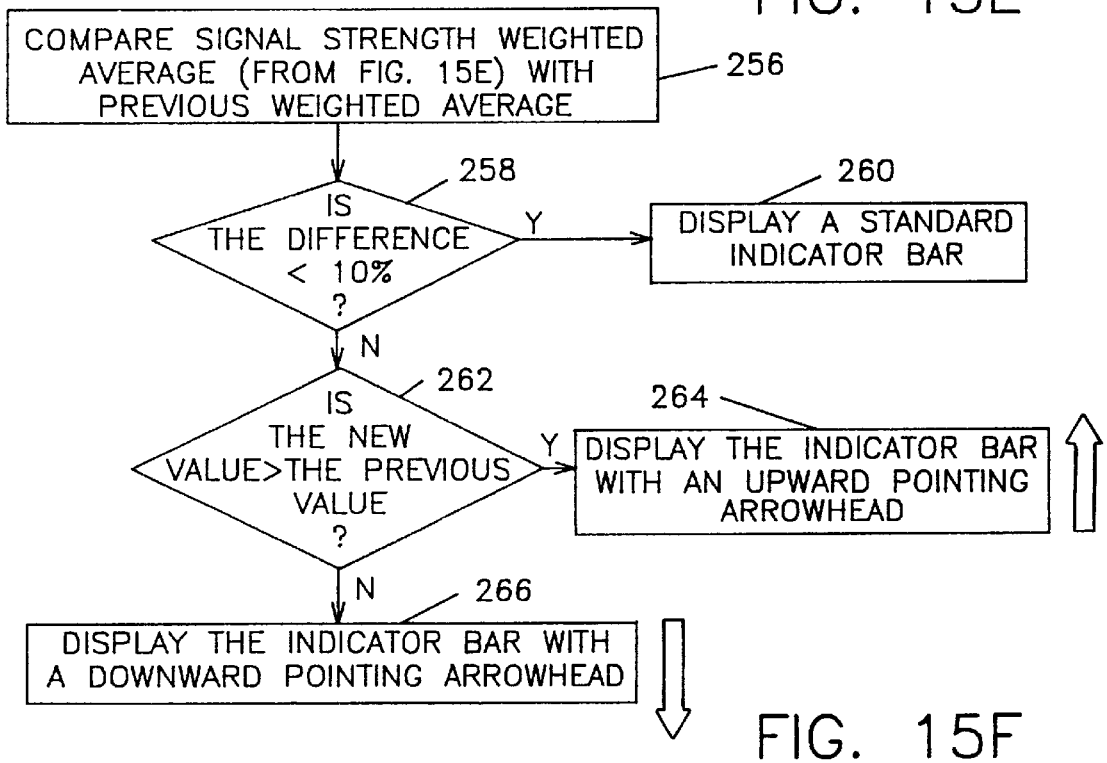
FIG. 15F is a flowchart for determining whether signal strength of a station is increasing or decreasing.
Figure 32B:
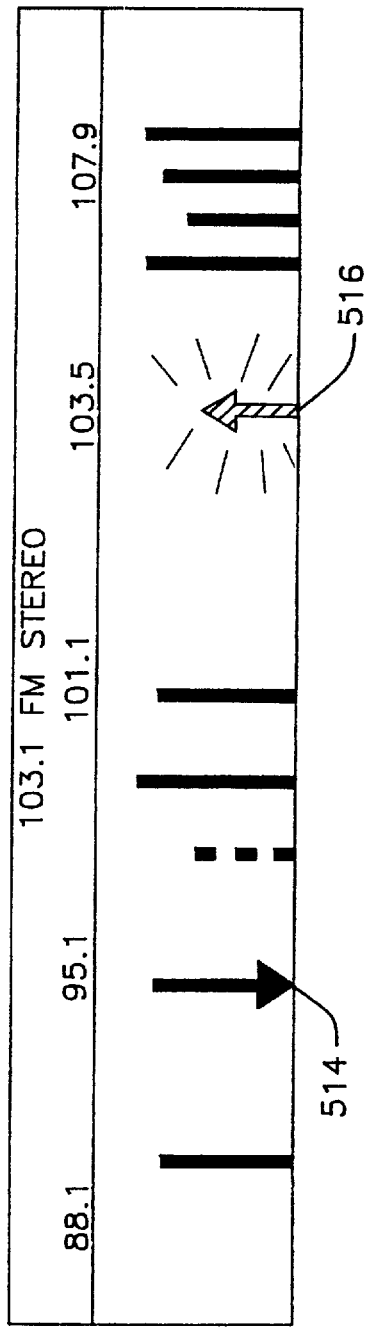
FIG. 32B illustrates a display similar to FIG. 32A with indicator bars as upward or downward pointing arrows to indicate stations increasing or decreasing in strength.

A phantom block 254 in FIG. 15B suggests that indications be made on the display 212 as to whether a channel indicated as listenable is increasing or decreasing in SS and for QF, as illustrated in FIG. 32B. FIG. 15F is a flowchart of an embodiment of the invention indicating one way in which this may be accomplished. The weighted average of SS or QF determined in FIG. 15E for the current scan of the FM band is compared with the respective weighted average for the next previous scan of the FM band via step 256. At decision step 258 it is determined whether a difference is less than some given percentage, therein shown as being 10%, for example. If so, step 260 provides for displaying a standard station indicator bar. If not, decision step 262 determines if the later average value is greater than the previous average value. If it is, step 264 causes an upward pointing arrow to be displayed. If it is not, step 266 causes a downward pointing arrow to be displayed as illustrated by station indicators 517 in FIG. 32B.

Figure 16A:
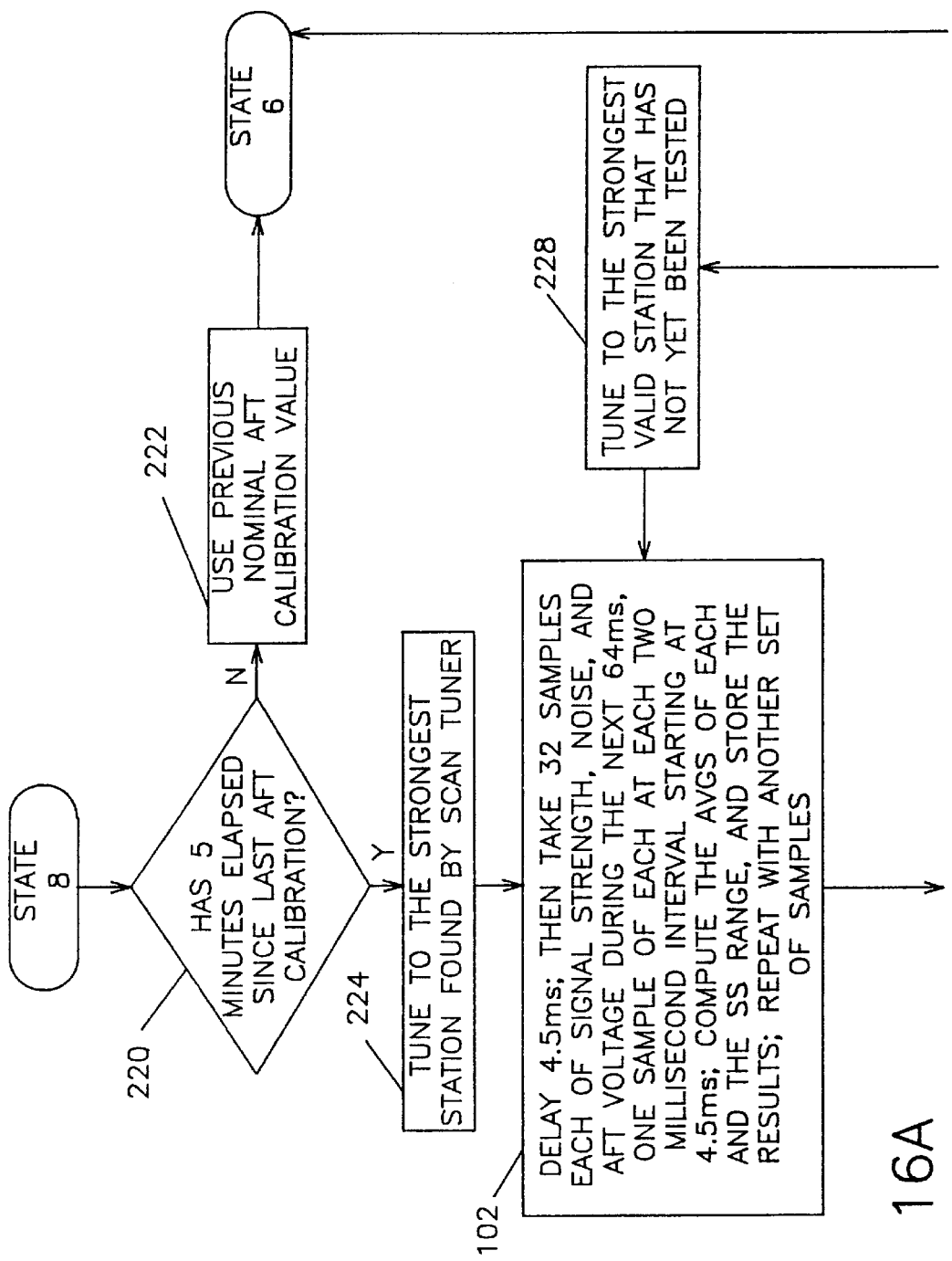
FIGS. 16A and 16B are a flowchart for the calibration of a reference AFT in the scanning tuner of a two tuner display system.
Figure 16B:
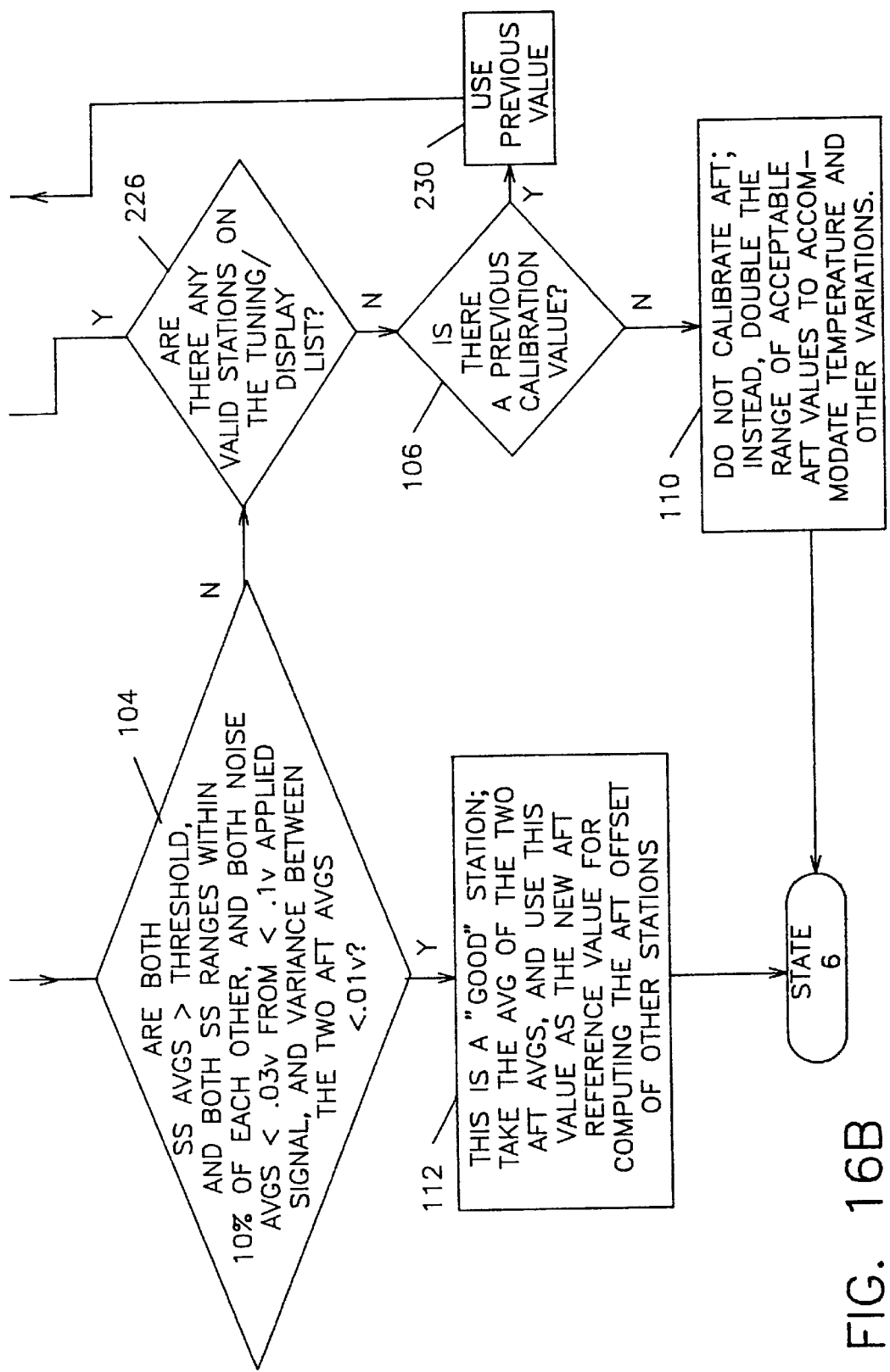

During a first scan of the band of channels in accordance with FIGS. 15A, 15B, and 15C a reference value of AFT is determined by the initialization procedure of FIGS. 2A and 2B in making its decisions as to the listenability of each channel, but after the procedure of FIGS. 15A, 15B, and 15C or of FIG. 15D, if the latter is used, the procedure of FIGS. 16A, and 16B is used to update the reference value of AFT to be used in the next scan of the band of channels. FIGS. 16A, and 16B is state 8 and terminates by returning to state 6 (FIGS. 15A, 15B, and 15C) and is substantially the same as the procedure for finding a reference value of AFT in the listening tuner as set forth in FIGS. 13A and 13B. In FIGS. 13A and 13B, there is, as indicated by the step 115, no calibration of AFT, if no valid station is found in the loop of steps 102, 104, 226 and 228 and if there is no previous calibrated value as indicated in the step 106. If this occurs in FIGS. 16A and 16B, however, the range of acceptable AFT values used is increased, step 231, in order to accommodate variations in temperature and other factors.

Alternative Way to Find Reference AFT

Figures 17, 18:
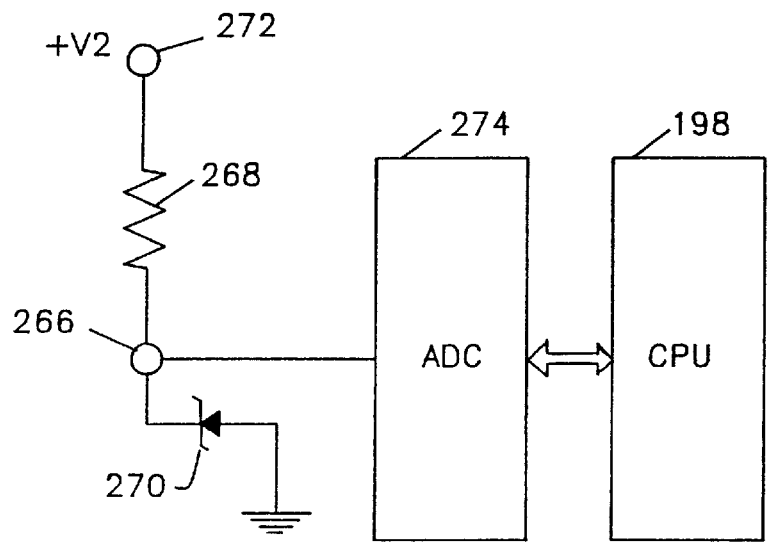
FIG. 17 is a schematic diagram of a circuit for sensing temperature.
FIG. 18 is a table of values to be used in connection with FIG. 19.
Figure 19A:
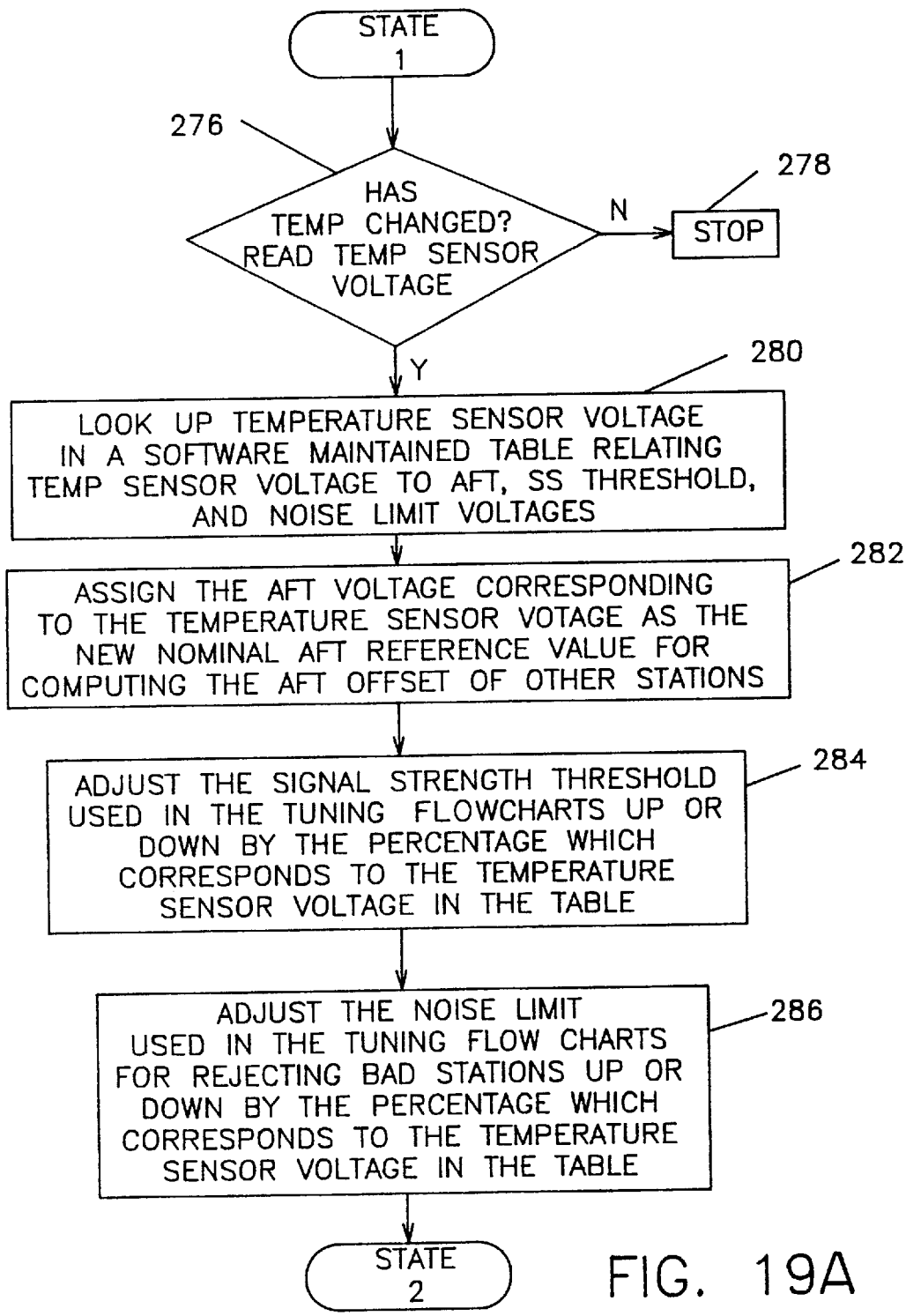
FIGS. 19A and 19B are respective flowcharts for calibrating a reference AFT, the SS threshold, and the N rejection limit in response to temperature.
Figure 19B:
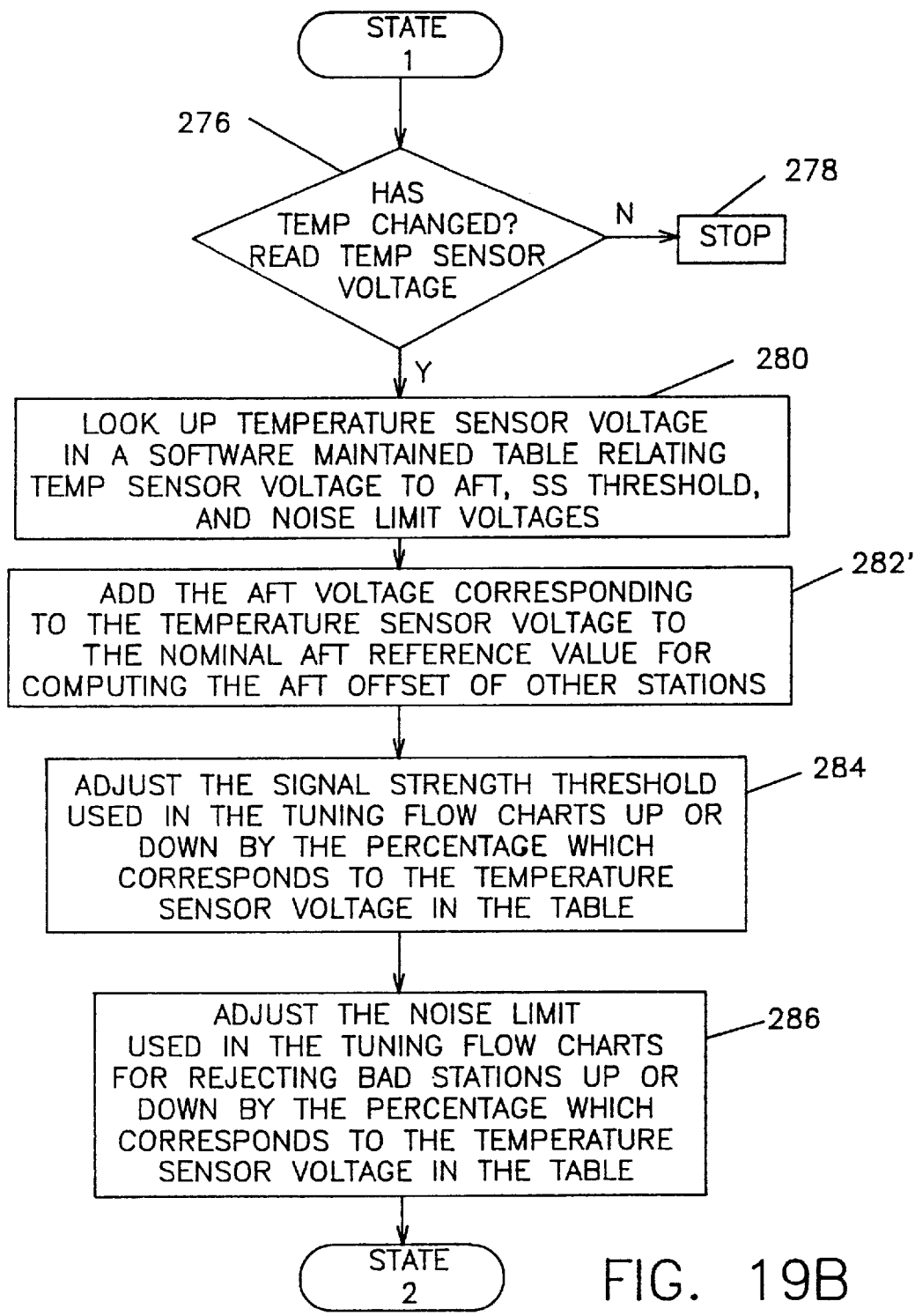
Figure 20:
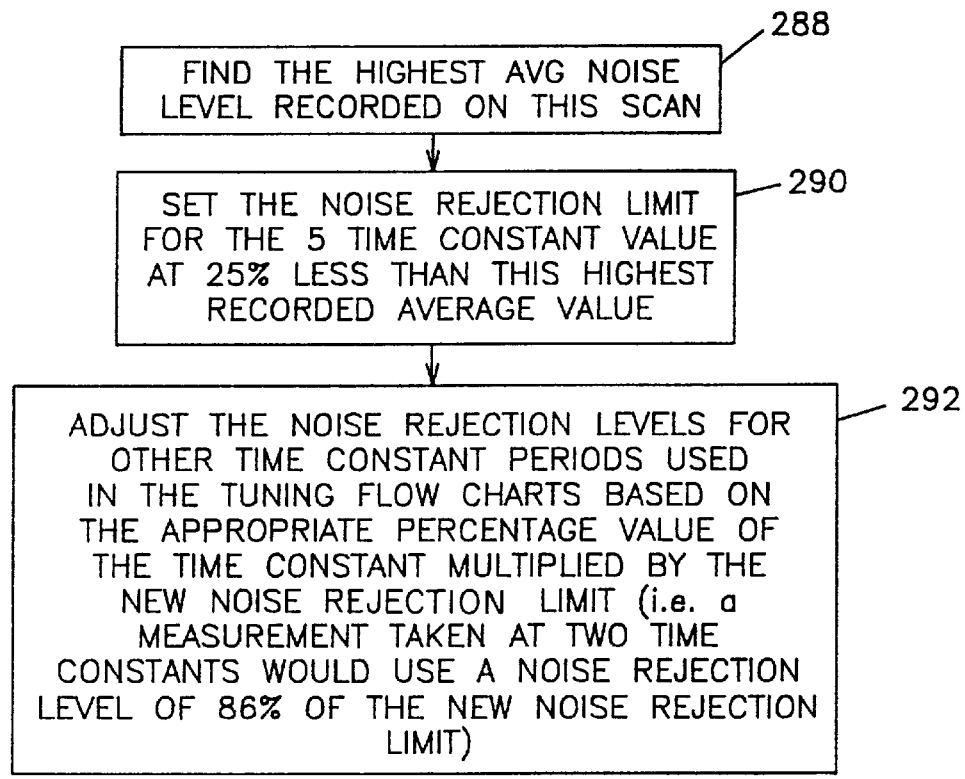
FIG. 20 is a flowchart for the calibration of a noise rejection limit based on the noisiest channel.

Reference is made to FIGS. 17, 18, 19A, and 19B for an explanation of a way of determining the nominal or reference value of AFT in going from state 1 to state 2 in FIGS. 6–8A and 10A, 10B and 10C as well as variations in the SS threshold and N limit on the basis of ambient temperature rather than using the AFT voltage of a very listenable station. Another approach would be to combine the AFT ambient temperature adjustment along with the calibration of AFT on a very listenable station, by the simple combination of the procedures outlined in this application, as illustrated in FIG. 19B. In addition, the threshold for SS and/or the rejection limit of N may also be varied in accordance with temperature. In the circuit of FIG. 17, the ambient temperature is determined by the voltage at the junction 266 of a resistor 268 and a temperature sensor 270, which may be an LM135, that are connected in series in the order named between a point 272 of regulated DC. voltage $+V_2=9$ v and ground. An ADC 274 converts this voltage to a digital value, and the CPU 198 of FIG. 11 provides the value of AFT voltage to be used from the illustrative look-up table of FIG. 18. The percentage variation in the SS threshold and the limit of N can also be provided in the same way.

The procedure for making these determinations is set forth in the flowchart of FIG. 19A. At a decision step 276 a determination is made as to whether there has been more than a given change, such as the suggested 0.05 v, at the junction 266 since the last reading. If not, the procedure terminates via step 278, but if so, in step 280 the temperature sensor voltage at the junction 266 is looked up in a stored table illustrated in FIG. 18 to find the value of AFT voltage and the percent change in the SS threshold or the N limit that should be used. In step 282, the AFT voltage is assigned as the value to be used in deriving the AFT offsets. In an alternative system that incorporated both ambient temperature and very listenable station methods for determining AFT, step 282 of FIG. 19A would instead describe a procedure for adjusting the Nominal AFT derived from a station by an amount specified in a table similar to FIG. 18. This alternative procedure is identified in step 282' in FIG. 19B, which is otherwise the same as FIG. 19A. If desired, step 284 provides for deriving the SS threshold from the table of FIG. 18, for use in the various flowcharts. If it is also desired to adjust the N limit used in the flowcharts, this is done in accordance with step 286 and the table of FIG. 18.

Adjustment of Noise Limit

Instead of using a manufacturer's suggested noise limit or the limit determined from temperature in the manner just described, the limit may be calculated in accordance with an aspect of this invention on the basis of the noisiest channel. If implemented at the points in the procedures of FIGS. 2A, 2B, and 5A, 5B and 5C indicated by a step 98 shown in dashed lines, noise voltage found can be substituted for the 0.1 volt in the subsequent step 104 so as to raise or lower the noise limit curve of FIG. 4. Although the step 98 is not shown in FIGS. 6, 7A, 7B, 7C, 7D, 8A, 8B, 8C, 10A, 10B and 10C, it could be used at such a point in these procedures as to supply the maximum value for the noise limit curves of FIGS. 3 and 4 wherever they are used, e.g. in steps 128, 134 and 154, wherever they appear. In the flowchart for this procedure shown in FIG. 20, the highest average value of samples N during a scan is determined via step 288, and the limit of N for the 5 TC value in FIG. 3 is set at an arbitrary percentage such as the 25% less than this value as suggested in step 290. In step 292, the noise rejection limits for the other time constant periods used in the flowcharts are based on an appropriate proportional value multiplied by the new noise rejection limit. For example, a measurement taken at two time constants would use a noise rejection level of 86% of the new noise rejection limit.

A noise limit can also be calibrated in accordance with another aspect of this invention by measuring the noise with the associated antenna clamped to ground so as to exclude received signals. In a circuit of FIG. 21 for making this calibration, an antenna 294 supplies RF signals to a tuner 296 that is coupled to an IF amplifier 298. A switching device such as a relay or transistor 300 (relay is shown) that is connected from the antenna 294 to a point 302 at ground potential is shown as being operated in response to a voltage produced by an address decoding logic 306 under the control of a CPU 308 that is coupled both to the tuner 296, and the IF amplifier 298.

Figure 21:
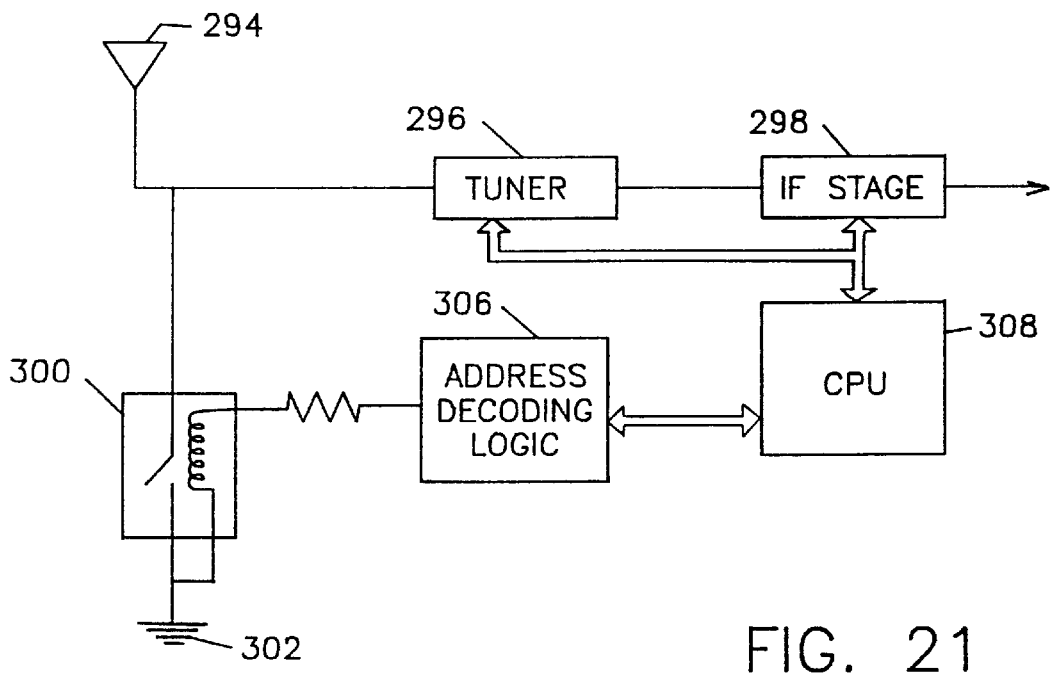
FIG. 21 is a schematic diagram of a circuit for clamping the antenna to ground so as to attain a measure of receiver generated noise.
Figure 22:
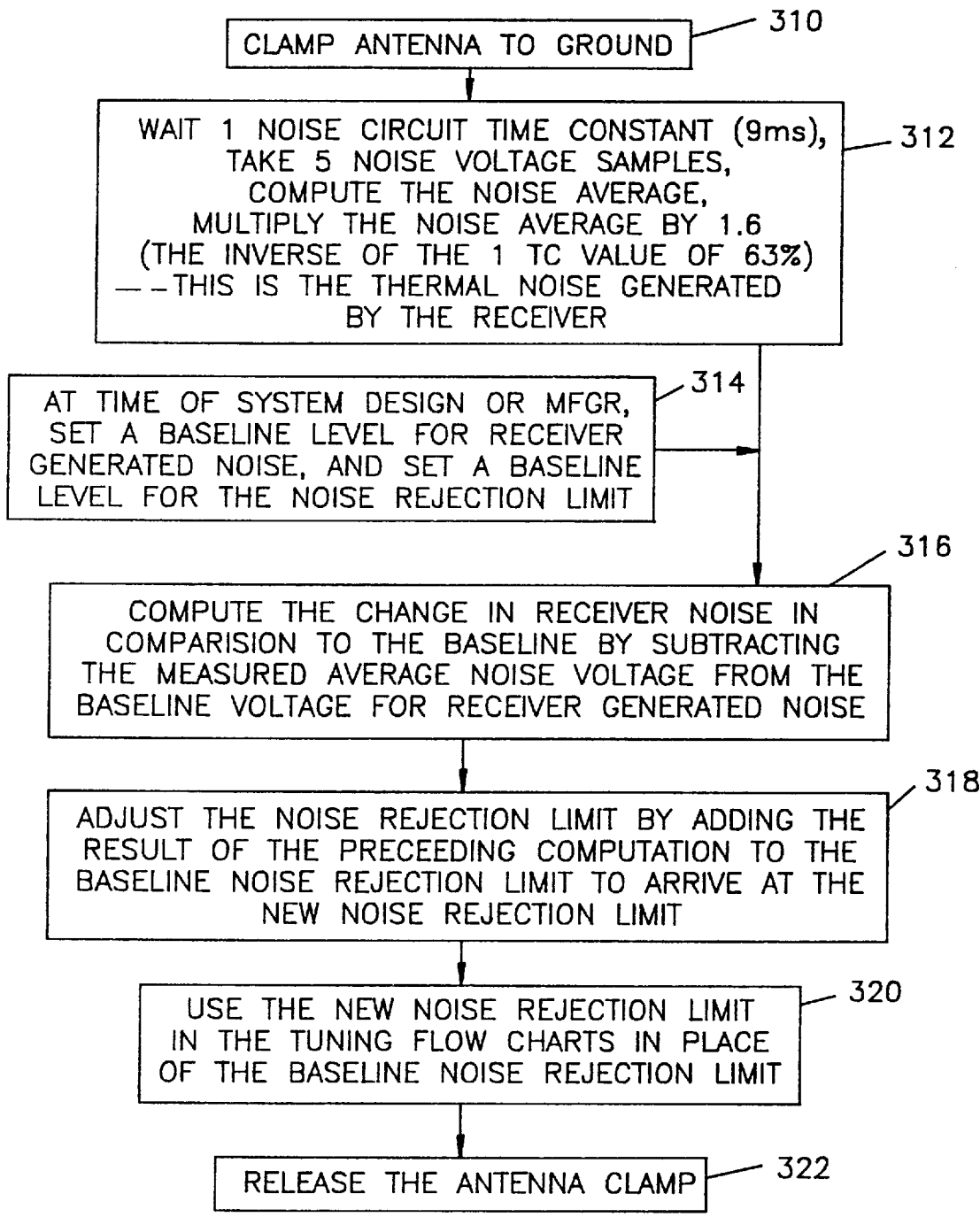
FIG. 22 is a flowchart for calibrating a noise limit from the measurement attained in the circuit of FIG. 21.

FIG. 22 is a flowchart indicating the manner in which the CPU 308 of FIG. 21 operates to derive a calibrated noise value. As indicated in step 310, the switch 300 is closed so that the only noise in the receiver is thermally generated. Next, in step 312, samples are taken of the voltage across the N capacitor 26 after a brief delay, and their average is computed. The average is multiplied by the inverse of the percentage of full charge occurring at the end of the time of sampling. By way of example, if the end of the sampling occurs at 1 TC, the capacitor will be 63% charged, and the inverse of this is 1.6. At the time of system design, in step 314 a base level for receiver generated noise is set and a noise rejection limit suggested. In step 316, the average noise measured with the antenna 294 grounded is subtracted from the base level. The difference is added to the base noise level to obtain the noise rejection limit via step 318. Thus, the noise rejection limit is adjusted in accordance with the actual thermal noise generated by the receiver. If the thermal noise is greater than the base level, the noise limit is increased and vice versa. The new noise rejection limit is used in place of the base level in all of the associated flowcharts or methods of the invention. The switch 300 is then opened via step 322.

Circuit Parameters

Figure 23:
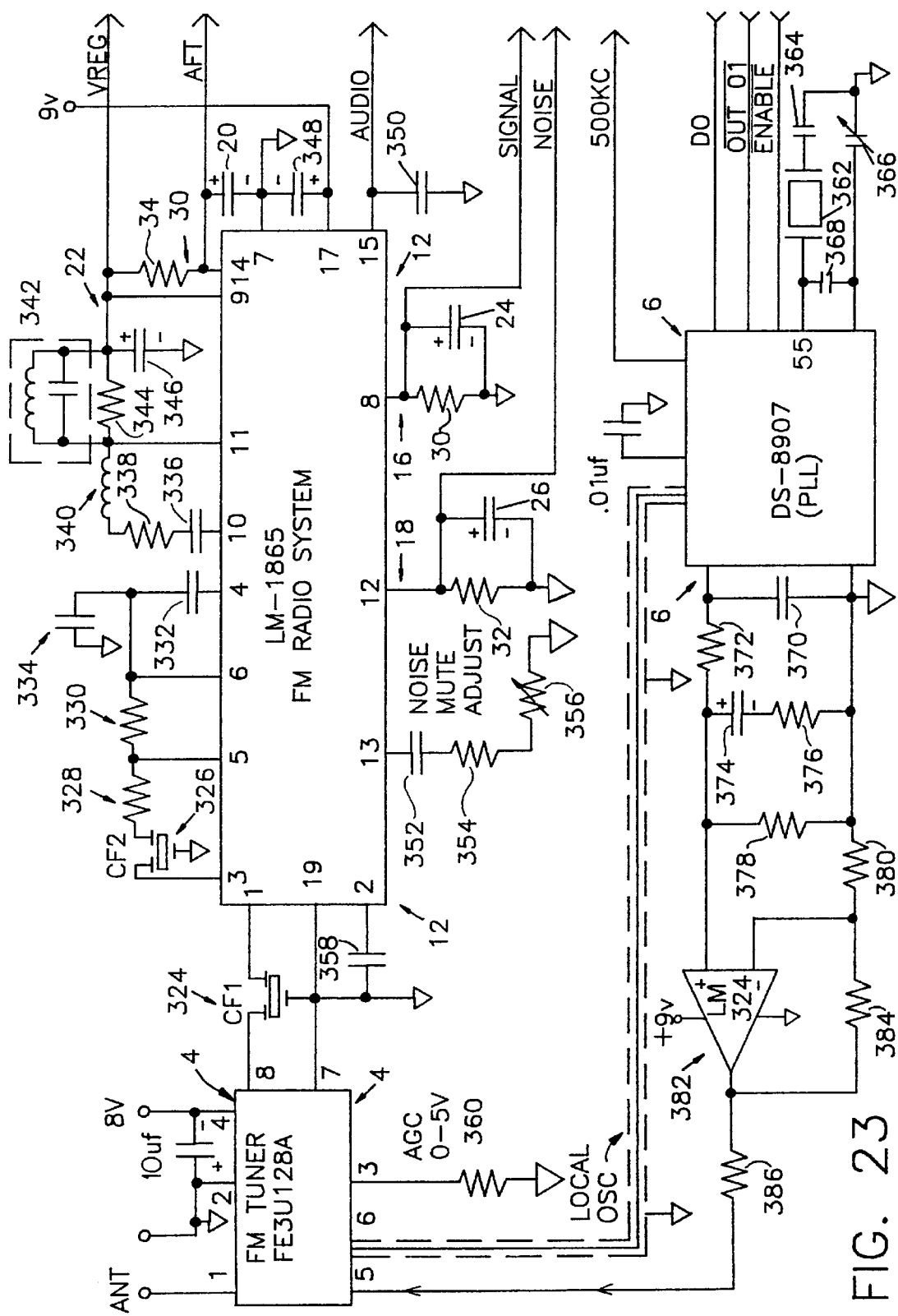
FIGS. 23 and 24 are schematic diagrams illustrating connections for commercially available components of a single tuner FM receiver in accordance with this invention.
Figure 24:
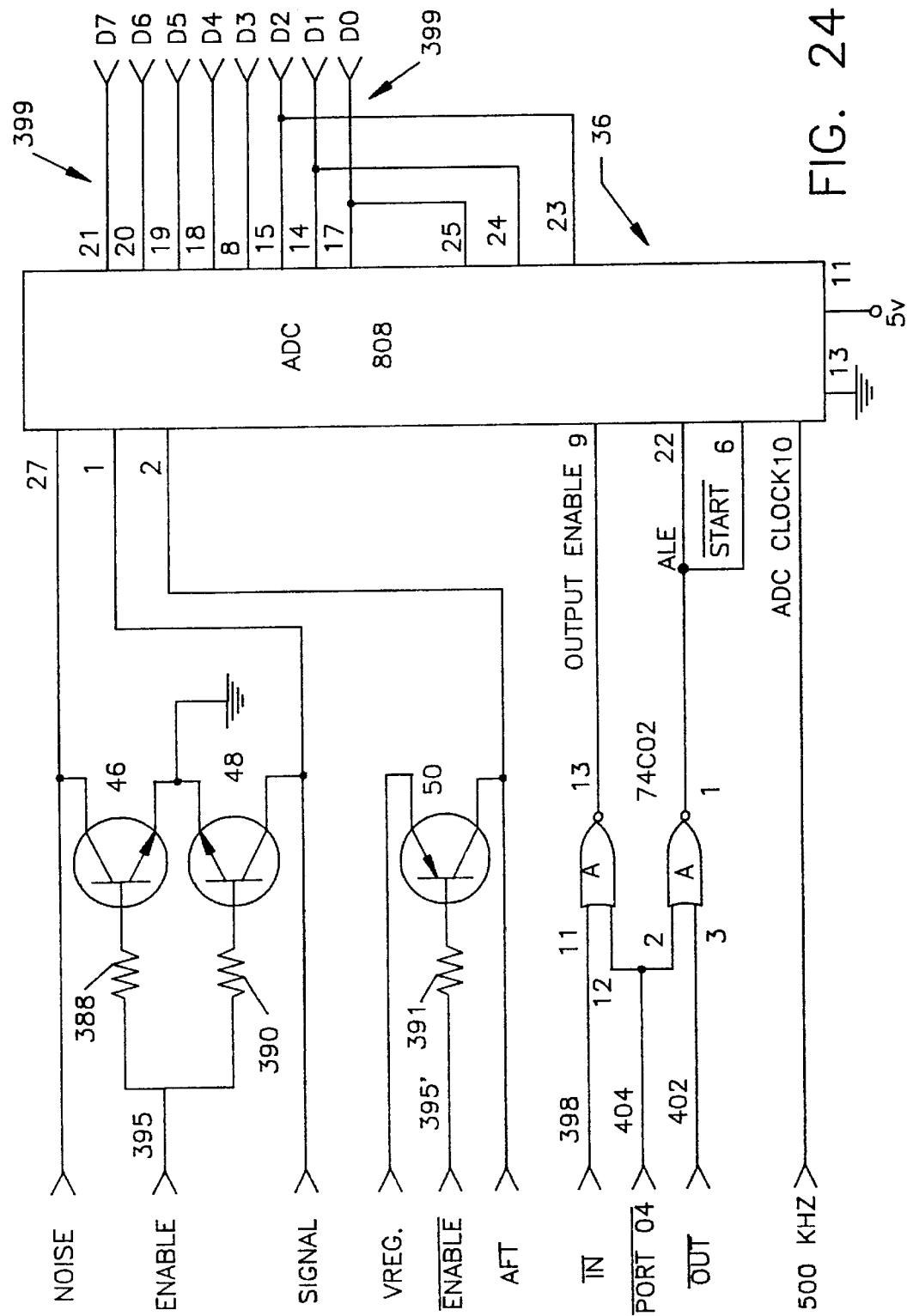

Reference is now made to FIGS. 23 and 24 that show the circuit parameters coupled to the major components includ-ing the tuner 4, the phase locked loop 6, the radio system 12, and the ADC 36 of FIG. 1A. All parameters except those coupled to the SS, N and AFT output pins, respectively, are suggested by the manufacturer, or are not material to the discussion, and need not be discussed in detail, but for convenience their values or identification are set forth below in Table 3. It will be understood that this is only one embodiment of the invention so that the parameter values as well as the SS threshold, the limit of N and the AFT range may be different in an embodiment using different major components.

TABLE 3

| | |
|---|---|
| R 328 - 270 ohms | C 332 - .01 uf |
| R 330 - 27 ohms | C 334 - .01 uf |
| R 338 - 68 ohms | C 336 - .01 uf |
| R 344 - 3.3 kΩ | Quad Coil TOKO K596 |
| R 354/356 - 7.5 kΩ | C 346 - 10 uf |
| R 360 - 470 kΩ | C 352 - .01 uf |
| R 372 - 220 ohms | C 364 - 470 pf |
| R 376 - 4.7 kΩ | C 366 - 30 pf |
| R 378 - 100 kΩ | Xtal 362 - 4 Mhz |
| R 380 - 8.2 kΩ | C 368 - 100 pf |
| R 384 - 22 kΩ | C 370 - .01 uf |
| R 386 - 4.7 kΩ | C 374 1 uf |

Ceramic Filter 324
TOKO SK107M2-AO-00
Ceramic Filter 326
TOKO SK207M2-AO-00
AMP 382
LM324

In the SS, N and AFT circuits that are respectively coupled to the PLL 6 of the illustrated radio system, the component values used as well as the values suggested by the manufacturer are as follows in Table 4:

TABLE 4

| | Actual | Mfg's Suggested |
|---|---|---|
| C 24 (SS) | 2.2 uf | 10 uf |
| R 30 (SS) | 10 kΩ | 10 kΩ |
| C 26 (N) | 1 uf | 2.2 uf |
| R 32 (N) | 22 kΩ | 22 kΩ |
| C 28 (AFT) | 4.7 uf | 5.0 uf |
| R 34 (AFT) | 2.7 kΩ | 5.0 kΩ |

The actual values of the SS, N and AFT capacitors C24, C26 and C28 and resistor R34 are less than those suggested by the manufacturer because the averaging of samples in the manner previously explained permits smaller values to be used. In the prior art, unwanted signals such as the audio in the AFT circuit are attenuated by the filtering action of the capacitors so that the capacitors have to be larger.

In FIG. 24, resistors 388, 390, and 391 of 4.7 kΩ are respectively connected in series with the base leads of the transistors 46, 48 and 50 and form the enable circuit that clamps capacitors 24, 26, and 28 on channel changes.

The CPU 38 of FIG. 1A controls the entire radio system via connections to the phase lock loop 6, the display 44, and the ADC 36. The interconnections between these components use standard microprocessor interface design methodologies and are not detailed herein since anyone skilled in the art could develop a suitable design. The essence of the design of this radio is that the CPU 38 effects channel changes by sending a serial digital message via lead Dφ of data bus 399 of FIG. 23 and FIG. 24 to PLL 6 which will cause PLL 6 to output a tuning voltage to FM tuner 4 such as to cause FM tuner 4 to tune to the desired channel. The CPU 38 implements clamping capacitors 24, 26, and 28 on channel changes by sending either a second or third digital message to PLL 6 which will cause PLL 6 to activate or deactivate, respectively, an output lead 395 which is used to turn transistors 46 and 48 on or off, and output lead 395' which is used to turn transistor 50 on or off, as desired. The CPU 38 reads SS, N, and AFT signal values by activating ADC 36 to receive data over data bus 399 via applying certain combination of values to leads 398, 402, and 406 through intermediate interface logic. Once ADC 36 is prepared in such a manner, CPU 38 sends a digital message to ADC 36 via data bus 399 commanding the ADC 36 to sample a specific one of its input leads. Alternatively the CPU 38 will apply another combination of values to leads 398, 402, and 406 which will cause ADC 36 to output the digital value of the sample it has just taken on data bus 399, which will be read by CPU 38.

Figure 25:
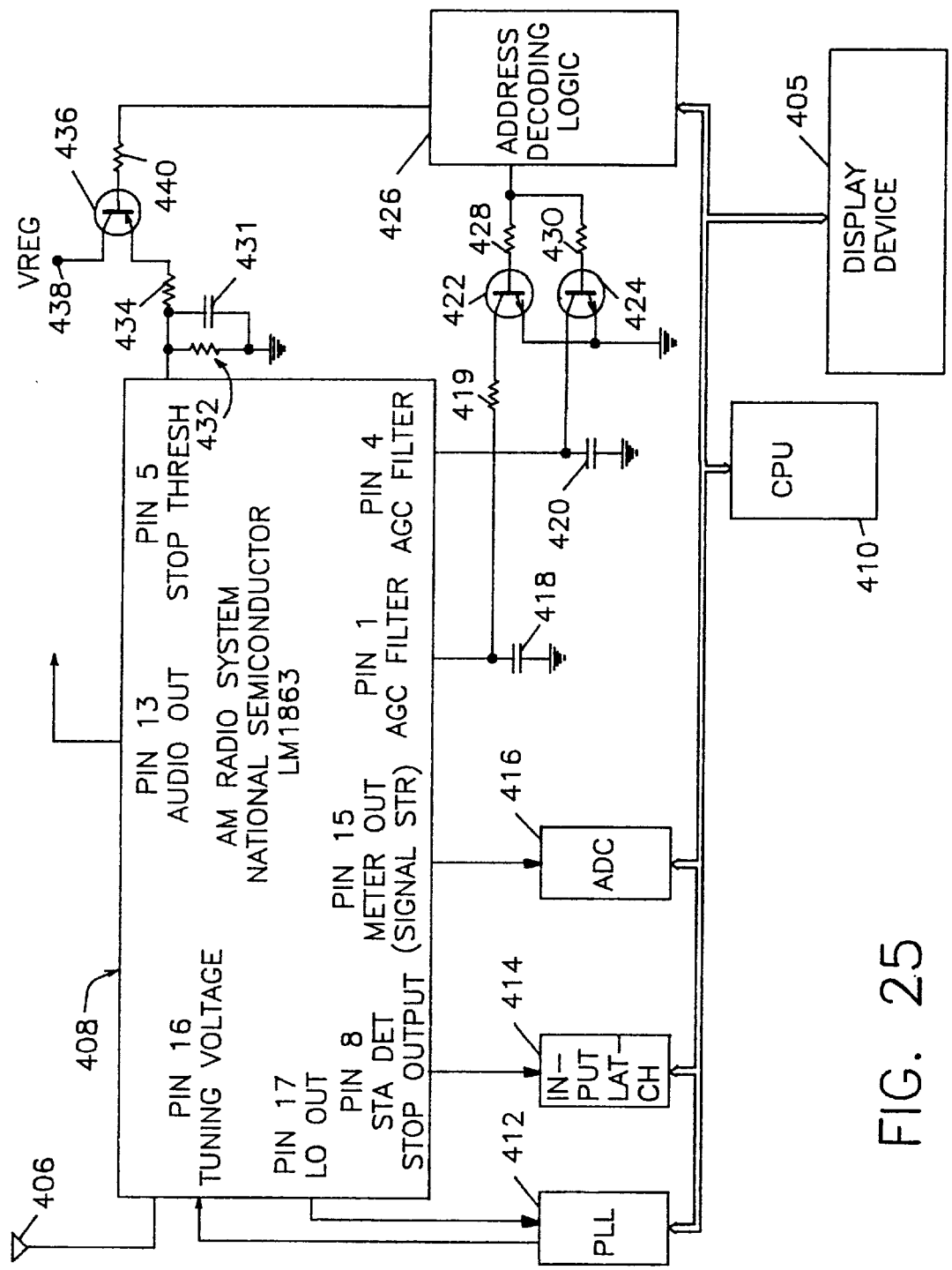
FIG. 25 is a block diagram of an AM radio utilizing this invention.

FIG. 25 illustrates the application of momentarily clamping AGC capacitors 418, 420, and a stop threshold capacitor 422 of an AM receiver so as to charge them to neutral values at the initiation of each channel change and thereby save time in tuning from one channel to another, in accordance with one aspect of this invention. Listenable channels can be shown in a display 405.

In the AM receiver shown in FIG. 25, an antenna 406 supplies RF signals to a receiver system 408, herein indicated as being a solid state chip LM1863. The LM1863 also requires additional external components such as coils, resistors, and capacitors according to standard design practices as recommended by the manufacturer, and are not shown. A CPU 410 controls a phase locked loop frequency synthesizer 412 so as to produce a tuning voltage at receiver 408 that causes a local oscillator (not shown), to generate the frequency required to tune in the selected station, and the loop is completed by coupling the local oscillator output "LO Out" to the PLL 412.

Upon activation of a seek or scan mode, the acceptability of the next channel tuned in is determined on the basis of its signal strength as indicated by a meter out pin 15 of receiver 408, and the presence of a correct IF frequency as indicated by a tuned resonator circuit, not shown. When a desired combination exists, a stop detection circuit stops the tuning action and produces a voltage at pin 8 that is coupled to the CPU 410 via a latch 414. A signal indicative of the signal strength SS appears at a pin 15 and is placed in digital form by an ADC 416 before being applied to the CPU 410. In this particular embodiment, external capacitors 418 and 420 respectively connected to pins 1 and 4 form part of an AGC filter that is necessary to eliminate audio signals from the AGC voltage.

In going from one channel to the next, enough time must be allowed to permit the capacitors 418 and 420 to discharge. Otherwise, the stop action circuit may stop tuning on the next channel in response to the voltage stored on the capacitors 418 and 420 in response to the previous channel. The capacitors must be of adequate size to properly filter the AGC signal to prevent the AGC system from attempting to track the IF signal modulation envelope, which would cause high audio Total Harmonic Distortion (THD). Prior art design is therefore a compromise between tuning speed, which is slow for large value AGC filter capacitors, and THD. A delay of as much as 50 ms is typically provided to permit the discharging to take place.

In accordance with this invention, the delay is avoided by discharging the capacitors 418 and 420 with NPN transistors 422 and 424, respectively, in this example. This is accomplished by the CPU 410 sending an appropriate signal to the bases of the transistors 422, 424 via an address decoding logic network 426, and coupling resistors 428 and 430. A low value resistor 419 is in series with capacitor 418 and transistor 422 to prevent damage to the LM1863 chip which has no internal resistance at output pin 1. Using the capacitor discharge design specified by this invention, the capacitors may be optimized to perform the filtering function and minimize THD in a system with very fast tuning.

The stop output circuit also requires a filter capacitor 431, in parallel with a resistor 432, in a threshold circuit that is connected to pin 5 of radio system 408, in order to prevent intermittent operation of the stop detector circuit in the presence of modulation peaks which may have passed through the limiting amplifier. Time is also required to discharge this capacitor.

In accordance with the invention, therefore, a PNP transistor 436 is connected between capacitor 431 and a point 438 of regulated DC. voltage $V_{reg}$. A resistor 434 is connected in series with the main current path of transistor 436 to aid in achieving the desired voltage pre-charge, to be discussed immediately. When a channel change is initiated in a seek or scan mode, the CPU 410 sends a signal via the Address Decoding Logic 426 and a resistor 440 so as to cause the transistor 436 to conduct and establish the voltage on the capacitor 431 at the voltage at the junction of the resistors 432 and 434. The value of the regulated voltage at the point 438 and the values of the resistors 432 and 434 are such that the voltage at pin 5 is forced to its minimum stop indication voltage when the transistor 436 conducts. If the new channel being analyzed is strong, the stop detector voltage will increase rapidly to a high level so as to trip the stop output station detector on pin 8. If the strength of the new channel is at or just above the stop indicator voltage, the voltage in the capacitor 431 increases rapidly to a point above the minimum stop level and maintains a steady state. If, however, the signal strength of the new channel is below the minimum stop level, only a short delay is required for the capacitor 431 to discharge through the resistor 432.

Figure 26:
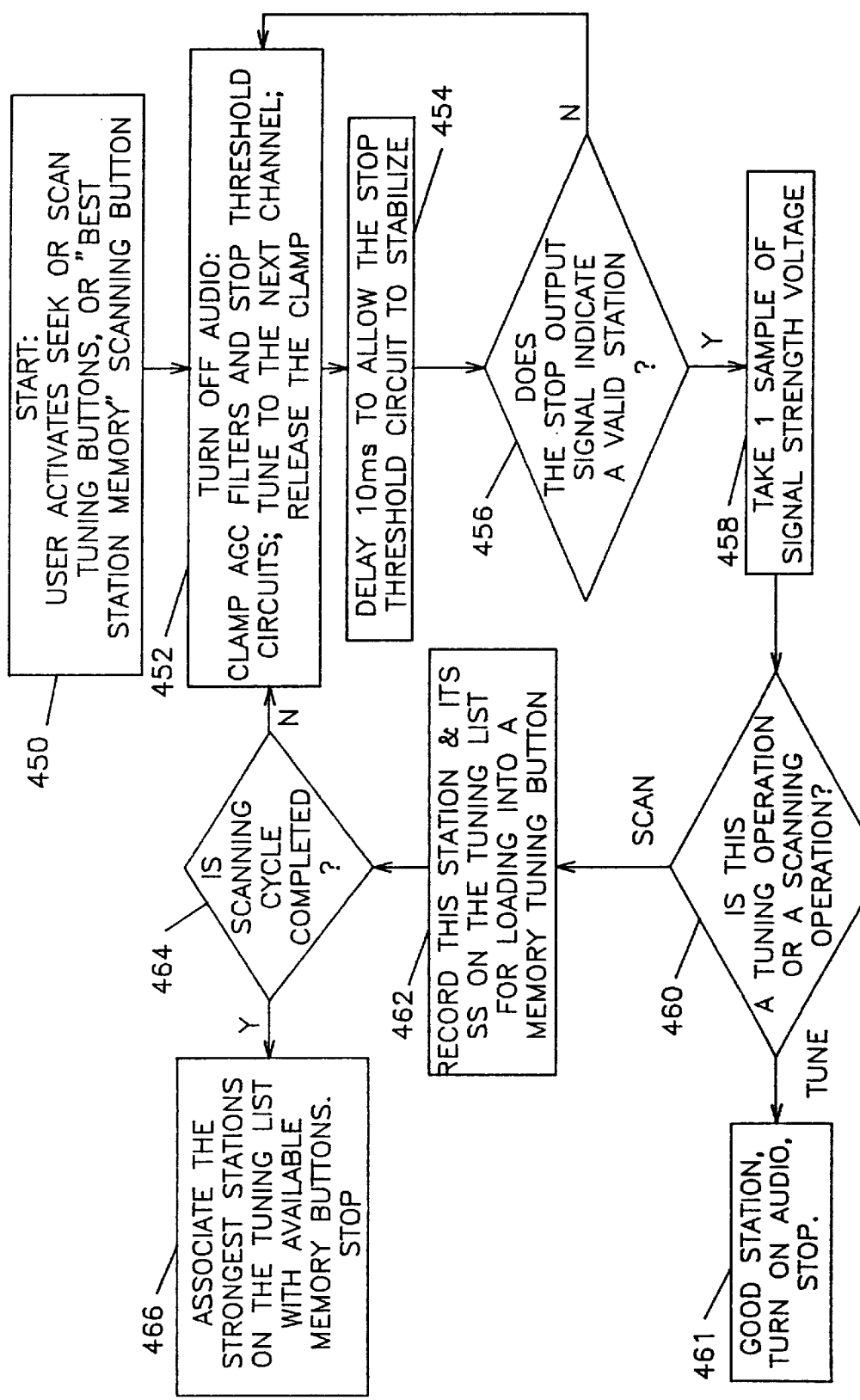
FIG. 26 is a flowchart for the operation in accordance with this invention of an AM radio having a single tuner and no display.

Reference is now made to the flowchart of FIG. 26 for an explanation of the operation of the AM receiver tuning system of FIG. 25 when a single tuner is used and no display is provided. At a block step 450, a user activates a seek, scan or best station memory scanning button, and at a step 452, the audio is turned off. The transistors 422, 424 and 436 are momentarily made conductive so as to discharge the capacitors 418 and 420 to ground potential, and to charge or discharge the capacitor 431 to the voltage at the junction of the resistors 432 and 434. The receiver 408 is then tuned to the next channel. After a delay such as 10 ms to permit the stop threshold circuit to stabilize via step 454, it is then determined at a decision step 456 whether the voltage at the stop output pin 8 indicates that the station tuned to is listenable. If not, the procedure loops back to step 452. If so, a sample is taken of SS voltage at the pin 15 via step 458. Next, at decision step 460 it is determined whether a seek or scan button has been activated or whether a best station memory scanning button has been activated. If the seek or scan button was activated, the receiver remains tuned to the present channel. If, however, the best station memory button was activated, the channel is loaded into a tuning list along with its SS via step 462. It is determined at decision step 464 whether the entire AM band has been scanned. If not, the procedure returns to step 452. If so, the stations having the greatest values of SS are associated with the memory buttons via step 466.

Figure 27A:
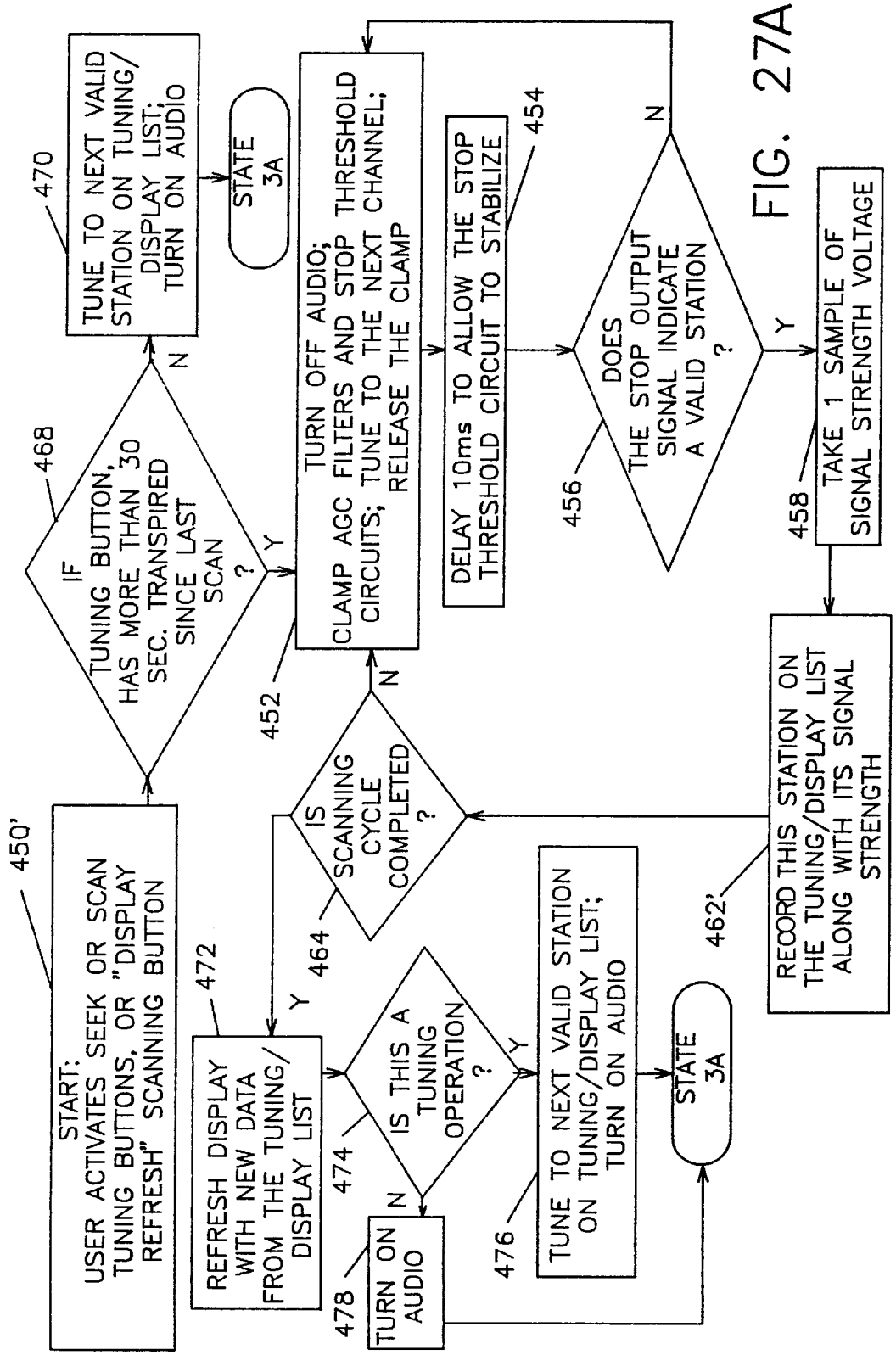
FIG. 27 is a flowchart for the operation in accordance with this invention of an AM radio having a single tuner and a display.
FIG. 27B is a flowchart for monitoring the signal of an AM station and updating the display.
Figure 27B:
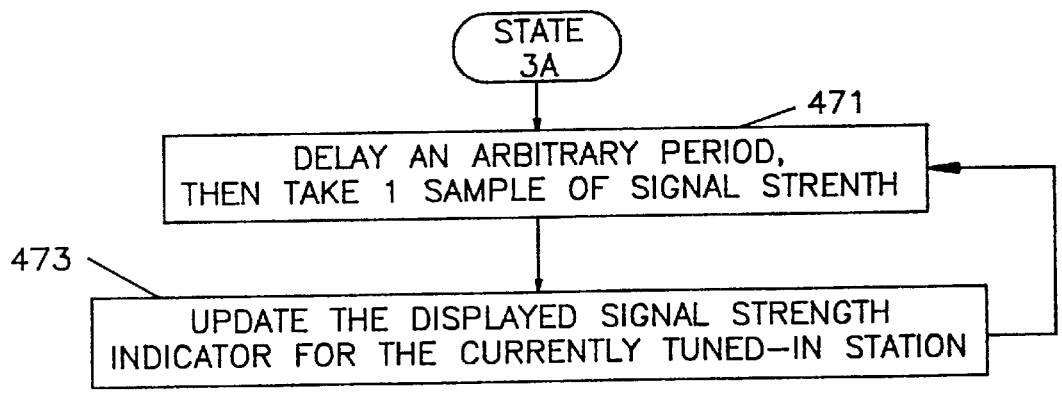

The flowchart of FIG. 27A is for an AM receiver having a single tuner and a display, such as 405, of listenable stations. It is very much the same as the flowchart of FIG. 26 except for the following. At decision step 468, a determination is made as to whether a given time like 30 seconds has transpired since the last activation of the display refresh button. If not, the next listenable station on the tuning/ display list is tuned in and the audio tuned on via step 470. The receiver then enters a state 3A in which the station is monitored as shown by the flowchart of FIG. 27B. In FIG. 27B, a sample of the SS is taken after a brief delay via step 471, and the SS indicator of the tuned in channel is updated via step 473. The process is continuously repeated. Returning now to FIG. 27a, step 450' includes a display refresh button rather than a best station memory button. Instead of associating the stronger listenable stations with a few memory buttons, as in step 466 of FIG. 26, the display 405 is refreshed with all listenable stations and their respective signal strengths via step 472. If at a diamond decision step 474 it is determined that a seek or scan button has been activated, the next listenable station on the tuning list, and hence in the display 405, is tuned in and its audio tuned on via step 476. The system then enters a state 3A in which the signal strength is monitored. If at decision step 474 it is determined that the display refresh button was activated, the audio is turned on and then the system proceeds to the monitoring state 3A.

For simplicity of explanation the systems described in this application have not specifically been described as having both best station memory buttons and a display, however systems designed in accordance with this invention may incorporate both of these features.

Dual Tuner AM Tuning System

Figure 28:
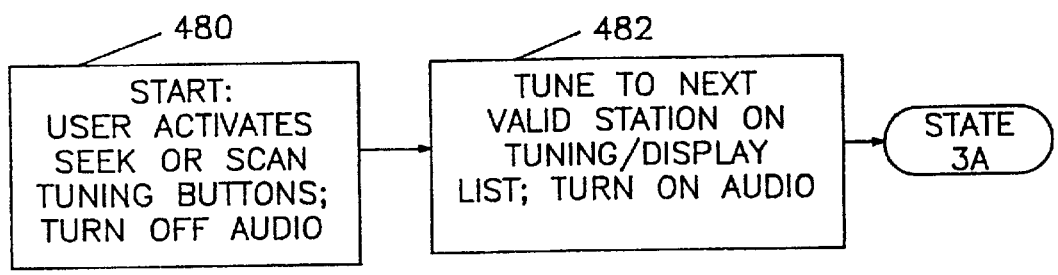
FIG. 28 is a flowchart of the operation in accordance with this invention of the listening tuner in a dual tuner AM radio having a display of listenable stations.

FIG. 28 is a flowchart for the operation of the listening tuner 184 in a dual tuner system incorporating the invention. When a user actuates a seek or scan button, the audio is turned off via step 480, and the next listenable channel on the tuning/display list developed by a scanner tuner 186 is tuned in and the audio turned on via step 482. The channel is then monitored in a state 3A as illustrated in FIG. 27B.

Figure 29:
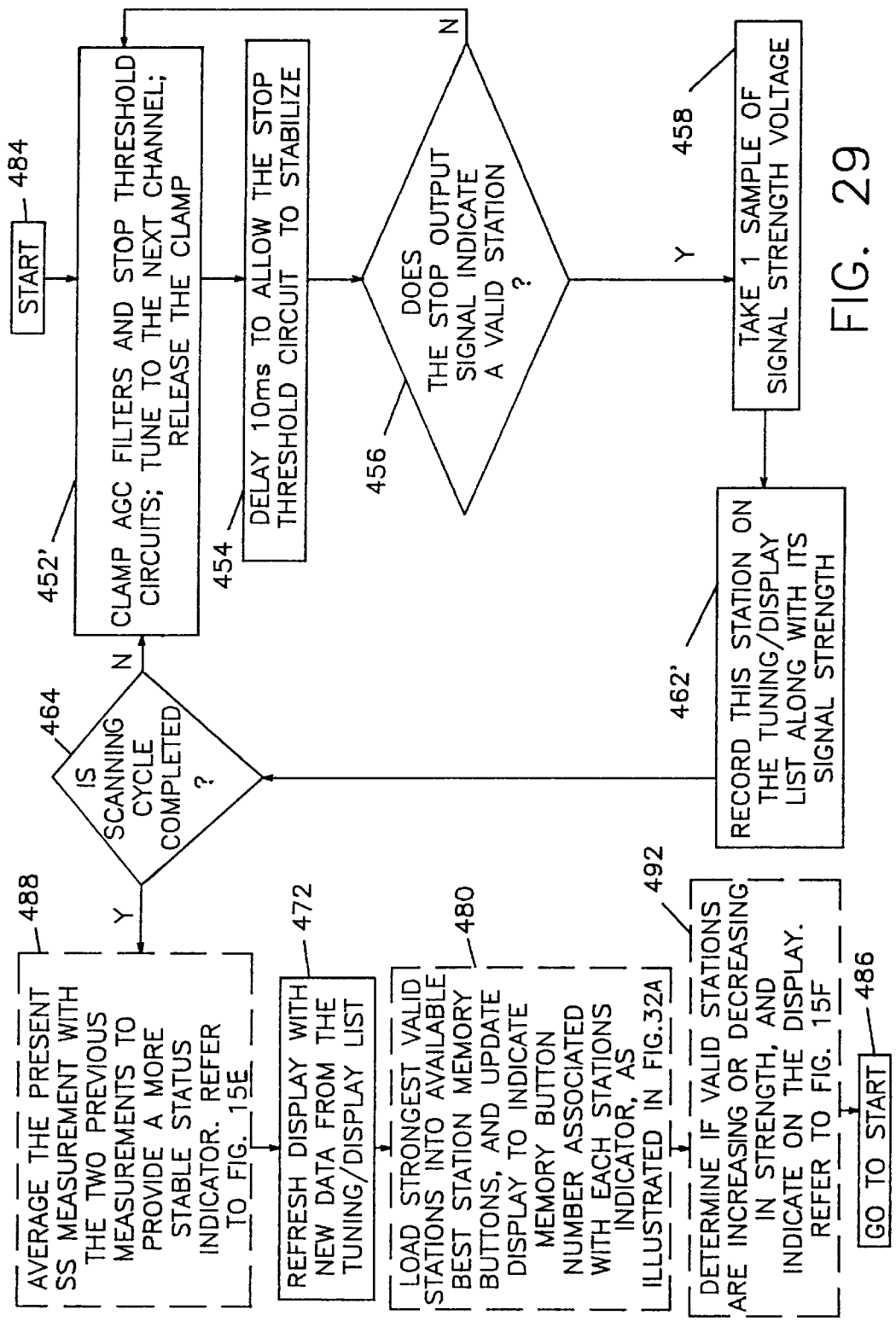
FIG. 29 is a flowchart of the operation in accordance with this invention of the scanning tuner in a dual tuner AM system having a display of listenable stations.

FIG. 29 is a flowchart for the scanner tuner 184 of a dual tuner AM tuning system incorporating the invention. Refreshing the tuner/display list may be done whenever desired, because the scanner tuner 184 is not providing the audio signal, and would normally proceed on a continuous basis. When the refresh procedure as initiated via start step 484, the same procedure is followed as indicated by steps 452', 454, 458, 462' and 472, and decision steps 456 and 464, of FIG. 27A, except that step 452' does not specify turning off the audio since this is a scanner tuner which would not normally have a connection to the audio output. After the AM band has been scanned for listenable stations and the display 212 has been refreshed, the procedure returns via step 486 to start step 484.

Additional Procedures

The following additional procedures are indicated by phantom blocks in FIG. 29. In step 488, a more stable indication may be made of the signal strength of the stations shown in the display by averaging a number of SS samples as, for example, in FIG. 15E. Step 490 indicates that stronger listenable stations are loaded into memory locations associated with channel or memory buttons, and the display updated to show the button number associated with a particular station as will be discussed in connection with FIG. 32A. Step 492 then calls for indicating in the display whether the SS of a channel is increasing or decreasing in a manner illustrated in FIG. 15F.

Displays

There are a number of ways in which pertinent data can be shown on a display, and it is thought to be well within the skill of those in the display art to devise means for forming the displays to be described.

In the display illustrated in FIG. 30A, the channels having listenable stations are indicated by vertical lines 495 at the frequency of the channel, for example. The number of listenable stations will vary depending upon the sensitivity of the tuner. The height of a line is proportional to the signal strength, SS, of the station, and the station being listened to such as the one at 103.5 Mhz (megahertz), is differentiated from the other stations in any suitable manner such as, for example, by its being pulsated on or off or by a different color. Stations which have considerable noise may be indicated by a dashed vertical line 494 or differentiated in some other way. RDS data indicating the type of programming for each listenable station may be derived by the scanning tuner 186 as in FIG. 15B and displayed, step 240, for example, by placing coded indices in circles 493 at the tops of the lines 495. For example, stations broadcasting news, weather, or sports could have codes of N, W, or S, respectively, indicated in association with the station's indicator bar 495. RDS data pertinent to the tuned in station can be derived as at step 218 of FIG. 12 or step 175 of FIG. 9 and shown as at 496 in the top section, and real time RDS data may be shown in the bottom section 498. A menu system, such as that described subsequently in FIG. 36, could be used to select the types of RDS data to be displayed, e.g. to display indicators just for stations broadcasting the news and sports, or perhaps just stations broadcasting jazz, etc. The menu system could be controlled by standard keyboard mechanisms as indicated by item 42 of FIG. 1A, or could be controlled by either a touch entry system or voice response system as described by FIG. 39 to be discussed later. In a similar vein, station indicators could be displayed only for stations of the selected types of program material based upon the RDS digital data transmitted by each station.

FIG. 30B illustrates the radio scanner and display system working in conjunction with radio paging services broadcasting on commercial radio stations via SCA or RDS subcarriers, in which the data stream indicated by 498 carries the paging message.

FIG. 30C illustrates an alternative display mode for displaying listenable stations broadcasting a selected type of program material based upon the RDS digital data broadcast by each station.

In FIG. 31, a horizontal line 500 illustrates the adjustable threshold value of SS. Channels having lesser SS than the threshold value cannot be tuned in. As indicated at 507 the vertical line for the station tuned in is in the form of a hollow rectangle that is wider than the other vertical lines, and the degree to which it is filled in from the bottom, as at 504, may represent its SS. An enlarged view is presented as indicated at 505. Various frequencies of the band may be shown as at 506 and the frequency of the station tuned in, 508, may also be shown. In the lower portion 510, display information as to the values of SS, N, AFT and QF may be shown. A color code may be used to indicate the QF of the tuned in station, as indicated at 511. The display may also indicate that a station is drifting in accordance with step 173 of FIG. 9 by, for example, displaying the words "Drifting" or similar notation at the site of 511. When a station exhibits virtually no noise as determined via decision step 128 in FIGS. 7B, 8B and 10B, a special indication, such as a green color or a solid indicator line, can be made at the vertical SS line for that station.

In FIG. 32A, the numbers of the memory buttons 512 are formed at the vertical line representing the SS of a listenable station. For example, the station to which the receiver is tuned is the one corresponding to the memory button M3.

Figure 33:
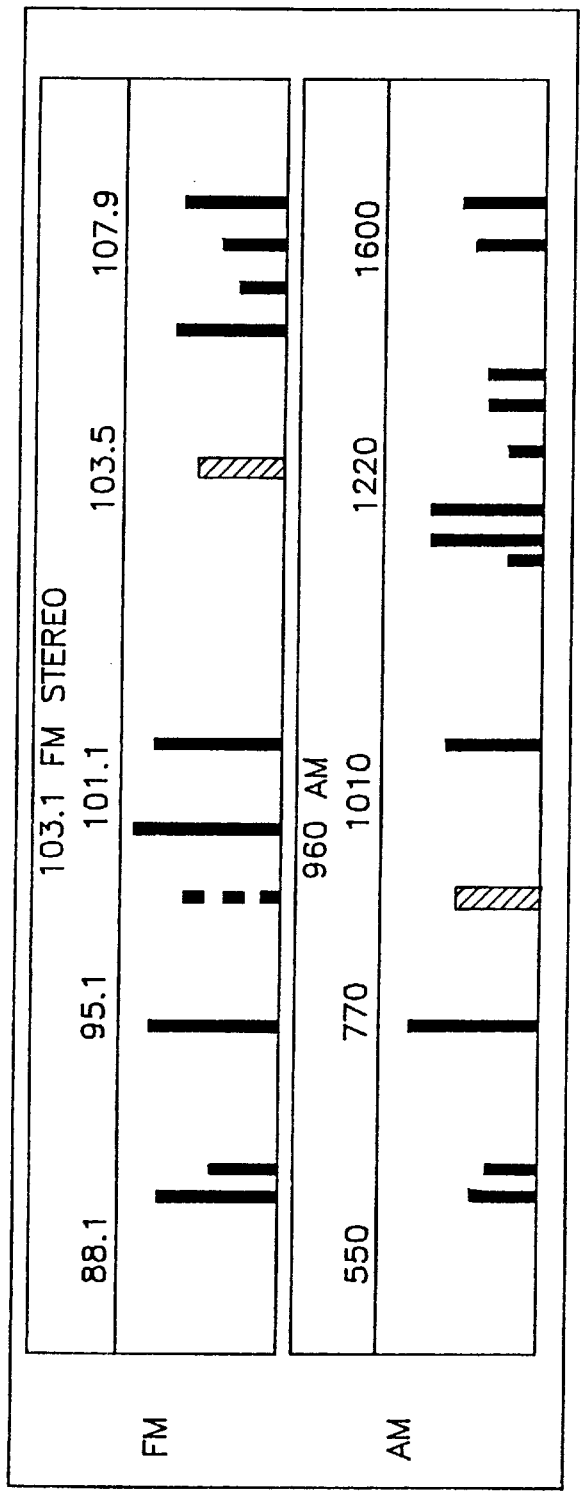
FIG. 33 illustrates a display showing listenable FM and AM stations.

FIG. 32B illustrates a display which utilizes station indicator bars formed as upward pointing arrows 514 or downward pointing arrows 516 to denote stations that are increasing of decreasing in SS according to steps 264 or 266 of FIG. 15F FIG. 33 illustrates displays of listenable stations in both the FM and AM bands.

Figure 34:
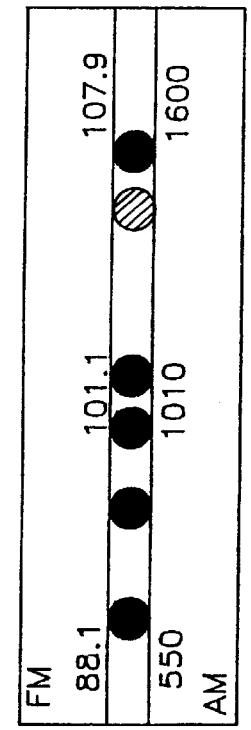
FIG. 34 illustrates a display in which listenable FM and AM stations are identified by dots.

FIG. 34 illustrates another way of designating channels with listenable stations along with their values of SS. Instead of vertical lines, spots of light having a brightness or color proportional to SS are formed.

Figure 35:
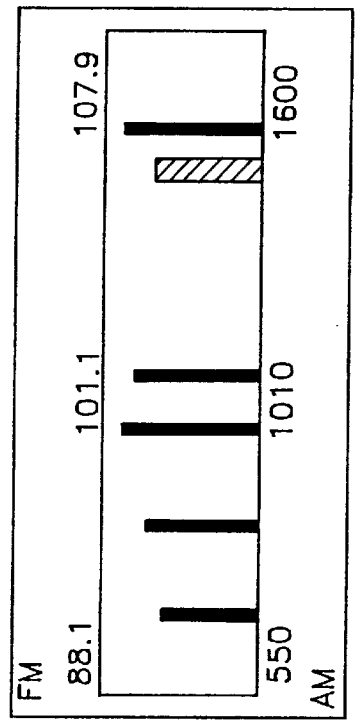
FIG. 35 illustrates a display in which listenable FM and AM stations are indicated by bars of LCD's.

In FIG. 35, the lines are formed by an LCD, whereas other portions of the display may have been printed on the radio's faceplate. The height of the lines on the LCD or their brightness can indicate the value of SS.

FIG. 36 illustrates a display menu that may be brought up on the display 44 of FIG. 1A by depressing the menu key of the keyboard 42. A cursor, indicating which item of the menu will be activated, is indicated by an asterisk *. When the * is opposite FM-SCAN, an image like FIG. 31 is displayed without the values of SS, N, AFT and QF, but they can be displayed if the * is moved down one line. If the * is opposite Plot/Scan, FIG. 37 is displayed in which plots of SS, N and AFT are made as time goes on. From FIG. 37 it can be seen that there is a correlation between N and SS. The actual values of SS, N, AFT and QF are presented in sequence at the lower left, and the height of a lighted area 505 at the right corresponds to SS, as also shown on FIG. 31. In addition, the quality factor QF is indicated in script at the lower right. Yellow is shown as being displayed. In a color display, the actual color could be indicated. Toggling the Enter key causes FIG. 38 to be displayed alternately with FIG. 37 so as to prevent statistics of a tuned in station such as the average values of SS, N and AFT, their respective lows and highs, and their ranges.

Touch Entry and Voice Response Tuning

FIG. 39 illustrates a display screen which is sensitized to fingertip touch, using standardly available products, and arranged such that touching the area on the display where a station's indicator bar is displayed will cause the tuner to tune immediately to that station. Touch entry input devices are available from many manufacturers, and so the operation be described in general terms, as follows, but will not be described in detail. One standard approach to touch entry devices, as illustrated in FIG. 39, is to apply a touch sensitized transparent plate 518, commonly called a touch screen, on top of the display 212. The touch sensitized plate 518 is associated with input translation circuitry 520, typically supplied by the same manufacturer that supplies the touch sensitized plate, which resolves the detected touch into an x–y coordinate. The x–y coordinate data is made available to the CPU 198 via standard hardware and software interfacing techniques. The software designer of the system creates a translation table that converts the x–y coordinates into the frequency of the station being displayed at the selected site. The CPU 198 then would use standard procedures for tuning to that station.

FIG. 39 also illustrates an alternative voice response tuning arrangement in which a microphone 522 accepts spoken commands, which are translated into machine understandable format by the input translation unit 520, and are then supplied to CPU 198 for action.

Although various embodiments of the invention have been shown and described herein, they are not meant to be limiting. Those of skill in the art may recognize modifications to these embodiments, which modifications are meant to be covered by the spirit and scope of the appended claims.

What is claimed is:

1. A tuning system for a radio receiver comprising:

a visual display of a radio band;

means for tuning the radio receiver so that it tunes to the channels of the band in sequence;

means coupled to said radio receiver for deriving signals indicative of the received signal characteristics of stations present in channels of said radio band, the signal characteristics including at least SS (signal strength), and one of N (noise) and AFT (automatic fine tuning);

means for determining the listenable stations in response to said signals;

means for producing simultaneous displays of said listenable stations at respective channel locations in the visual display, said displays showing at least the relative magnitudes of measured values of the signal strengths of said listenable stations; and means for tuning the radio receiver to a selected one of the displayed stations for listening.

2. A tuning system as set forth in claim 1, further comprising:

means for modifying said displays so that they illustrate the N of each listenable station.

3. A tuning system as set forth in 1, wherein:

said means for deriving said signals derives signals for AFT and N;

wherein means are provided for deriving a measure of QF, of the quality of each listenable station in response to a combination of SS, N and AFT; and wherein means are provided for modifying said displays so that they illustrate the QF of each listenable station.

4. A tuning system as set forth in claim 1, further comprising:

means for deriving digital data broadcast by stations; and means for presenting said digital data of a tuned in station on the display means.

5. A tuning system as set forth in claim 1 wherein said means for tuning the radio receiver to a selected one of the displayed stations may be effected by touching said display means at the respective displayed location of the selected station.

6. A tuning system as set forth in claim 1, further comprising:

a scanner turner;

said means for deriving said signals being coupled to said scanner tuner; and means for controlling said scanner turner so that it repetitively scans the channels of the band.

7. A tuning system as set forth in claim 1 further comprising:

means for deriving digital data broadcast by stations wherein said digital data may include the type of program material or other identifying information being broadcast by a station; and means for simultaneously indicating said identifying information for each of said broadcasting stations on the display means by modifying the appearance of said displays of said signals of listenable stations at respective channel locations in the visual display such as by color, intensity, or shape.

8. A tuning system as set forth in claim 1 further comprising:

means coupled to said radio receiver for deriving digital data broadcast by stations wherein said digital data may include the type of program material or other identifying information being broadcast by a station; and means for simultaneously presenting an indicator of said identifying information for each of said listenable stations on the display means in an associative manner with said displays.

9. A tuning system as set forth in claim 8 further comprising:

means for selecting which types of said identifying information indicators are to be presented; and wherein said means for tuning the radio receiver to a selected one of the displayed stations is restricted to tuning to stations associated with said selected types of said identifying information.

10. A tuning system as set forth in claim 9 wherein the identifying information of the selected types is presented and indicators for other listenable stations are not displayed.

11. A system for determining whether the signals received by an FM receiver are unlistenable, comprising:

means for deriving a reference value of an automatic fine tuning (AFT) signal of a listenable signal;

means for deriving an AFT signal produced by another station signal;

means for finding the absolute difference between the AFT signal of the listenable signal, and the AFT produced by said another station signal; and means for identifying the another station signal as being unlistenable if said absolute difference exceeds a predetermined amount.

12. A method for finding a channel having a value of AFT that can be used as a reference value in identifying the listenability of channels in an FM receiver, wherein SS (signal strength), N (noise) and AFT (automatic fine tuning) voltages are produced on respective capacitors, comprising the steps of:

a tuner;

tuning the tuner to a channel in the band;

clamping the voltages across the capacitors to neutral values of voltage;

unclamping the capacitors;

obtaining a first group of samples of the voltage on each capacitor and calculating their respective averages;

rejecting a channel for which the average voltage of the SS samples is less than a given threshold or the average of the N samples is greater than a given limit or the average of the AFT samples lies outside a range of values;

tuning in the next channel and repeating the procedure if the channel is rejected;

obtaining second and third groups of samples of SS, N and AFT;

calculating the voltage averages of each of the second and third group of samples of SS, N and AFT, respectively;

determining the voltage ranges of the samples of SS in each of said second and third groups; and accepting a channel for the purpose of providing a reference value of AFT, if the voltage averages of said second and third groups of SS samples are both greater than a predetermined threshold value, the voltage ranges of SS values of the samples in said second and third groups are within a given percentage of each other, the voltage averages of the samples of N for both groups are less than a given limit and the difference between the voltage averages of the AFT samples of both groups is less than a given voltage, which is less than said given value with which the first group of AFT samples is compared.

13. A method for finding a channel having a value of AFT that can be used as a reference value as set forth in claim 12 but wherein the second and third groups of samples are obtained from the strongest station by the addition of the following steps prior to obtaining the second and third groups of samples:

recording a channel in memory along with the average voltage of its SS samples if it is not rejected;

checking to see if all channels of the band have been subjected to the procedure;

tuning to the channel having a station with the greatest average voltage of the SS samples; and, tuning to the channel with the next greatest average voltage of the SS samples and repeating the procedure if the channel is not accepted.

14. A method for identifying a channel having a listenable station in an FM receiver having capacitors that are charged by voltages in its tuner for SS (signal strength), N (noise) and AFT (automatic fine tuning) there being respective time constants for the charging of each capacitor, comprising the steps of:

providing a reference value of AFT;

momentarily clamping said capacitors for SS, N and AFT to respective neutral voltage values at a change in channel;

obtaining the value of a first group of individual samples or the average of a first group of multiple samples of the voltage of each of said capacitors so as to obtain an SS average, an N average, and an AFT average;

computing the offset between the reference value of AFT and the AFT value or average; and rejecting a channel as not having a listenable station if the SS value or average is less than a given threshold, the N value or average is greater than a first limit, or its AFT offset exceeds a given range, the remaining channels being accepted as listenable.

15. A method for identifying a channel having a listenable station in an FM receiver having capacitors that are charged by voltages in its tuner for SS (signal strength), N (noise) and AFT (automatic fine tuning) there being respective time constants for the charging of each capacitor, comprising the steps of:

providing a reference value of AFT;

momentarily clamping said capacitors for SS, N and AFT to respective neutral voltage values at a change in channel;

obtaining the value of a first group of individual samples or the average of a first group of multiple samples of the voltage of each of said capacitors so as to obtain an SS average, an N average, and an AFT average;

computing the offset between the reference value of AFT and the AFT value or average; and rejecting a channel as not having a listenable station if the SS value or average is less than a given threshold, the N value or average is greater than a first limit, or its AFT offset exceeds a given range, the remaining channels being accepted as potentially listenable.

16. A method as set forth in claim 15, wherein an accepted channel is identified as very listenable if its N value or average is below a second limit that is less than said first limit so as to indicate that it has virtually no noise, the remaining channels being accepted as potentially listenable.

17. A method as set forth in claim 15, wherein a channel that has been accepted as potentially listenable is accepted as listenable by:
   obtaining the average of a second group of samples of the voltage of each of said capacitors so as to obtain a second SS average, a second N average, and a second AFT average;
   computing the AFT offset between the reference value of AFT and the second AFT average; and
   identifying said channel as having a listenable station if the second SS average is greater than a threshold value, the second N average is less than a third limit, and the AFT offset less than a given voltage, the remaining channels being rejected.

18. A method as set forth in claim 15, wherein a channel that has been accepted as potentially listenable is accepted as listenable by:
   obtaining the average of a second group of samples of the voltage of each of said capacitors so as to obtain a second SS average, a second N average, and a second AFT average;
   computing the AFT offset between the reference value of AFT and the second AFT average;
   obtaining the quality factor, QF, for a given channel that was rejected in said accepting step; and
   accepting said channel if it has a quality factor greater than a predetermined value, the remaining channels being rejected.

19. A method as set forth in claim 15 wherein a channel identified as unlistenable therein is re-examined by:
   determining if its identification as unlistenable was only due to noise;
   taking another sample of the voltage on the N capacitor if this is the case; and
   identifying the channel as being listenable if the voltage of this last sample is not greater than it would be at the time of said another sample if the signal for N were at its maximum value.

20. A method as set forth in claim 15, further comprising the steps of:
   recording accepted channels on a tuning list;
   repeating the procedure beginning with the step of momentarily clamping the capacitors to neutral voltages until all channels of the band have been subjected to the procedure; and
   respectively associating the channels having the largest average values of SS with memory buttons if a best station memory scanning button has been activated.

21. A method for rapidly identifying channels of an FM band having listenable stations on a receiver providing SS (signal strength), N (noise), and AFT (automatic fine tuning) voltages on respective capacitors, comprising the steps of:
   providing a reference voltage of AFT;
   momentarily clamping the capacitors to neutral voltages;
   applying for a given channel associated SS, N, and AFT signals to said capacitors, respectively;
   obtaining the averages of a first group of one or more samples of each of the SS, N and AFT voltages;
   computing the offset between the average of the AFT samples from the reference value of AFT;
   rejecting on the basis of the averages of SS and N and the AFT offset not meeting first criteria those channels not having a station that is even marginally listenable;
   repeating the procedure beginning with the sampling until all channels of the band have been analyzed;
   identifying the non-rejected channels as being very listenable if they have virtually no noise;
   obtaining the averages of a second group of samples of each of the SS, N and AFT voltages for the channels that have not been rejected or identified as being very listenable;
   computing the AFT offset of the average of the second samples with respect to the AFT reference voltage; and
   identifying as having at least marginally listenable stations those channels having SS and N averages and an AFT offset that meet second criteria.

22. A method of operation of a receiver having a listening tuner and a scanning tuner comprising:
   repeatedly tuning said scanning tuner across a band of channels;
   providing first indications as to which channels received by said scanning tuner are listenable and second indications as to listenable channels that contain data different from the audio signal;
   forming a simultaneous display in response to said first indications of all listenable channels in a band showing the relative magnitude of measured values of their signal strengths;
   forming a simultaneous display in response to said second indications illustrating the content thereof;
   tuning said listening tuner to a desired channel; and
   forming a display for this channel of data received therein in addition to the audio information.

23. In a tuning system where channels are identified as being listenable or unlistenable on the basis of the difference between their AFT voltage and a reference AFT voltage, a method for finding a reference AFT voltage comprising:
   tuning the system across a band of channels;
   finding the strongest channel; and
   using the AFT voltage of the strongest channel as the reference AFT voltage.

24. In a tuning system where channels are identified as being listenable or unlistenable on the basis of the difference between their AFT voltage and a reference AFT voltage, a method for finding a reference AFT voltage comprising:
   tuning the system across a band of channels;
   finding a very listenable channel; and
   using the AFT voltage of said very listenable channel as the reference AFT voltage.

25. In a tuning system for a radio, a method of determining a Quality Factor QF of a channel comprising:
   a means of obtaining samples of N and AFT;
   taking the averages of said samples;
   a means of obtaining a reference value of AFT;
   subtracting the AFT average from the reference value to obtain an AFT offset;
   and,
   computing a QF as a factor of N, and AFT offset that is representative of the listenability of the received signal.

26. In the method for a tuning system as set forth in claim 25, wherein said step of QF computation is computed as follows:
   take the square foot of N average times AFT offset, then add N range divided by two.

27. In a tuning system as set forth in claim 25, said method further including the steps of:

obtaining samples of signal strength (SS);

taking the average of said SS samples; and including the average of said SS as a factor in the step of computing QF.

28. A method for identifying the listenability of channels in an FM receiver including a city/highway driving switch, a display, and a tuner, wherein SS (signal strength), N (noise) and AFT (automatic fine tuning) voltages are produced on respective capacitors, comprising the steps of:

determining whether said switch is in the city or in the highway position;

setting respective signal strength thresholds at higher values when said switch is in the highway position than when it is in the city position;

tuning the tuner to a channel in the band;

clamping the voltages across the capacitors to neutral values of voltage;

unclamping the capacitors;

obtaining a first group of samples of the voltage on each capacitor and calculating their respective averages;

rejecting a channel for the purpose of providing a reference value of AFT if the voltage average of SS samples are below a predetermined threshold value, or if the voltage average of N samples are greater than a given limit, or if the AFT voltage average is less than a given value;

tuning in the next channel and repeating the procedure if the channel is rejected;

obtaining second and third groups of samples of SS, N, and AFT;

accepting a channel for the purpose of providing a reference value of AFT, if the voltage averages of said second and third groups of SS samples are both greater than a predetermined threshold value, the voltage ranges of SS values of the samples in said second and third groups are within a given percentage of each other, the voltage averages of the samples of N for both groups are less than a given limit and the difference between the voltage averages of the AFT samples of both groups is less than a given voltage, which is less than said given value with which the first group of AFT samples is compared;

accepting the average of the combined averages of the second and third groups of AFT voltages as the AFT reference value;

tuning in the next channel and repeating the procedure of obtaining a first group of samples of SS, N, and AFT and calculating their voltage averages;

rejecting a channel as definitely not listenable, for which the average voltage of the SS samples is less than a given threshold, or the average of the N samples is greater than a given limit, or the average of the AFT samples are offset from the reference value of AFT by more than a predetermined amount;

tuning in the next channel and repeating the procedure if the channel is rejected;

obtaining second and third groups of samples of SS, N and AFT;

calculating the voltage averages of each of the second and third group of samples of SS, N and AFT, respectively;

determining the voltage ranges of the samples of SS in each of said second and third groups; and analyzing the remaining channels to identify those that are very listenable;

analyzing the remaining channels to see if they are at least marginally listenable; and forming a display at respective locations of the average signal strength of the listenable channels.

29. In a tuning system for a receiver in which channels of a band are identified as listenable or unlistenable by comparing the strength of the received signal with a threshold value and wherein a city/highway driving switch is provided, said tuning system comprising:

means for determining whether said switch is in the city or in the highway position;

means for setting signal strength thresholds at higher values when said switch is in the highway position than when it is in the city position;

means for momentarily charging a capacitor to a neutral value when the system operates to tune from a first channel to a second channel;

means for applying a voltage to said capacitor corresponding to a characteristic of signals received in a channel;

an integration or filter circuit including said capacitor coupled to said voltage;

means for obtaining samples of the voltage across the capacitor at such times that the effect of artifacts on the average value of said samples is reduced;

means for deriving said average value;

means for identifying if a channel is listenable by determining if a characteristic is acceptable by comparing the value of the sample or the average of multiple samples with the voltage that would be across the capacitor at the time of the samples if a voltage corresponding to a limit for the characteristic were applied to the integration or filter circuit;

means responsive to said signals for producing displays at respective locations of identified listenable stations in the band; and means for tuning the radio receiver to a selected one of the displayed stations.

30. A tuning system for a radio receiver comprising:

a visual display of a radio band;

means for tuning the radio receiver so that it tunes in the channels of the band;

means for deriving signals indicative of the received signal characteristics of stations present in channels of said radio band, the signal characteristics including at least SS (signal strength), and one of N (noise) and AFT (automatic fine tuning);

means for determining the listenable stations in response to said signals;

means for producing simultaneous display of said listenable stations at respective channel locations in the visual display, with the signals being displayed showing at least the relative magnitudes of measured values of the signal strengths of said listenable stations;

means for deriving digital data broadcast by stations wherein said digital data may include the type of program material or other identifying information being broadcast on a station;

means for simultaneously indicating said identifying information for each of said listenable stations on the display means by modifying the appearance of said displays of said listenable stations at respective channel locations in the visual display such as by color, intensity, or shape; and means for tuning the radio receiver to a selected one of the displayed stations for listening.

31. A tuning system as set forth in claim 30 further comprising:
    means for selecting which types of said identifying information are to modify said displays; and
    wherein said means for tuning the radio receiver to a selected one of the displayed stations for listening is restricted to tuning to stations associated with said selected types of said identifying information.

32. A tuning system as set forth in claim 30 wherein said means for simultaneously indicating said identifying information for each of said broadcasting stations on the display means may be accomplished by presenting an indicator of said identifying information for each of said broadcasting stations on the display means in an associative manner with said displays of said signals of listenable stations at respective channel locations in the visual display.

33. A tuning system for a radio receiver having a listening tuner comprising:
    a visual display of a radio band;
    means including a scanner tuner for tuning in the channels of a band in sequence;
    means for controlling said scanner tuner so that it repetitively scans the channels of the band;
    means for deriving signals indicative of the reception characteristics of stations tuned in by said scanner tuner, the reception characteristics including at least SS (signal strength, and one of N (noise) and AFT (automatic fine tuning);
    means for determining the listenable stations in response to said signals;
    means for producing simultaneous displays of said signals of listenable stations at respective channel locations in the visual display, with the signals being displayed for showing at least the relative magnitudes of measured values of the signal strengths of said listenable stations;
    means for deriving digital data broadcast by stations wherein said digital data may include the type of program material or other identifying information being broadcast on a station;
    means for simultaneously indicating said identifying information for each of said listenable stations on the display means by modifying the appearance of said displays such as by color, intensity, or shape; and
    means including a listening turner for tuning the radio receiver to a selected one of the displayed stations for listening.

34. A tuning system as set forth in claim 33 further comprising:
    a means for selecting which types of said identifying information indications may be presented; and
    wherein said means for tuning said listening tuner to a selected one of the displayed stations for listening is restricted to tuning to stations associated with said selected types of said identifying information.

35. A tuning system as set forth in claim 33 wherein said means for simultaneously indicating said identifying information for each of said broadcasting stations on the display means may be accomplished by presenting an indicator of said identifying information for each of said broadcasting channels on the display means in an associative manner with said displays of said signals of listenable stations at respective channel locations in the visual display.

36. A tuning system including:
    means for controlling the tuning system to tune through the channels of a band;
    means for deriving received signal characteristics for each channel tuned to, said characteristics including an AFT (automatic fine tuning) measurement of frequency deviation of a channel;
    means for providing a voltage representing the amplitude of AFT for each channel tuned to, wherein said voltage varies above and below a center voltage, said center voltage representing zero frequency deviation;
    an integration filter circuit, said circuit including a capacitor coupled to receive said AFT voltage; and
    means including a switch for momentarily causing the voltage on said capacitor to have a value corresponding to said AFT center voltage as the system operates to tune from a first channel to a second channel.

37. A radio including:
    means for applying a voltage to a capacitor corresponding to an AFT (automatic fine tuning) characteristic of signals received in a channel, said AFT representing frequency deviation of said channel, and said AFT voltage further incorporating unwanted artifacts from recovered audio signals which vary in voltage above and below a center voltage caused by said AFT;
    means for obtaining samples of the voltage across the capacitor at such times that the average value of said samples substantially cancels the effect of the audio artifacts on the AFT voltage capacitor and substantially equals the actual center voltage caused by said AFT; and
    means for deriving said average value.

38. A method for identifying channels of a band as being unlistenable, very listenable or listenable in a radio scanner including computerized means and means for producing electrical signals respectively indicative of different aspects of the quality of reception that change in value after each channel is tuned in comprising the steps of:
    tuning in the receiver to the channels of a band;
    identifying a channel as being unlistenable if the electrical signals obtain respective values of a first criteria during a first period following the tuning in of a channel or as being very listenable if the electrical signals obtain values of a second criteria during said first period; and
    determining whether the channels that have not been identified as being unlistenable or as being very listenable are listenable depending on whether or not the electrical signals have obtained values of a third criteria during a second period after the tuning in of a channel that is longer than the first period.

39. A method as set forth in claim 38, wherein the first and second periods for each channel are consecutive after the tuning of a channel.

40. A method as set forth in claim 38 wherein:
    the first period for each channel follows the tuning in of each channel during a first pass through the band; and
    the second period for each channel follows the tuning in of each channel during a second pass through the band.

41. A tuning system including:
    means for controlling the tuning system to tune through the channels of a band;
    means for deriving received signal characteristics for each channel tuned to;
    means for providing a voltage representing the amplitude of each received signal characteristic for each channel tuned to;

an integration filter circuit for each of said received signal characteristics, said circuit including a capacitor coupled to receive each said voltage, respectively; and means including a switch for momentarily clamping each said capacitor causing the voltage on each said capacitor to have a value corresponding to the value it has when the amplitude of the associated characteristic is zero as the system operates to tune from a first channel to a second channel.

42. A tuning system as set forth in claim 41, further comprising:

means for deriving one or more samples of the voltage on said capacitor after said momentary charging and before said capacitor becomes fully charged; and means for determining if a characteristic is acceptable by comparing the value of one of the sample and the average of multiple samples with the voltage that would be across the capacitor at the time of the samples if a voltage corresponding to a limit for the characteristic were applied to the integration or filter circuit.

43. In a radio receiver that supplies at least one of signal strength (SS), noise (N), and automatic fine tuner (AFT) signals to associated capacitors, respectively, for integration or filtering of said signals, said capacitors being connected in a circuit with respective resistors so as to have predetermined respective charging time constants, apparatus for deriving the final integrated or filtered values comprising:

means for indicating the times at which the charging of said capacitors begins;

means for obtaining sample voltages across the respective capacitors at given times after the time when charging begins and before the capacitors are fully charged; and means for processing the sample voltages so as to obtain via extrapolation indications of the voltages that would appear on the capacitors when they are fully charged.

* * * * *